US007286585B2

(12) United States Patent
Johnson

(10) Patent No.: US 7,286,585 B2
(45) Date of Patent: Oct. 23, 2007

(54) LOW TEMPERATURE GROWN LAYERS WITH MIGRATION ENHANCED EPITAXY ADJACENT TO AN INGAASN(SB) BASED ACTIVE REGION

(75) Inventor: Ralph H. Johnson, Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/079,148

(22) Filed: Mar. 14, 2005

(65) Prior Publication Data

US 2005/0157765 A1   Jul. 21, 2005

Related U.S. Application Data

(63) Continuation-in-part of application No. 10/352,293, filed on Jan. 27, 2003, now abandoned, and a continuation-in-part of application No. 10/026,044, filed on Dec. 27, 2001, now Pat. No. 7,058,112, and a continuation-in-part of application No. 10/026,020, filed on Dec. 27, 2001, now Pat. No. 6,975,660, and a continuation-in-part of application No. 10/026,016, filed on Dec. 20, 2001, now Pat. No. 7,095,770, and a continuation-in-part of application No. 10/026,019, filed on Dec. 20, 2001, and a continuation-in-part of application No. 10/026,055, filed on Dec. 20, 2001, now Pat. No. 6,922,426, which is a continuation-in-part of application No. 09/217,223, filed on Dec. 21, 1998, now Pat. No. 6,603,784, application No. 11/079,148, which is a continuation-in-part of application No. 10/026,016, and a continuation-in-part of application No. 10/026,019, and a continuation-in-part of application No. 10/026,055, and a continuation-in-part of application No. 10/026,044, and a continuation-in-part of application No. 10/026,020.

(51) Int. Cl.
    *H01S 5/00* (2006.01)
(52) U.S. Cl. .................... 372/43.01; 372/45.01
(58) Field of Classification Search .......... 372/43, 372/43.01, 45.01
    See application file for complete search history.

(56) References Cited

U.S. PATENT DOCUMENTS 75,920 A    3/1868    Hutwohl (Continued)

FOREIGN PATENT DOCUMENTS

EP    0 606 821 A    7/1994

(Continued)

OTHER PUBLICATIONS

U.S. Appl. No. 10/931,162, filed Aug. 31, 2004, Ralph H. Johnson et al.

(Continued)

*Primary Examiner*—Dung (Michael) T. Nguyen
(74) *Attorney, Agent, or Firm*—Workman Nydegger

(57) ABSTRACT

A laser system having migration enhanced epitaxy grown substantially flat layers proximate to quantum wells of an active region. The flat layers may be grown at low temperature. This growth may result in flatter interfaces in the nitrogen containing quantum wells within the active region as well as lower trap densities in adjacent material. This may achieve a reduced trap density as well as reduced segregation resulting in a spectral luminescence profile revealing a single narrow peak with a high level of photoluminescence.

18 Claims, 34 Drawing Sheets

U.S. PATENT DOCUMENTS

| | | |
|---|---|---|
| 4,445,218 A | 4/1984 | Coldren |
| 4,608,697 A | 8/1986 | Coldren |
| 4,622,672 A | 11/1986 | Coldren et al. |
| 4,829,347 A | 5/1989 | Cheng et al. |
| 4,873,696 A | 10/1989 | Coldren et al. |
| 4,896,325 A | 1/1990 | Coldren |
| 4,911,101 A | 3/1990 | Ballingall et al. |
| 5,025,751 A | 6/1991 | Takatani et al. |
| 5,040,186 A | 8/1991 | Logan et al. |
| 5,045,499 A | 9/1991 | Nishizawa et al. |
| 5,080,870 A | 1/1992 | Streetman et al. |
| 5,082,799 A | 1/1992 | Holmstrom et al. |
| 5,122,393 A | 6/1992 | Tuppen et al. |
| 5,229,627 A | 7/1993 | Kosaka |
| 5,245,622 A | 9/1993 | Jewell et al. |
| 5,251,225 A | 10/1993 | Eglash et al. |
| 5,276,700 A * | 1/1994 | Jansen et al. ............ 372/50.12 |
| 5,293,392 A | 3/1994 | Shieh et al. |
| 5,343,487 A | 8/1994 | Scott et al. |
| 5,358,880 A | 10/1994 | Lebby et al. |
| 5,365,540 A | 11/1994 | Yamanaka |
| 5,383,211 A | 1/1995 | Van de Walle et al. |
| 5,392,307 A | 2/1995 | Sugiyama et al. |
| 5,408,487 A | 4/1995 | Uchida et al. |
| 5,416,044 A | 5/1995 | Chino et al. |
| 5,422,901 A | 6/1995 | Lebby et al. |
| 5,468,343 A | 11/1995 | Kitano |
| 5,490,880 A | 2/1996 | Kao et al. |
| 5,491,710 A | 2/1996 | Lo |
| 5,513,204 A | 4/1996 | Jayaraman |
| 5,556,472 A | 9/1996 | Nakamura et al. |
| 5,557,626 A * | 9/1996 | Grodzinski et al. ...... 372/45.01 |
| 5,559,818 A | 9/1996 | Shono et al. |
| 5,568,504 A | 10/1996 | Kock et al. |
| 5,583,351 A | 12/1996 | Brown et al. |
| 5,588,995 A | 12/1996 | Sheldon |
| 5,631,472 A | 5/1997 | Cunningham et al. |
| 5,693,180 A | 12/1997 | Furukawa et al. |
| 5,711,813 A | 1/1998 | Kadoiwa et al. |
| 5,719,891 A | 2/1998 | Jewell |
| 5,719,894 A | 2/1998 | Jewell et al. |
| 5,719,895 A | 2/1998 | Jewell et al. |
| 5,729,567 A | 3/1998 | Nakagawa |
| 5,732,103 A | 3/1998 | Ramdani et al. |
| 5,747,366 A | 5/1998 | Brillouet et al. |
| 5,754,578 A | 5/1998 | Jayaraman |
| 5,757,833 A | 5/1998 | Arakawa et al. |
| 5,760,939 A | 6/1998 | Nagarajan et al. |
| 5,780,867 A | 7/1998 | Fritz et al. |
| 5,805,624 A | 9/1998 | Yang et al. |
| 5,809,051 A | 9/1998 | Oudar |
| 5,815,524 A | 9/1998 | Ramdani et al. |
| 5,818,862 A | 10/1998 | Salet |
| 5,825,796 A | 10/1998 | Jewell et al. |
| 5,832,018 A | 11/1998 | Ohkubo |
| 5,835,521 A | 11/1998 | Ramdani et al. |
| 5,841,152 A | 11/1998 | Ishikawa |
| 5,877,038 A | 3/1999 | Coldren et al. |
| 5,880,028 A | 3/1999 | Yamamoto et al. |
| 5,883,912 A | 3/1999 | Ramdani et al. |
| 5,898,722 A | 4/1999 | Ramdani et al. |
| 5,903,586 A | 5/1999 | Ramdani et al. |
| 5,912,913 A | 6/1999 | Kondow et al. |
| 5,943,357 A | 8/1999 | Lebby et al. |
| 5,943,359 A | 8/1999 | Ramdani et al. |
| 5,951,767 A | 9/1999 | Colombo |
| 5,956,363 A | 9/1999 | Lebby et al. |
| 5,960,018 A | 9/1999 | Jewell et al. |
| 5,974,073 A | 10/1999 | Canard et al. |
| 5,978,398 A * | 11/1999 | Ramdani et al. ........ 372/45.01 |
| 5,985,683 A | 11/1999 | Jewell |
| 5,991,326 A | 11/1999 | Yuen et al. |
| 6,002,705 A | 12/1999 | Thornton |
| 6,008,525 A | 12/1999 | Barron et al. |
| 6,021,147 A | 2/2000 | Jiang et al. |
| 6,046,065 A | 4/2000 | Goldstein et al. |
| 6,046,096 A | 4/2000 | Ouchi |
| 6,049,556 A | 4/2000 | Sato |
| 6,052,398 A | 4/2000 | Brillouet et al. |
| 6,057,560 A | 5/2000 | Uchida |
| 6,061,380 A | 5/2000 | Jiang et al. |
| 6,061,381 A | 5/2000 | Adams et al. |
| 6,100,546 A | 8/2000 | Major et al. |
| 6,121,068 A | 9/2000 | Ramdani et al. |
| 6,127,200 A | 10/2000 | Ohiso et al. |
| 6,148,016 A | 11/2000 | Hegblom et al. |
| 6,195,485 B1 | 2/2001 | Coldren et al. |
| 6,207,973 B1 | 3/2001 | Sato et al. |
| 6,252,894 B1 | 6/2001 | Sasanuma et al. |
| 6,252,896 B1 | 6/2001 | Tan et al. |
| 6,314,118 B1 | 11/2001 | Jayaraman et al. |
| 6,341,137 B1 | 1/2002 | Jayaraman et al. |
| 6,344,084 B1 | 2/2002 | Koinuma et al. |
| 6,359,920 B1 | 3/2002 | Jewell et al. |
| 6,362,069 B1 | 3/2002 | Forrest et al. |
| 6,363,092 B1 | 3/2002 | Botez et al. |
| 6,366,597 B1 | 4/2002 | Yuen et al. |
| 6,372,533 B2 | 4/2002 | Jayaraman et al. |
| 6,392,979 B1 * | 5/2002 | Yamamoto et al. ......... 369/121 |
| 6,424,669 B1 | 7/2002 | Jiang et al. |
| 6,434,180 B1 | 8/2002 | Cunningham |
| 6,542,530 B1 | 4/2003 | Shieh et al. |
| 6,603,784 B1 | 8/2003 | Johnson |
| 6,621,842 B1 | 9/2003 | Dapkus |
| 2002/0034203 A1 | 3/2002 | Shimizu |
| 2002/0067748 A1 | 6/2002 | Coldren et al. |
| 2002/0071464 A1 | 6/2002 | Coldren et al. |
| 2002/0071471 A1 | 6/2002 | Kim et al. |
| 2002/0075920 A1 | 6/2002 | Spruytte et al. |
| 2002/0075929 A1 | 6/2002 | Cunningham |
| 2002/0090016 A1 | 7/2002 | Coldren et al. |
| 2002/0131462 A1 | 9/2002 | Line et al. |
| 2003/0013223 A1 | 1/2003 | Ramdani et al. |
| 2003/0039287 A1 | 2/2003 | Takahashi |
| 2003/0053510 A1 | 3/2003 | Yuen et al. |

FOREIGN PATENT DOCUMENTS

| | | |
|---|---|---|
| EP | 0 702 101 | 3/1996 |
| EP | 0 740 377 A1 | 10/1996 |
| EP | 0 740 377 B | 10/1996 |
| EP | 0 765 014 A1 | 3/1997 |
| EP | 0 822 630 A1 | 2/1998 |
| EP | 0 874 428 B1 | 4/1998 |
| EP | 0 874 428 A2 | 10/1998 |
| EP | 0 874 428 A3 | 11/1998 |
| EP | 0 896 406 A | 2/1999 |
| EP | 0 765 014 B1 | 7/1999 |
| EP | 0 975 073 A1 | 1/2000 |
| EP | 1 182 756 | 2/2002 |
| EP | 1 294 063 A1 | 3/2003 |
| JP | 57026492 A | 2/1982 |
| JP | 08 139404 | 5/1996 |
| WO | WO98/007218 A1 | 2/1998 |
| WO | WO 00/052789 A2 | 2/2000 |
| WO | WO 00/52789 A3 | 2/2000 |
| WO | PCT/US99/26496 | 3/2000 |
| WO | WO 00/033433 A2 | 6/2000 |
| WO | WO 00/033433 A3 | 6/2000 |
| WO | WO 00/038287 A1 | 6/2000 |
| WO | WO 00/065700 A2 | 11/2000 |
| WO | WO 00/065700 A3 | 11/2000 |
| WO | WO 01/016642 A2 | 3/2001 |
| WO | WO 01/016642 A3 | 3/2001 |

| | | |
|---|---|---|
| WO | WO 01/017076 A2 | 3/2001 |
| WO | WO 01/017076 A3 | 3/2001 |
| WO | WO 01/018919 A1 | 3/2001 |
| WO | WO 01/024328 A2 | 4/2001 |
| WO | WO 01/024328 A3 | 4/2001 |
| WO | WO 01/033677 A2 | 5/2001 |
| WO | WO 01/033677 A3 | 5/2001 |
| WO | WO 01/052373 A2 | 7/2001 |
| WO | WO 01/084682 A2 | 11/2001 |
| WO | WO 01/093387 A2 | 12/2001 |
| WO | WO 01/093387 A3 | 12/2001 |
| WO | WO 01/095444 A2 | 12/2001 |
| WO | WO 01/098756 A2 | 12/2001 |
| WO | WO 02/003515 A2 | 1/2002 |
| WO | WO 02/017445 A1 | 2/2002 |
| WO | WO 02/084829 A1 | 10/2002 |

OTHER PUBLICATIONS

U.S. Appl. No. 10/931,194, filed Aug. 31, 2004, Ralph H. Johnson et al.

U.S. Appl. No. 10/956,798, filed Oct. 1, 2004, Ralph H. Johnson.

U.S. Appl. No. 10/956,985, filed Oct. 1, 2004, Ralph H. Johnson.

U.S. Appl. No. 10/352,293, filed Jan. 27, 2003, Ralph H. Johnson et al.

International Search Report, dated Mar. 27, 2003, relative to PCT application No. PCT/US02/39414, the foreign equivalent to the instant U.S. Appl. No. 10/026,055.

International Search Report, dated Apr. 9, 2003, regarding PCT International application PCT/US02/39912, the PCT equivalent of U.S. Appl. No. 10/026,044.

Notification of Transmittal of the International Search Report or the Declaration, dated Jan. 15, 2004, relative to PCT. Application No. PCT/US02/41736, the foreign equivalent to the instant U.S. Appl. No. 10/026,016.

Notification of Transmittal of the International Search Report or the Declaration dated Jan. 2, 2004, relative to PCT. Application No. PCT/US02/39604, the foreign equivalent to the instant U.S. Appl. No. 10/026,019.

Notification of Transmittal of the International Search Report or the Declaration, dated Jan. 2, 2004, relative to PCT Application No. PCT/US02/39821, the foreign equivalent to the instant U.S. Appl. No. 10/026,020.

Almuneau, G., et al., "Accurate control of Sb composition in AlGaAsSb alloys on InP substrates by molecular beam epitaxy", article, Journal of Crystal Growth, vol. 208, May 6, 1999, pp. 113-116.

Almuneau, G., et al., "Improved electrical and thermal properties of InP-AlGaAsSb Bragg mirrors for long-wavelength vertical-cavity laser", article, IEEE Photonics Technology Letters, Vo. 12, No. 10, Oct. 2000, pp. 1322-1324.

Almuneau, G., et al., "Molecular beam epitaxial growth of monolithic 1.55 μm vertical cavity surface emitting lasers with AlGaAsSb/AlAsSb Bragg Mirrors", article, Journal of Vacuum Science Technology, vol. 8, No. 3, May/Jun. 2000, pp. 1601-1604.

Anan, T., et al., "Continuous-wave operation of 1.30 μm GaAsSb/GaAs VCSELs", article, Electronics Letters, vol. 37, No. 9, Apr. 26, 2001, pp. 566-567.

Black, K., et al. "Double-fused 1.5 μm vertical cavity lasers with record high $T_o$ of 132K at room temperature", article, Electronics Letters, vol. 34, No. 20, Oct. 1, 1998, pp. 1947-1949.

Blum, O., et al., "Electrical and optical characteristics of AlAsSb/BaAsSb distributed Bragg reflectors for surface emitting laser", article, Applied Physics Letters, vol. 67, No. 22, Nov. 27, 1995, pp. 3233-3235.

Blum, O., et al., "Highly reflective, long wavelength AlAsSb/GaAsSb distributed Bragg reflector grown by molecular beam epitaxy on InP substrates", article, Applied Physics Letters, Vo. 66, No. 3, Jan. 16, 1995, pp. 329-331.

Boucart, J., et al., "1mW CW-RT monolithic VCSEL at 1.55 μm", article, IEE Photonic Technology Letters, vol. 11, No. 6, Jun. 1999, pp. 629-631.

Campbell, J., et al., "Quantum dot resonant cavity photodiode with operation near 1.3 μm wavelength", article, Electronics Letters, vol. 33, No. 15, Jul. 17, 1997, pp. 1337-1339.

Chang, C., et al., "Parasitics and design considerations on oxide-implant VCSELs", article, IEEE Photonics Technology Letters, vol. 13, Mo 12, Dec. 2001, pp. 1274-1276.

Choquette, K., et al. "Room temperature continuous wave InGaAsN quantum well vertical-cavity lasers emitting at 1.3 μm", article, Electronics Letters, vol. 36, No. 16, Aug. 3, 2000, pp. 1388-1390.

Chua et al., "Low Threshold 1.57 μm VC-SEL's Using Strain-Compensated Quantum Wells and Oxide/Metal Backmirror", IEEE Photonics Technology Letters, 7 (1995) May, No. 5, pp. 444-446.

Dowd, P., et al., "Long wavelength (1.3 and 1.5 μm) photoluminescence from InGaAs/GaPAsSb quantum wells grown on GaAs", article, Applied Physics Letters, vol. 75, No. 9, Aug. 30, 1999, pp. 1267-1269.

Dudley, J., et al., "Water fused long wavelength vertical cavity lasers", conference proceedings, LEOS '93 Conference Proceedings. IEEE Lasers and Electro-Optics Society 1993 Annual Meeting, Nov. 15/8, 1993, pp. 560-561.

Gourley, F., et al., "Epitaxial semiconductor optical interference devices", invited paper, SPIE, vol. 792, 1987, pp. 178-189.

Guden, M., et al., "Material parameters of quaternary III-V semiconductors for multiplayer mirrors at 1.55 μm wavelength", article, Modeling Simulation Material Science Engineering, vol. 4 1966, pp. 349-357.

Guo, C., et al., "Theoretical investigation of strained InGaAs/GaPAsSb type-II quantum wells on GaAs for long wavelength (1.3 μm) optoelectronic devices", post-conference paper, Dept of Electrical Engineering & Center for Solid State Electronics Research, ASU, Tempe, AZ, Apr. 1999, pp. 30-1.

Guy, D., et al., "Theory of an electro-optic modulator based on quantum wells in a semiconductor etalon", conference paper, Quantum Well and Superlattice Physics, Mar. 23/4, 1987, pp. 189-196.

Hall, E., et al., "Electrically-pumped, single-epitaxial VCSELs at 1.55 μm with Sb-based mirrors", article, Electronics Letters, vol. 35, No. 16, Aug. 5, 1999, pp. 1-2.

Hall, E., et al., "Increased lateral oxidation rates of AlInAs on InP using short-period superlattices", article, Applied Physics Letters, vol. 29, No. 9, Jan. 8, 2002, pp. 1100-4.

Hall, E., et al., "Selectively etched undercut apertures in AlAsSb-based VCSELs", article, IEEE Photonics Technology Letters, vol. 13, No. 2, Feb. 2001, pp. 97-99.

Hegblom, E., et al., "Small efficient vertical cavity lasers with tapered oxide apertures", article, Electronics Letters, vol. 34, No. 9, Apr. 30, 1998, pp. 895-896.

Heroux, J., et al., "Optical investigation of InGaAsN/GaAs strained multi-quantum wells", 20th North American Conference on Molecular Beam Epitaxy, Oct. 1-3, 2001, p. 2.

Hong, Y., et al., "Improving Ga(In)Nas properties by migration-enhanced epitaxy and superlattices", 43rd 2001 Electronic Material Conference, Session G, Paper G10, Jun. 27, 2001.

Hong, Y., et al., "Growth of GaInNAs quaternaries using a digital allow technique", conference paper, Journal of Vacuum Science and Technology B: Microelectronics and Nanometer Structures, Oct. 01/3, 2001, pp. 1163-1166.

Huffaker, D., et al., "1.5 μm wavelength oxide-confined quantum-dot vertical-cavity surface-emitting laser", article, IEEE Photonics Technology Letters, vol. 10, No. 2, Feb. 1998, pp. 185-187.

Huffaker, D., et al., "1.3 μm room-temperature GaAs-based quantum-dot laser", Applied Physics Letters, vol. 73, No. 18, Nov. 2, 1998, pp. 2564-2566.

Iga, K., "Semiconductor laser in the 21st century", California conference papers, Photodetectors: Materials and Devices VI, Jan. 22/4, 2001, pp. xi-xxv.

Jayaraman, V., et al., "Uniform threshold current, continuous-wave, singlemode 1300 nm vertical cavity lasers from 0 to 70° C", article, Electronics Letters, vol. 34, No. 14, Jul. 9, 1998, pp. 1405-1407.

Kim, J., et al., "Epitaxially-stacked multiple-active-region 1.55 μm lasers for increased differential efficiency", article, Applied Physics Letters, vol. 74, No. 22, May 31, 1999, pp. 3251-3253.

Kim, J., et al., "Room-temperature, electrically-pumped multiple-active-region VCSELs with high differential efficiency at 1.55 μm", article, Electronics Letters, vol. 35, No. 13, Jun. 24, 1999, pp. 1-2.

Kotaki, Y., et al., "GaInAsP/InP surface emitting laser with two active layers", article, Extended Abstracts of the 16th (1984 International) conference on Solid State Devices and Materials, pp. 133-136.

Koyama, F., et al., "Room temperature CWS operation of GaAs vertical cavity surface emitting laser", article, The Transactions of the IEICE, vol. E71, No. 11, Nov. 1988, pp. 1089-1090.

Koyama, Further, et al., "1.5 W Operation of Superluminescent Diode with Highly Strained GaInAs/FaAs Quantum Well Emitting at 1.2 μm Band," Microsystem Research Center, P&I Laboratory, Tokyo Instittute of Technology, pp. 71-72.

Larson, J., et al., "GaInNAs-GaAs long-wavelength vertical-cavity surface-emitting laser diodes", article, IEEE Photonics Technology Letters, vol. 10, No. 2, Feb. 1998, pp. 188-190.

Lee, Y., et al., "Physics and nonlinear device applications of bulk and multiple quantum well GaAs", invited paper, SPIE vol. 792 Quantum Well and Superlattice Physics (1987), pp. 128-133.

Li, J., et al., "Persistent photoconductivity in $Ga_{1-x}In_xN_yAs_{1-y}$", article, Applied Physics Letters, vol. 75, No. 13, Sep. 27, 1999, pp. 1899-1901.

Livshits, D., et al., "8W continuous wave operation of InGaAsN lasers of 1.3 μm", article, Electronics Letters, vol. 36, No. 16, Aug. 3, 2000, pp. 1381-1382.

Mayer and Lau, Electronic Material Science: For Integrated Circuits in Si and GaAs 1990, Macmillan Publishing Company.

Mirin, R., et al., "1.3 μm photoluminescence from InGaAs quantum dots on GaAs", article, Applied Physics Letter 67 (25), Dec. 18, 1995, pp. 3795-3797.

Miyamoto, T., et al., "A novel galnnas-gaas quantum-well structure for long-wavelength semiconductor lasers" IEEE photonics technology letter, IEE Inc. New York, US vol. 9, No. 11, Nov. 1, 1997 pp. 1448-1450.

Nakagawa, S., et al., "1.55 μm InP-lattice-matched VCSELs with AlGaAsSb-AlAsSb DBRs", article, IEEE Journal on Selected Topics in Quantum Electronics, vol. 7, No. 2, Mar./Apr. 2001, pp. 224-230.

Nakahara, K., et al., "1.3 μm continuous-wave lasing operation in GaInNAs quantum-well lasers", article, IEEE Photonics Technology Letters, vol. 10, No. 4, Apr. 1998, pp. 487-488.

Naone, R., et al., "Tapered air apertures for thermally robust VCL structures", article, IEEE Photonics Technology Letters, vol. 11, No. 11, Nov. 1999, pp. 1339-1341.

Nelson, D., et al., "Band nonparabolicity effects in semiconductor quantum wells", article, Rapid Communications, vol. 35, No. 17, Feb. 15, 1987, pp. 7770-7773.

Ohnoki, N., et al., "Superlattice AlAs/AlInAs-oxide current aperture for long wavelength InP-based vertical-cavity surface-emitting laser structure", article, Applied Physics Letters, vol. 73, No. 22, Nov. 30, 1998, pp. 3262-3264.

Ortsiefer, M., et al., "Submiliamp long-wavelength InP-based vertical-cavity surface-emitting laser with stable linear polarization", article, Electronics Letters, vol. 36, No. 13, Jun. 22, 2000, pp. 1124-1126.

Peters, M., et al., "Realiztion and modeling of a pseudomorphic $(GaAs_{1-x}Sb_xIn_yGa_{1-y}As)/GaAs$ bilayer-quantum well", article, Applied Physics Letter 67 (18), Oct. 30, 1995, pp. 263941.

Peters, M., et al., "Band-gap engineered digital alloy interfaces for lower resistance vertical-cavity surface-emitting lasers", article, Applied Physics Letters, vol. 63, No. 25, Dec. 1993, pp. 3411-3413.

Piprek, J., et al., "Thermal comparison of long-wavelength vertical-cavity surface-emitting laser diodes", Electronics Letters, May 26, 1994, vol. 30, No. 11, pp. 866-868.

Piprek, J., et al., "Minimum temperature sensitivity of 1.55 μm vertical-cavity lasers at -30 nm gain offset", article, Applied Physics Letters, vol. 72, No. 15, Apr. 13, 1998, pp. 1814-1816.

Raja, M., et al., "Novel wavelength-resonant optoelectronic structure and its application to surface-emitting semiconductor lasers", article, Electronics Letters, Sep. 1, 1988, vol. 24, No. 18, pp. 1140-1142.

Scott, J., et al., "High efficiency submilliamp vertical cavity lasers with intracavity contacts", article, IEEE Photonics Technology Letters, vol. 6, No. 6, Jun. 1994, pp. 678-680.

Sekiguchi, S., et al., "Long wavelength GaInAsP/InP laser with n-n contacts using AlAs/InP hole injecting tunnel junction", article, Japanese Journal of Applied Physics, Part 2, No. 4B, Apr. 15, 1999, pp. L443-L445.

Shimizu, H., et al., "High-Performance CW 1.26-MUM Gainassb-SQW ridge lasers" IEEE journal of selected topics in quantum electronics, IEEE service center, US, vol. 7, No. 2, Mar. 2001, pp. 355-364.

Sohn, H., et al., "A New Approach to Grow Strain-Free GAAS on SI", Materials Research Society Symposium Proceedings, Jan. 1, 1991, XP000578836, figure 4.

Starck, C., "Long wavelength VCSEL with tunnel junction and metamorphic AlAs/GaAs conductive DBR", article, Physics Review B, vol. 39, No. 3, Jan. 15, 1989, pp. 1871-1883.

Sugimoto, M., et al., "Surface emitting devices with distributed Bragg reflectors grown by highly precise molecular beam epitaxy", article, Journal of Crystal Growth, vol. 127, 1993, pp. 1-4.

Uchida, T., et al., "CBE grown 1.5 μm GaInAsP-InP surface emitting lasers", article, IEEE Journal of Quantum Electronics, vol. 29, No. 6, Jun. 1993, pp. 1975-1980.

Van De Walle, C. "Band lineups and deformation potentials in the model-solid theory", article, Physical Review B, vol. 29, No. 3, Jan. 15, 1989, pp. 1871-1883.

Whitaker, T., "Long wavelengths VCSELs move closer to reality", article, Compound Smiconductor, Jul. 2000, pp. 65-67.

Yamada, M., et al., "Low-threshold lasing at 1.3 μm from GaAsSb quantum wells directly grown on GaAs substrates", article, IEEE, 0-7803-4947, Apr. 1998, pp. 149-150.

Yamada, M., et al., "Room temperature low-threshold CW operation of 1.23 μm GaAsSb VCSELs on GaAs substrates", article, Electronics Letters, Mar. 30, 2000, vol. 36, No. 7, pp. 637-638.

Yang, X., et al., "High performance 1.3 μm InGaAsN:Sb/GaAs quantum well lasers grown by molecular beam epitaxy", journal article, Journal of Vacuum Science and Technology B Microelectronics and Nanometer Structures, Vo. 18, No. 3, Oct. 1999, pp. 1484-1487.

Yang, X., et al., "High-temperature characteristics of 1.3 mum InGaAsN:Sb/GaAs multiple-quantum-well lasers grown by molecular-beam epitaxy", article, Applied Physics Letters, vol. 76, No. 7, Feb. 14, 2000, pp. 795-797.

Yang, X., et al., "InGaAsNSb/GaAs quantum wells for 1.55 μm lasers grown by molecular-beam epitaxy", article, Applied Physics Letters, vol. 78, No. 26, pp. 4068-4070.

Yano, M., et al., "Time-resolved reflection high energy electron diffraction analysis for atomic layer depositions of GaSb by molecular beam epitaxy", article, Journal of Crystal Growth, vol. 146, 1995, pp. 349-353.

Yuen, W., et al., "High-performance 1.6 μm single-epitaxy top-emitting VCSEL", article, Electronics Letters, vol. 36, No. 13, Jun. 22, 2000, pp. 1121-1123.

Kouichi, K. et al., "High Speed Growth of Device Quality GaN and InGaN by RF-MBE," Materials Science and InGaN by RF-MBE, Materials Science and Engineering B59, Department of Electrical and Electronic Engineering, Sophia University (1999), pp. 65-68.

Horikoshi, Y., et la., Low-Temperature Growth of FaAs and AiAs-GaAs Quantum-Well Layers by Modified Molecular Beam Epitaxy, Japanese Journal of Applied Physics, NTT Electrical Communications Laboratories, Tokyo, vol. 25, No. 10, Oct. 1986, pp. L868-L870.

* cited by examiner

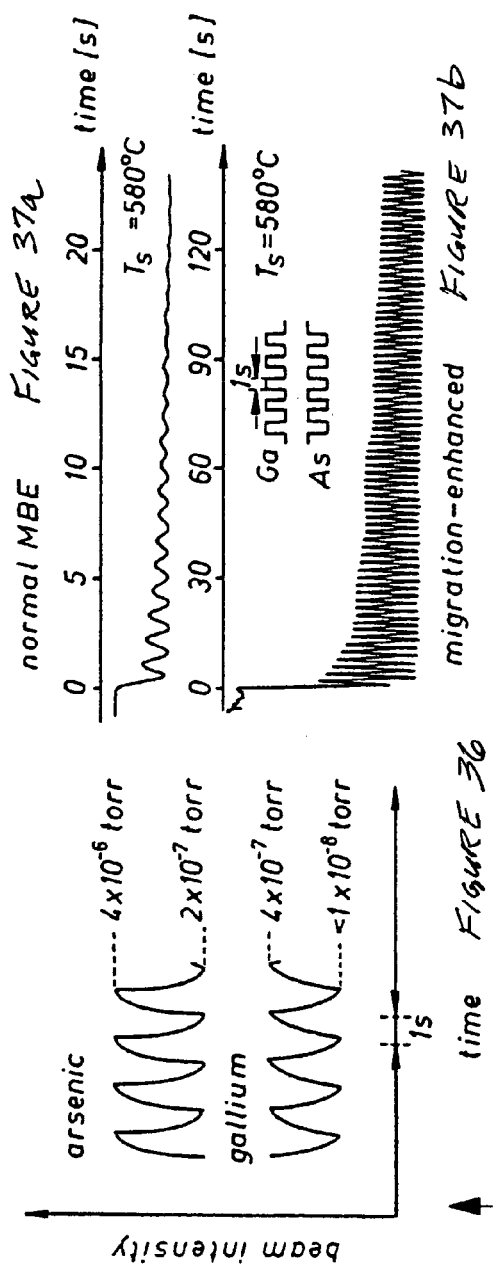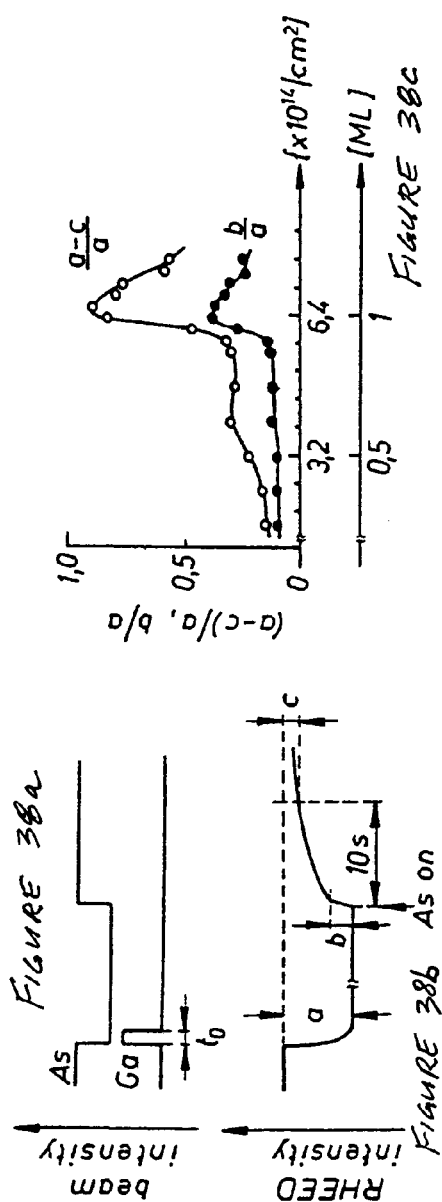

LOW TEMPERATURE GROWN LAYERS WITH MIGRATION ENHANCED EPITAXY ADJACENT TO AN INGAASN(SB) BASED ACTIVE REGION

CROSS-REFERENCE TO RELATED APPLICATIONS

This application claims priority to Provisional Application Ser. No. 60/605,810, filed on Aug. 31, 2004; and is a continuation-in-part of U.S. patent application Ser. No. 10/352,293, filed Jan. 27, 2003, and entitled SYSTEM AND METHOD USING MIGRATION ENHANCED EPITAXY FOR FLATTENING ACTIVE LAYERS AND THE MECHANICAL STABILIZATION OF QUANTUM WELLS ASSOCIATED WITH VERTICAL CAVITY SURFACE EMITTING LASERS, now abandoned. U.S. patent application Ser. No. 10/352,293 is a continuation-in-part of U.S. patent application Ser. No. 09/217,223, filed Dec. 21, 1998, and entitled MECHANICAL STABILIZATION OF LATTICE MISMATCHED QUANTUM WELLS, now U.S. Pat. No. 6,603,784. U.S. patent application Ser. No. 10/352,293 is also a continuation-in-part of U.S. patent application Ser. No. 10/026,016, filed Dec. 20, 2001, and entitled VERTICAL CAVITY SURFACE EMITTING LASER INCLUDING INDIUM, ANTIMONY AND NITROGEN IN THE ACTIVE REGION, now U.S. Pat. No. 7,095,770. U.S. patent application Ser. No. 10/352,293 is also a continuation-in-part of U.S. patent application Ser. No. 10/026,019, filed Dec. 20, 2001 and entitled VERTICAL CAVITY SURFACE EMITTING LASER INCLUDING INDIUM AND NITROGEN IN THE ACTIVE REGION, now pending. U.S. patent application Ser. No. 10/352,293 is also a continuation-in-part of U.S. patent application Ser. No. 10/026,055, filed Dec. 20, 2001, and entitled VERTICAL CAVITY SURFACE EMITTING LASER INCLUDING INDIUM IN THE ACTIVE REGION, now U.S. Pat. No. 6,922,426. U.S. patent application Ser. No. 10/352,293 is also a continuation-in-part of U.S. patent application Ser. No. 10/026,044, filed Dec. 27, 2001, and entitled INDIUM FREE VERTICAL CAVITY SURFACE EMITTING LASER, now U.S. Pat. No. 7,058,112. U.S. patent application Ser. No. 10/352,293 is also a continuation-in-part of U.S. patent application Ser. No. 10/026,020, filed Dec. 27, 2001, and entitled VERTICAL CAVITY SURFACE EMITTING LASER INCLUDING INDIUM AND ANTIMONY IN THE ACTIVE REGION, now U.S. Pat. No. 6,975,660.

This application is also a continuation-in-part of U.S. patent application Ser. No. 10/026,016, filed Dec. 20, 2001, and entitled VERTICAL CAVITY SURFACE EMITTING LASER INCLUDING INDIUM, ANTIMONY AND NITROGEN IN THE ACTIVE REGION, now U.S. Pat. No. 7,095,770.

This application is also a continuation-in-part of U.S. patent application Ser. No. 10/026,019, filed Dec. 20, 2001, and entitled VERTICAL CAVITY SURFACE EMITTING LASER INCLUDING INDIUM AND NITROGEN IN THE ACTIVE REGION," now pending.

This application is also a continuation-in-part of U.S. patent application Ser. No. 10/026,055, filed Dec. 20, 2001, and entitled VERTICAL CAVITY SURFACE EMITTING LASER INCLUDING INDIUM IN THE ACTIVE REGION, now U.S. Pat. No. 6,922,426.

This application is also a continuation-in-part of U.S. patent application Ser. No. 10/026,044, filed Dec. 27, 2001, and entitled INDIUM FREE VERTICAL CAVITY SURFACE EMITTING LASER, now U.S. Pat. No. 7,058,112.

This application is also a continuation-in-part of U.S. patent application Ser. No. 10/026,020, filed Dec. 27, 2001, and entitled VERTICAL CAVITY SURFACE EMITTING LASER INCLUDING INDIUM AND ANTIMONY IN THE ACTIVE REGION, now U.S. Pat. No. 6,975,660.

The disclosures of each of the foregoing applications are hereby incorporated by reference herein in their entireties.

BACKGROUND OF THE INVENTION

1. The Field of the Invention

The present invention generally relates to systems and methods for producing vertical cavity surface emitting lasers (VCSELs). The invention is also related to utilizing combinations of nitrogen (N), aluminum (Al), antimony (Sb), phosphorous (P), indium (In), gallium (Ga) and/or arsenide (As) as a material system and as a means to increase VCSEL device wavelength longer than 1200 nanometers (nm) using ordinary MOCVD or MBE equipment. The present invention more particularly relates to development of a VCSEL using migration enhanced epitaxy (MEE) in processing InGaAs, InGaAsN, InGaAsNSb, GaAsNSb AlGaAsNSb and/or other combinations.

2. The Relevant Technology

Solid-state semiconductor lasers are important devices in applications such as optoelectronic communication systems and high-speed printing systems. There has been an increased interest in VCSELs although edge emitting lasers are currently used in the vast majority of applications. A reason for growing interest in VCSELs is that edge emitting lasers produce a beam with a large angular divergence, making efficient collection of the emitted beam more difficult. Furthermore, edge emitting lasers should not be tested until the wafer is cleaved into individual devices, the edges of which form the mirror facets of each device. By contrast, not only does the beam of a VCSEL have a small angular divergence, a VCSEL emits light normal to the surface of the wafer. Additionally, because VCSELs generally incorporate mirrors monolithically in their design, they allow for on-wafer testing and the fabrication of one-dimensional or two-dimensional laser arrays.

VCSELs may be made by growing several layers on a substrate material. VCSELs include a first mirrored stack, formed on the substrate by semiconductor manufacturing techniques, an active region, formed on top of the first mirrored stack, and a second mirrored stack formed on top of the active region. By providing a first contact on top of the second mirrored stack, and a second contact on the backside of the substrate, a current is forced through the active region, thus driving the VCSEL.

The active region is further made up of one or more quantum wells sandwiched between two spacer cladding regions. Inside the spacers, the active region is sandwiched by confining layers. The confining layers or regions are used to provide electrical confinement of minority carriers. By selecting the appropriate materials for the quantum well, the confining layers, and the barrier layers, a VCSEL generally may be grown or fabricated that generates light at a desirable, predetermined wavelength. For example, by using InGaAs quantum wells on GaAs substrates, longer wavelength VCSELs may be produced. The use of InGaAs quantum wells, however, causes strain in the quantum wells. If the quantum wells are grown past their critical thickness, they may relax by forming dislocations, and thus a poor quality active region results.

VSCELs may be made with GaAs and emit light in the 850 nanometer range. Because the quantum well for the short wavelength 850 nanometer VCSELs is made from GaAs (the same material as the substrate) the various epitaxially deposited layers, whose thickness is related to wavelength, are able to maintain the minimal mechanical strain without mechanical relaxation. If one were to use InGaAs in the active region at the larger 1.3 µm wavelength device range (e.g., 1200-1650 nm), however, the lattice mismatch is generally such that large layers would tend to relax their strains and suffer dislocations, produce slip lines or develop island growth, which would interfere with proper lasing.

In order to go to the proper bandgap for what is referred to in the art as a 1.3 µm wavelength (i.e., greater than 1200 nm) semiconductor lasers, one generally uses InGaAs, GaAsSb or some combination thereof instead of GaAs in the active layer. Indium gallium arsenide (InGaAs) and gallium arsenide antimonide (GaAsSb), however, do not possess the same lattice constant as GaAs at the compositions useful for 1.3 micron lasers. This makes it very difficult to build a proper quantum well structure.

The thickness of the various layers in the active region while not arbitrary have some flexibility within the constraints of the design and the process. The combined thickness of the spacers, the confining layers, the barriers and the active regions sandwiched by the mirrors must be such that a Fabry-Perot resonator is formed. The quantum wells should generally be positioned so that they are roughly centered at an antinode of the optical electric field. These two requirements define the spacer thickness in terms of the other layer thicknesses.

The barrier layer thicknesses between the quantum wells need to be thick enough to adequately define the quantum wells, but thin enough that the quantum well positions are not excessively far from the antinode of the electric field. The thickness of the barrier layers at the boundaries of the quantum well regions have some flexibility. Optimally they need to be at least thick enough that the energy levels of each of the quantum wells are nominally the same. They may be thicker if material quality issues require this.

The thickness of the quantum well is related by quantum mechanics to the well and barrier compositions, the desired emission wavelength, and the density of states. With a higher density of states narrower quantum wells may be optimally used.

Long wavelength quantum wells are a challenge to construct. The semiconductor laser, e.g., VCSEL, structure needs a design to achieve long wavelength quantum wells normally fabricated on GaAs substrates. It is therefore very desirable to have a quantum well (i.e., the active layer (or quantum well layer) and the barrier layers surrounding the active layer) making use of materials such as GaAs, InGaAs or GaAsSb in the construction of a VCSEL operational above the 1200 nm range. It may be advantageous to remedy the foregoing and other deficiencies in conventional devices and to facilitate the production of longer wavelength VCSELs by introducing migration enhanced epitaxy (MEE) into the VCSEL fabrication process.

Therefore, systems and methods may be developed here utilizing MEE during molecular beam epitaxy (MBE) growth of quantum wells used in semiconductor lasing devices such as VCSELs. Methods and systems shown here may be used for producing semiconductor lasers exhibiting enhanced quantum well performance.

BRIEF SUMMARY OF THE INVENTION

Although reference is made to a VCSEL, or vertical cavity surface emitting laser, devices throughout the text of this disclosure, aspects of the present invention may apply to semiconductor lasers in general. The use of the term "VCSEL" throughout this disclosure is for illustrative purposes and should not be taken as a limitation of the application of the present disclosure.

New and improved solid-state lasers devices disclosed here may be capable of exceeding 1200 nm in wavelength.

Migration enhanced epitaxy (MEE) may be incorporated into systems and methods used for fabricating VCSELs.

A VCSEL may be provided wherein InGaAs with N is introduced in quantum wells and at least one of GaAsN or GaAs into barrier layers using MEE. An optimal arsenic flux for the growth of nitrogen containing layers may be defined.

Additionally, a VCSEL may be provided wherein InGaAs with N is introduced in quantum wells and at least one of GaAsN or GaAs into barrier layers using MEE, wherein N may be physically prevented from entering a wafer processing chamber during growth of layers without nitrogen.

Hardware may be described wherein N is physically prevented from entering an MBE system chamber during barrier layer growth by incorporation of a gate valve on a nitrogen source line between the nitrogen source line and its physical entry into an MBE system housing.

A VCSEL active region may be provided that includes InGaAsN quantum wells separated by barrier layers including at least one of: a two layer GaAsN—GaAs or three-layer GaAs—GaAsN—GaAs barrier; GaAs extended barrier layers disposed before and after the active region; and AlGaAs confining regions provided before and after the GaAs extended barrier layers opposite the active region, wherein the GaAs extended barrier layers prevent Al and N from combining between the active region and AlGaAs confining regions.

A VCSEL may be provided including two-layer barrier layers comprised of GaAs and GaAsN, respectively, at least one GaAs quantum-based well including N, and at least one of Sb and In introduced in the quantum well(s), and extended barrier layers comprised of GaAs bordering the active region between confinement layers comprised of Al.

A VCSEL may be provided wherein barrier layers comprised of at least two-layer including at least one of GaAsN and InGaAsN are provided between more than one quantum well including N, and at least one of In, Ga, As, Sb and P introduced in quantum well(s).

A VCSEL may be provided having an indium-free GaAs structure with a GaAsNSb quantum well(s), GaAsN—GaAs barrier layers and AlGaAs confining layers.

A VCSEL active region may be provided having indium-free GaAsSbN quantum well(s) and GaAsN—GaAs—GaAsN barrier layers disposed before and after the quantum wells within the active region; GaAs outer barrier layers disposed before and after the active region; and AlGaAs confining regions disposed next to the outer barrier layers opposite the active region.

A VCSEL in the present disclosure may specifically apply to GaAs substrates; InGaAs, InGaAsN, GaAsN, GaAsNSb, InGaAsSb and InGaAsSbN quantum wells; GaAs, GaAsN and GaAsP mechanical stabilizers, or any combinations thereof. Quantum wells and/or associated barrier layers may be grown with several combinations of gallium, arsenic, nitrogen, aluminum, antimony, phosphorous and/or indium placed within or about a typical GaAs substrate to achieve long wavelength VCSEL performance, e.g., within the 1260 to 1650 nm range which is useful for fiber optic communication.

BRIEF DESCRIPTION OF THE DRAWINGS

FIG. 36 is a graph showing the beam intensity change for Ga and As caused by a shutter operation;

FIG. 37$a$ is a graph of a reflected high energy electron diffraction specular beam intensity oscillation during the growth of GaAs with normal molecular beam epitaxy growth;

FIG. 37$b$ is a graph of a reflected high energy electron diffraction specular beam intensity oscillation during the growth of GaAs with migration enhanced epitaxy growth;

FIGS. 38$a$, 38$b$ and 38$c$ show graphs relating to recovery characteristics of reflected high energy electron diffraction specular beam intensity as a function of an amount of Ga;

DETAILED DESCRIPTION OF THE PREFERRED EMBODIMENTS

Making long wavelength quantum wells on GaAs has proven to be very difficult, but technology presented in the following description has advanced to the point that longer wavelength quantum wells and higher efficiency VCSELs are now feasible. One issue is that long wavelength compounds tend not to be lattice matched to GaAs. This has been alleviated recently by using nitrogen in the quantum wells, which reduces the energy band and reduces the lattice constant in contrast to every other band gap reducing element, thus allowing the inclusion of other elements (e.g., In, Sb), and which reduces the band gap but increases the lattice constant. Unfortunately, the use of nitrogen may have the negative aspect of reducing confinement in the valence band and may tend to make poorer utility material as more nitrogen is added.

The present device may use strain compensation with or without nitrogen in the barrier layers to allow more In and/or Sb incorporation in the quantum wells without relaxation and thus achieve longer wavelengths.

Figure 1:
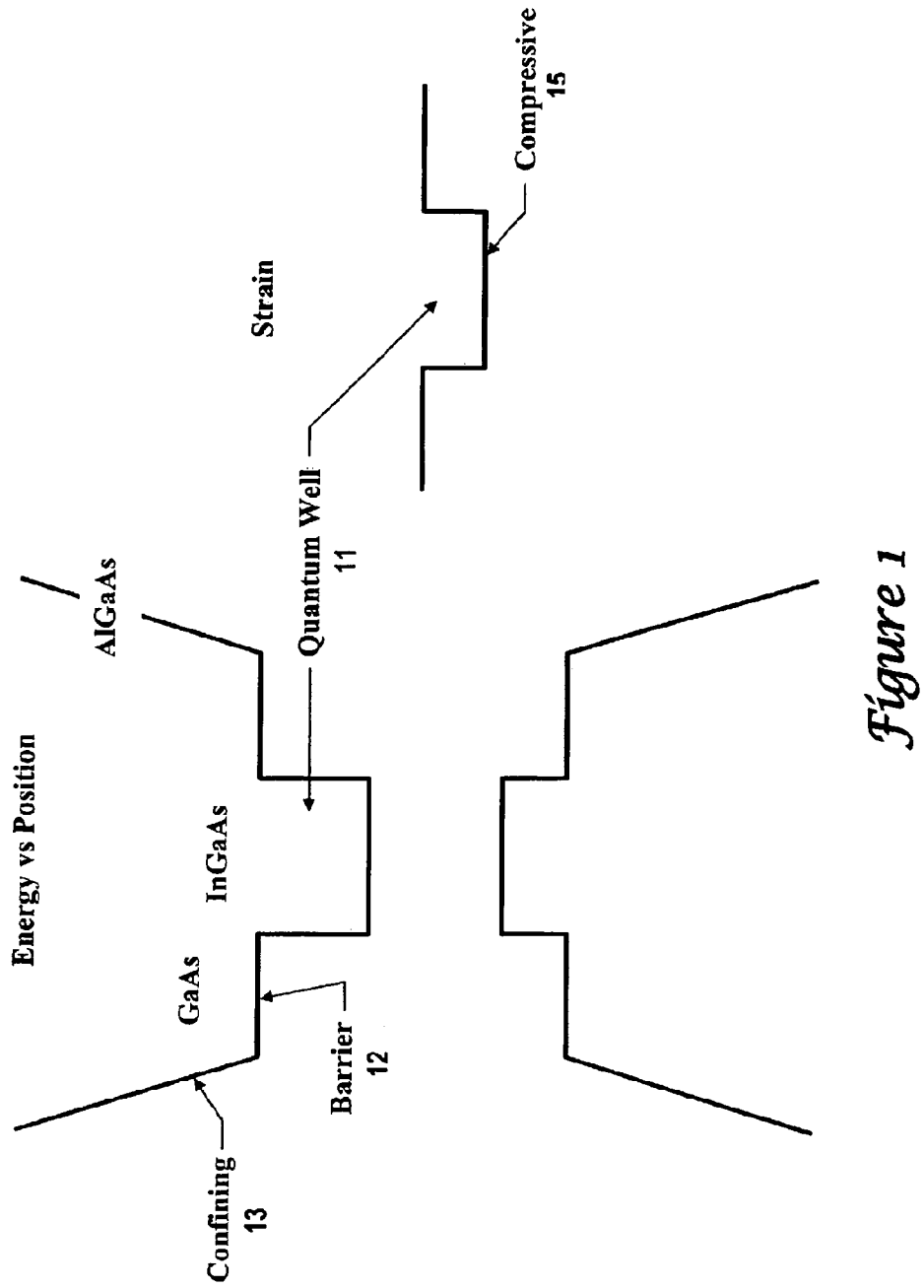
FIG. 1 is a graphical illustration of "energy v. position" and "strain" for a VCSEL having AlGaAs confinement areas, GaAs barrier layers and InGaAs quantum wells.

Referring to FIG. 1, portions of the illustrations in FIG. 1-11 on the left hand-side of the drawings are meant to graphically represent the position of a quantum well 11, barrier layers 12, and confinement layers 13 of a VCSEL. Power is represented in FIGS. 1-11 with lines drawn vertically with respect to the position of the components mentioned. On the right hand-side of FIGS. 1-11, strain for each illustrated device is also shown graphically, with compression also being represented vertically downwards and tension represented vertically upwards.

Referring to FIG. 1, a graphical illustration of "energy v. position" and "strain" for a VCSEL having AlGaAs confinement layers 13, GaAs barrier layers 12 and an InGaAs quantum well 11 is shown and will serve as a benchmark for adjustments made in FIGS. 2-11. With use of an InGaAs quantum well on a GaAs substrate, longer wavelengths may be achieved, however, strain is also caused in the quantum well as shown by the depth 15 (compressive 15 in the drawing) of the associated strain measurement.

Figure 2:
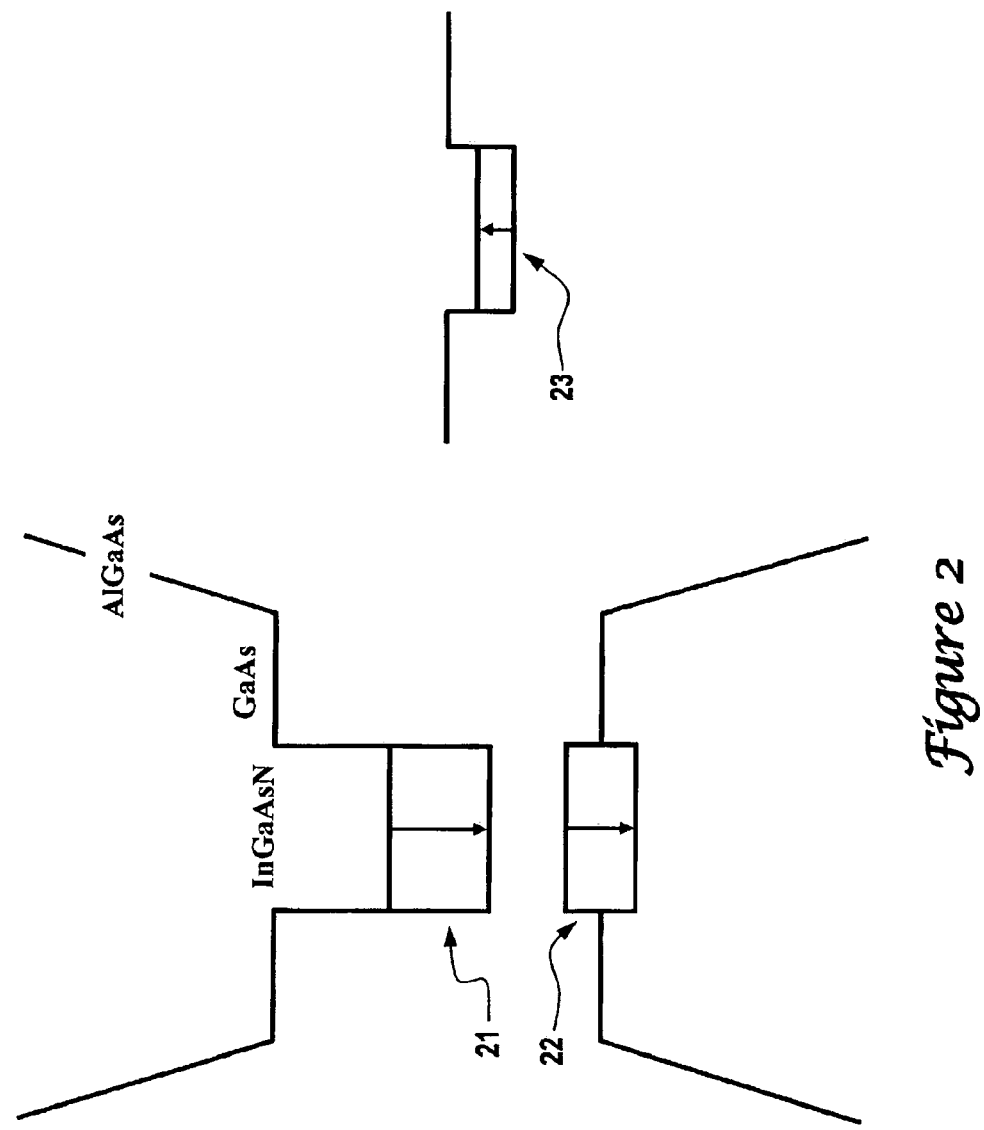
FIG. 2 is a graphical illustration of "energy v. position" and "strain" for a VCSEL having AlGaAs confinement layers, GaAs barrier layers and InGaAsN quantum wells.

Referring to FIG. 2, a VCSEL is shown having AlGaAs confinement layers, GaAs barrier layers and an InGaAsN quantum well. Nitrogen is added to the InGaAs quantum well of FIG. 1, which resulted in a decrease as shown by downward pointing arrows in energy 21 and valence 22 band confinement when compared to the nitrogen-free device of FIG. 1. In FIG. 2, however, strain was reduced 23 as shown by an upward pointing arrow when compared to the nitrogen-free device of FIG. 1.

Figure 3:
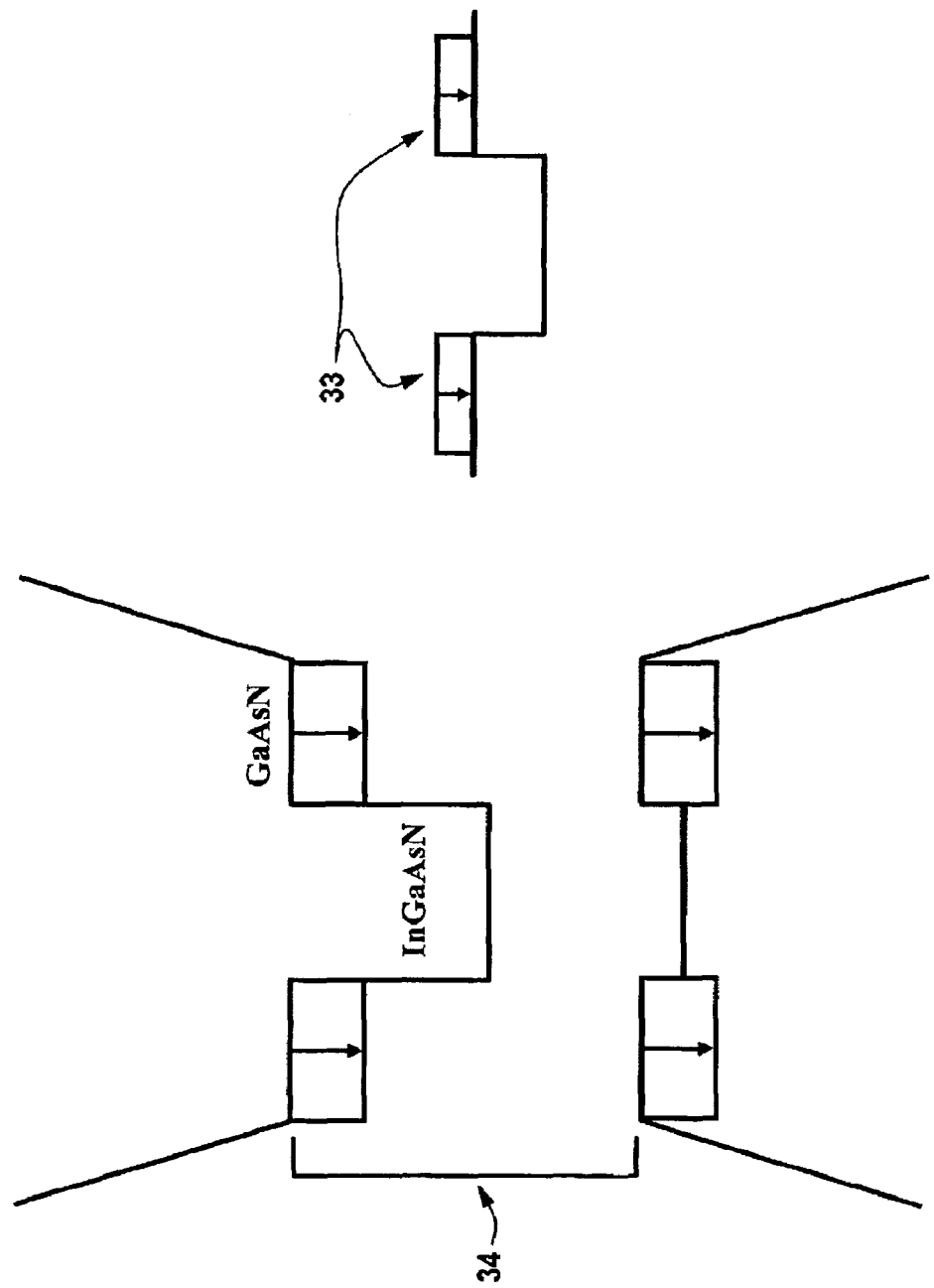
FIG. 3 is a graphical illustration of "energy v. position" and "strain" for a VCSEL having GaAsN barrier layers and InGaAsN quantum wells.

Referring to FIG. 3, nitrogen (N) is also added to the barrier layers of the device shown in FIG. 2. As shown by the downward pointing arrows 34 in FIG. 3, the hole well may be remade with the introduction of nitrogen in the barrier layers as compared to the device shown in FIG. 2. In addition, strain compensation 33 was provided to the device with the addition of nitrogen to the barrier layers as shown by the downward pointing arrows. It should be noted that strain compensation would be realized even where nitrogen is not also introduced in the quantum well.

Figure 4:
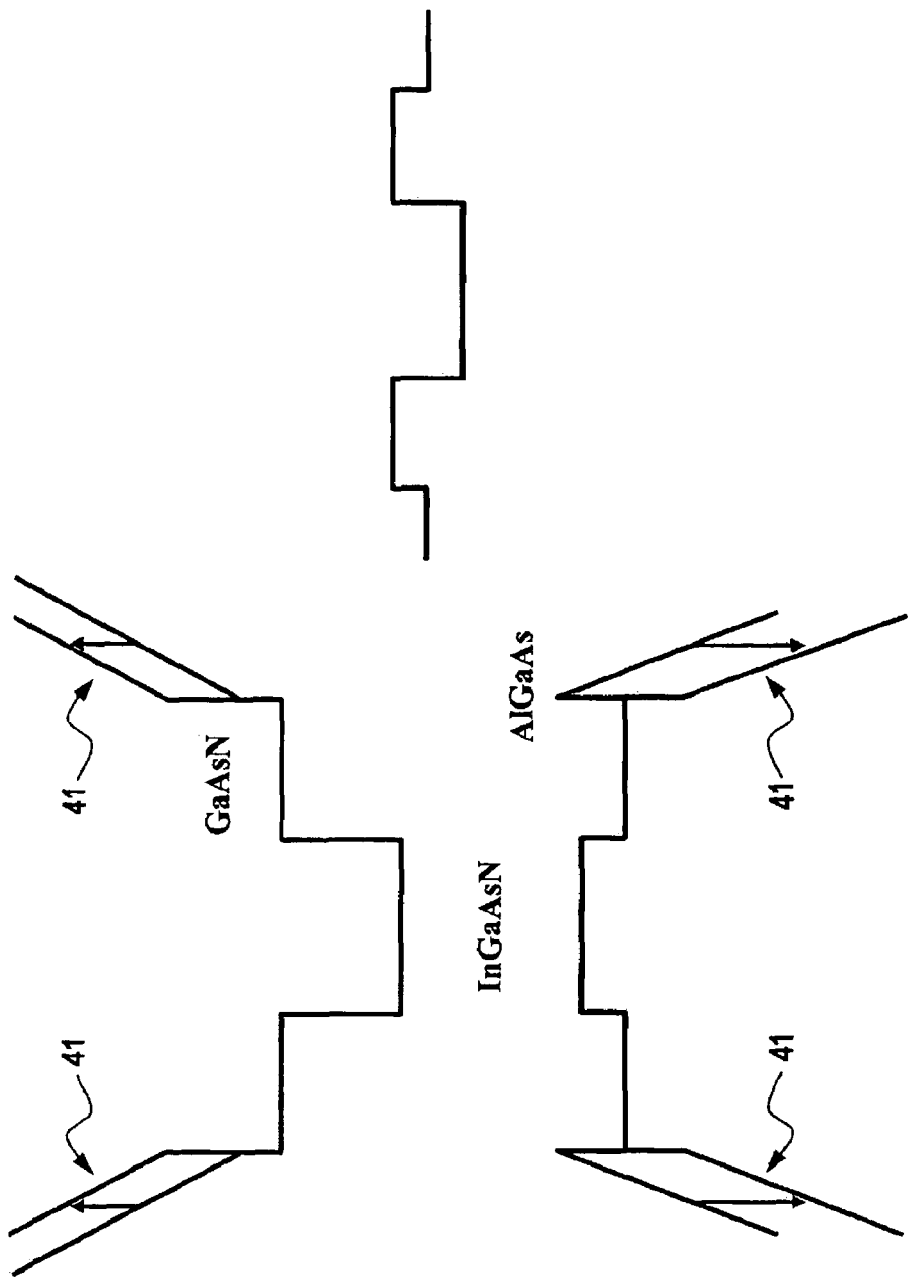
FIG. 4 is a graphical illustration of "energy v. position" and "strain" for a VCSEL having AlGaAs confinement layers, GaAsN barrier layers and InGaAsN quantum wells.

Referring to FIG. 4, Aluminum (Al) is now added to the confinement layers/areas of the device shown in FIG. 3. Providing Al to the confinement layers eliminates or substantially reduces undesirable wells at the edges of the device as shown by the arrows 41 in FIG. 3. The introduction of Al, however, has a negligible effect on the strain of the device as shown.

Figure 5:
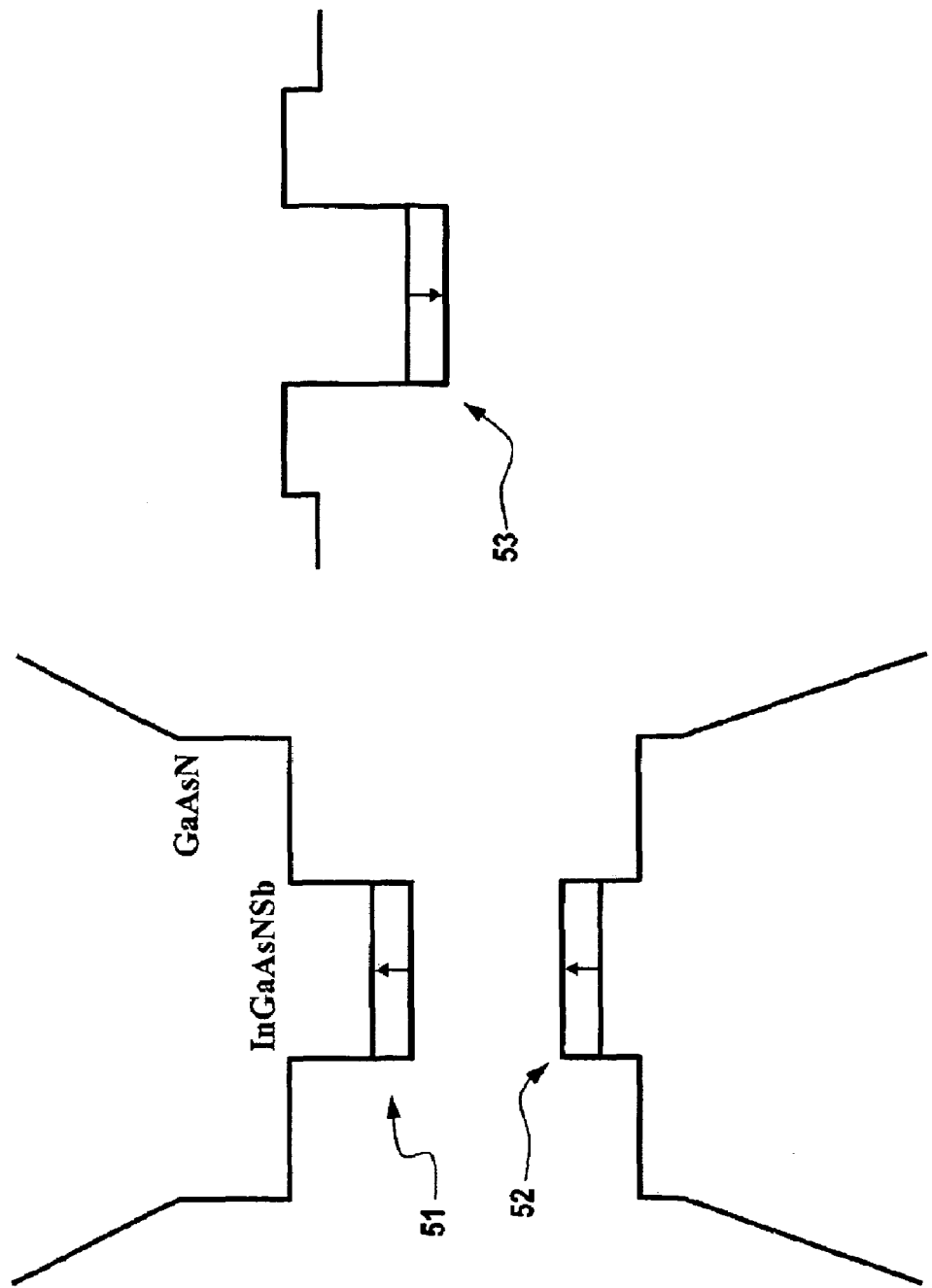
FIG. 5 is a graphical illustration of "energy v. position" and "strain" for a VCSEL having GaAsN barrier layers and InGaAsNSb quantum wells.

Referring to FIG. 5, antimony (Sb) is now added to the quantum well of the device previously viewed in FIG. 4. The introduction of Sb to the quantum well causes a decrease in the band gap, an increase 52 in the valence band well, and a decrease 51 in the conduction band well as shown by the arrows. Strain in the device is increased 53 with the introduction of Sb.

Figure 6:
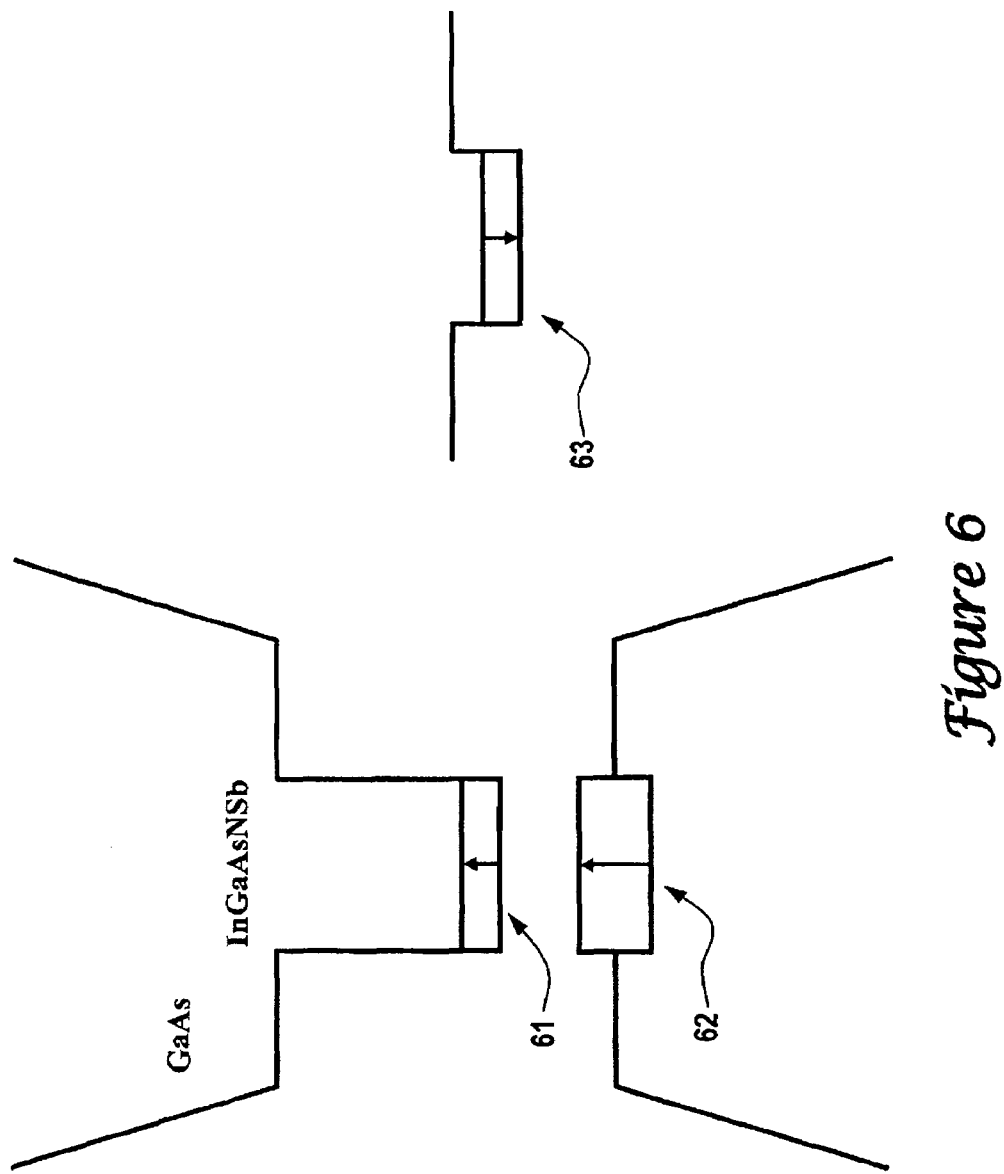
FIG. 6 is a graphical illustration of "energy v. position" and "strain" for a VCSEL having GaAs barrier layers and InGaAsNSb quantum wells.

Referring to FIG. 6, antinomy (Sb) was added to the quantum well for the device illustrated in FIG. 2. The band gap for the device increases the valence band well 61 as shown by the upward pointing arrow, but decreases the conduction band well 62 as shown by the upward pointing arrow. Compressive strain in the quantum well is also shown to increase 63 with Sb as shown by the downward pointing arrow.

Figure 7:
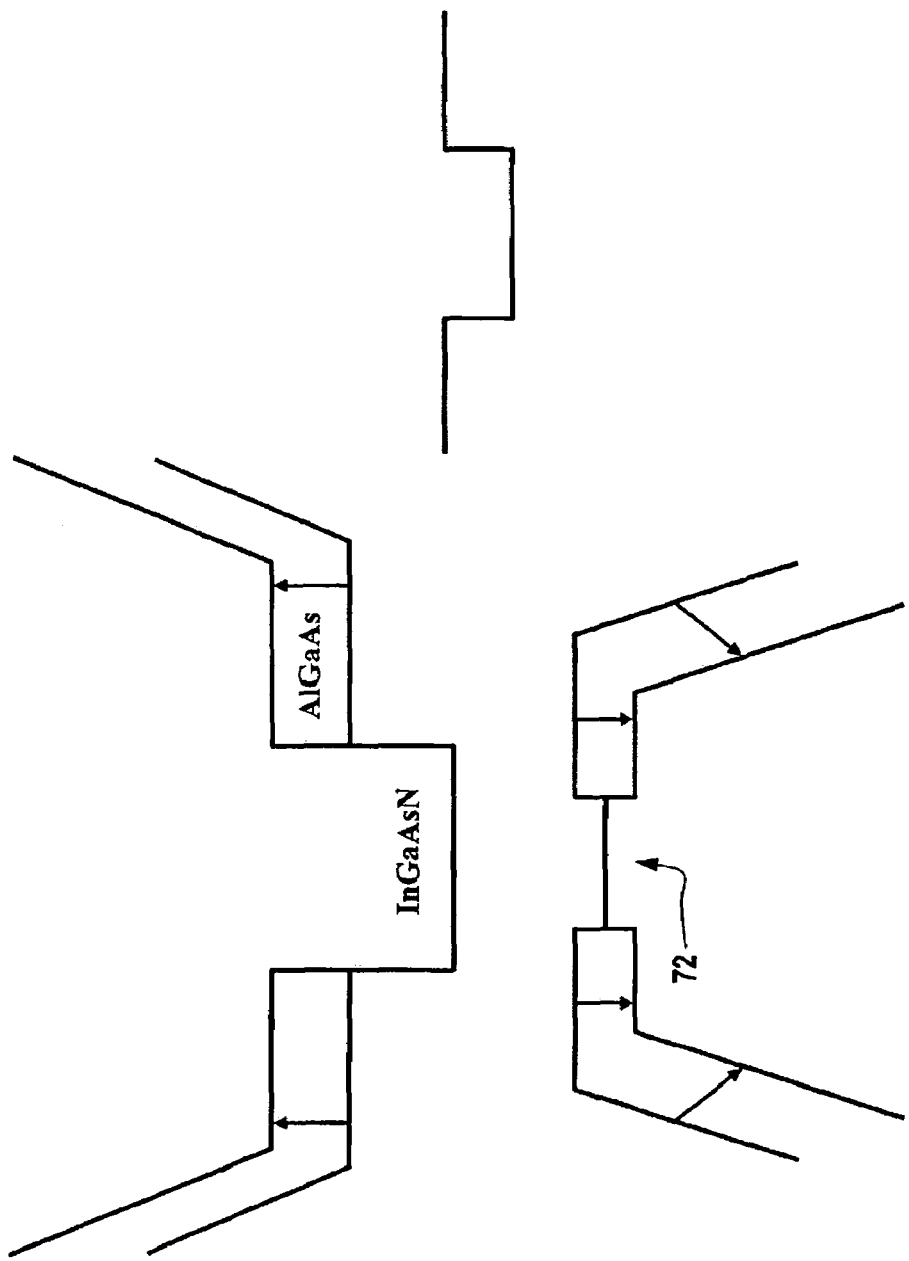
FIG. 7 is a graphical illustration of "energy v. position" and "strain" for a VCSEL having AlGaAs barrier layers and InGaAsN quantum wells.

Referring to FIG. 7, aluminum (Al) is added to the barrier and confining layers of the device first shown in FIG. 2. As seen in the graphical illustration of FIG. 7, the valence band well 72 is remade using Al. Strain compensation is unremarkable from its initial position in FIG. 2.

Figure 8:
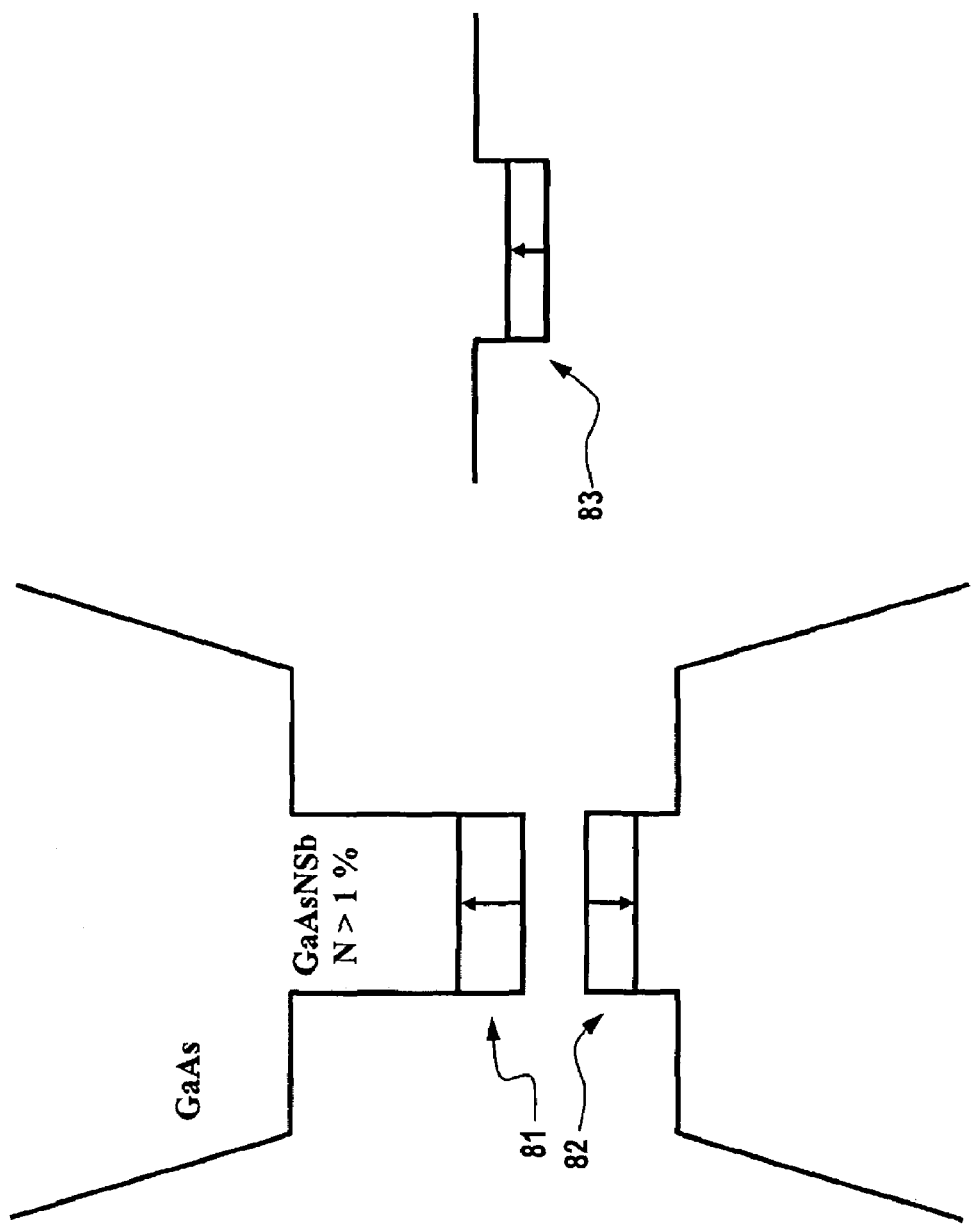
FIG. 8 is a graphical illustration of "energy v. position" and "strain" for a VCSEL having GaAs barrier layers and GaAsNSb quantum wells with >1% nitrogen.

Referring to FIG. 8, an indium free device is shown. Indium is removed from the quantum well for the device shown in FIG. 6. The quantum well includes GaAsNSb. The band gap decreases 82 for the valence band well and decreases 81 in the conduction band well. Device strain 83 is shown to improve with the removal of In as shown by the upward pointing arrow.

Figure 9:
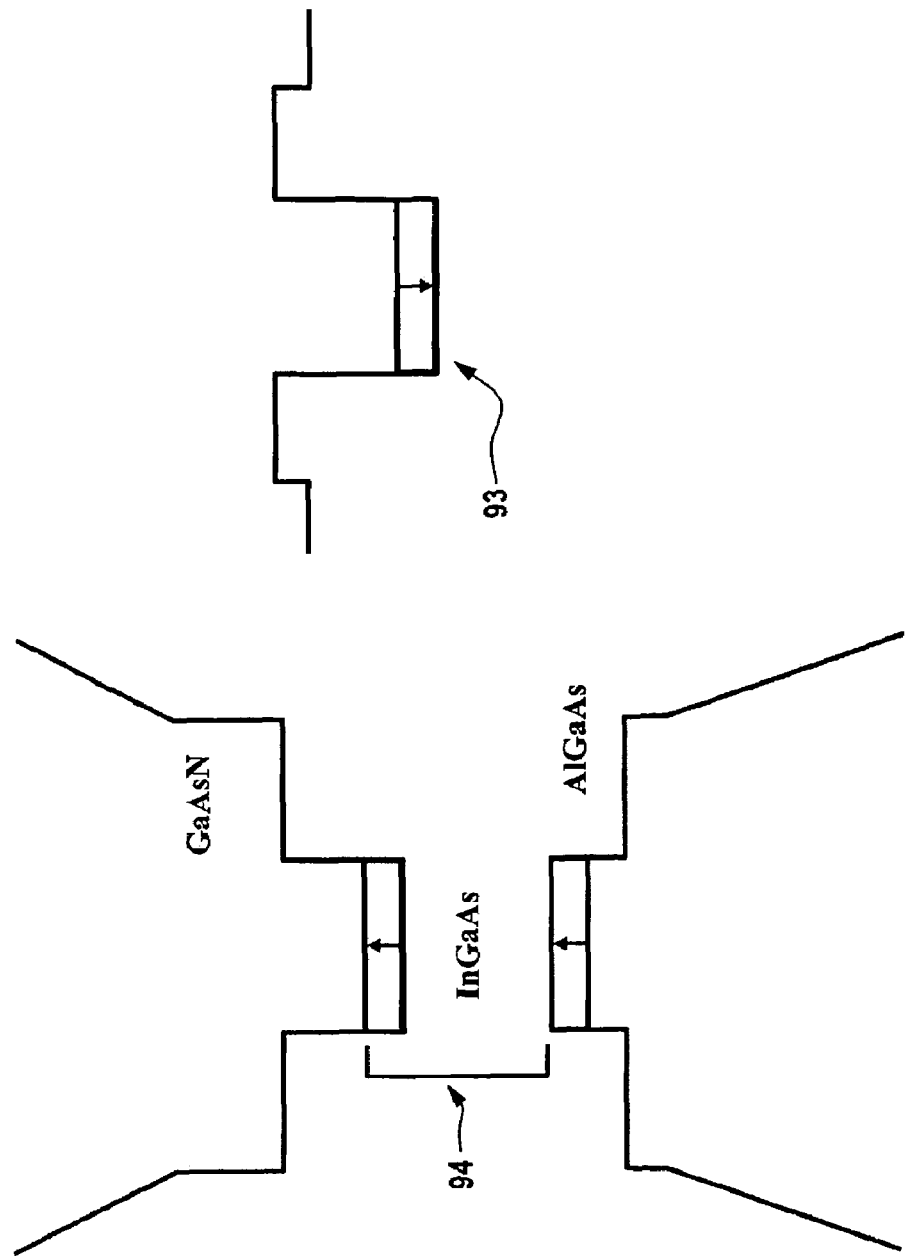
FIG. 9 is a graphical illustration of "energy v. position" and "strain" for a VCSEL having AlGaAs confinement layers, GaAsN barrier layers and InGaAs quantum wells.

Referring to FIG. 9, nitrogen is shown removed from the quantum well for the device shown in FIG. 4. The removal of N from the quantum well increases 94 band gap and hole confinement as shown by the upward pointing arrows. Strain, however, is also increased 93 in the quantum well as shown by the downward pointing arrows, but is compensated for in the barrier region.

Figure 10:
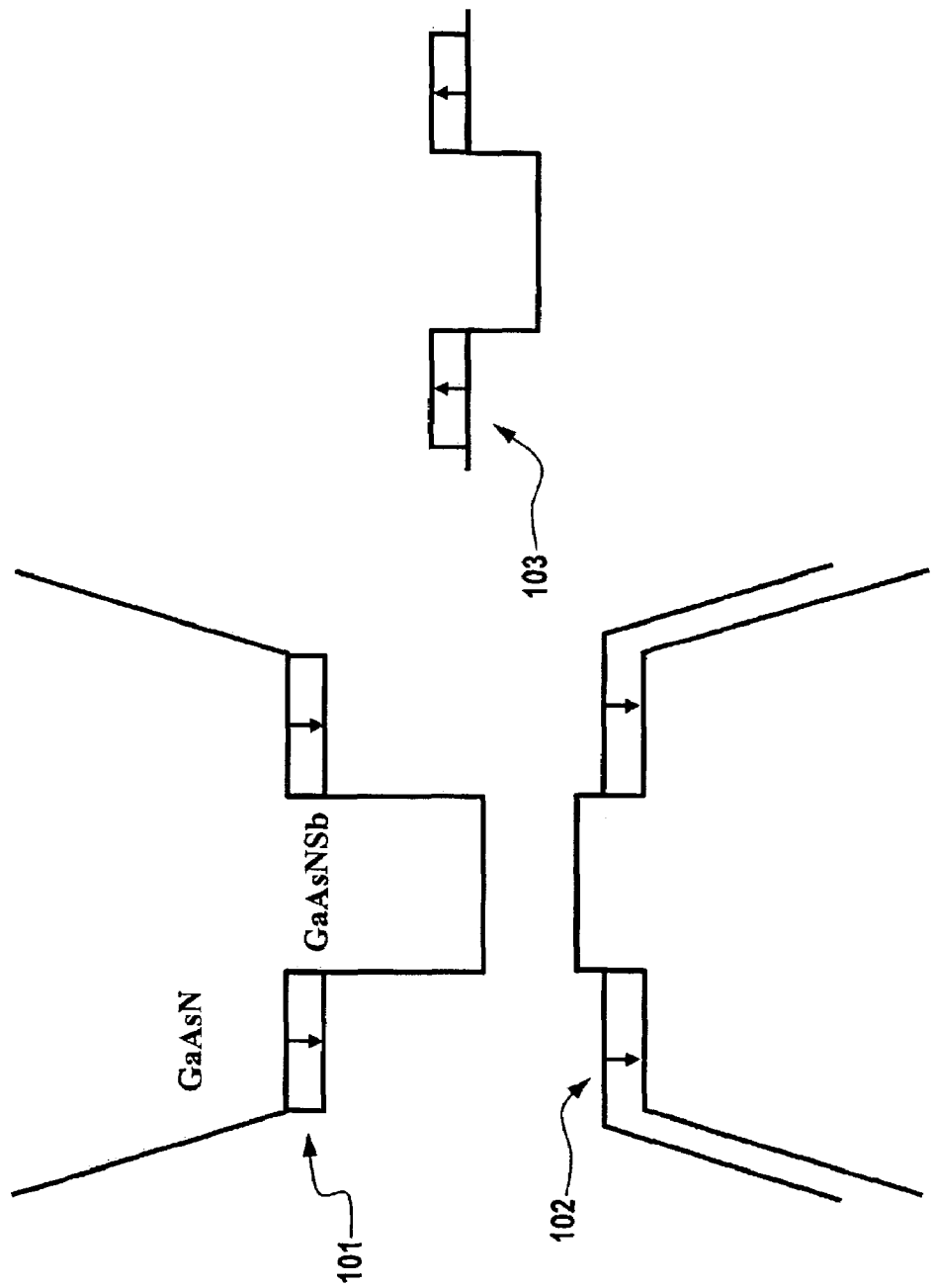
FIG. 10 is a graphical illustration of "energy v. position" and "strain" for a VCSEL having GaAsN barrier layers and GaAsNSb quantum wells.

Referring to FIG. 10, a strain compensated device is illustrated. The device of FIG. 8 is improved by adding nitrogen to the barrier layers and aluminum to the confining layers. The quantum well comprises GaAsSbN. This combination decreases 101 the electron well and increases 102 the hole well. The overall strain 103 in the device is reduced as shown by the upward pointing arrows.

Figure 11:
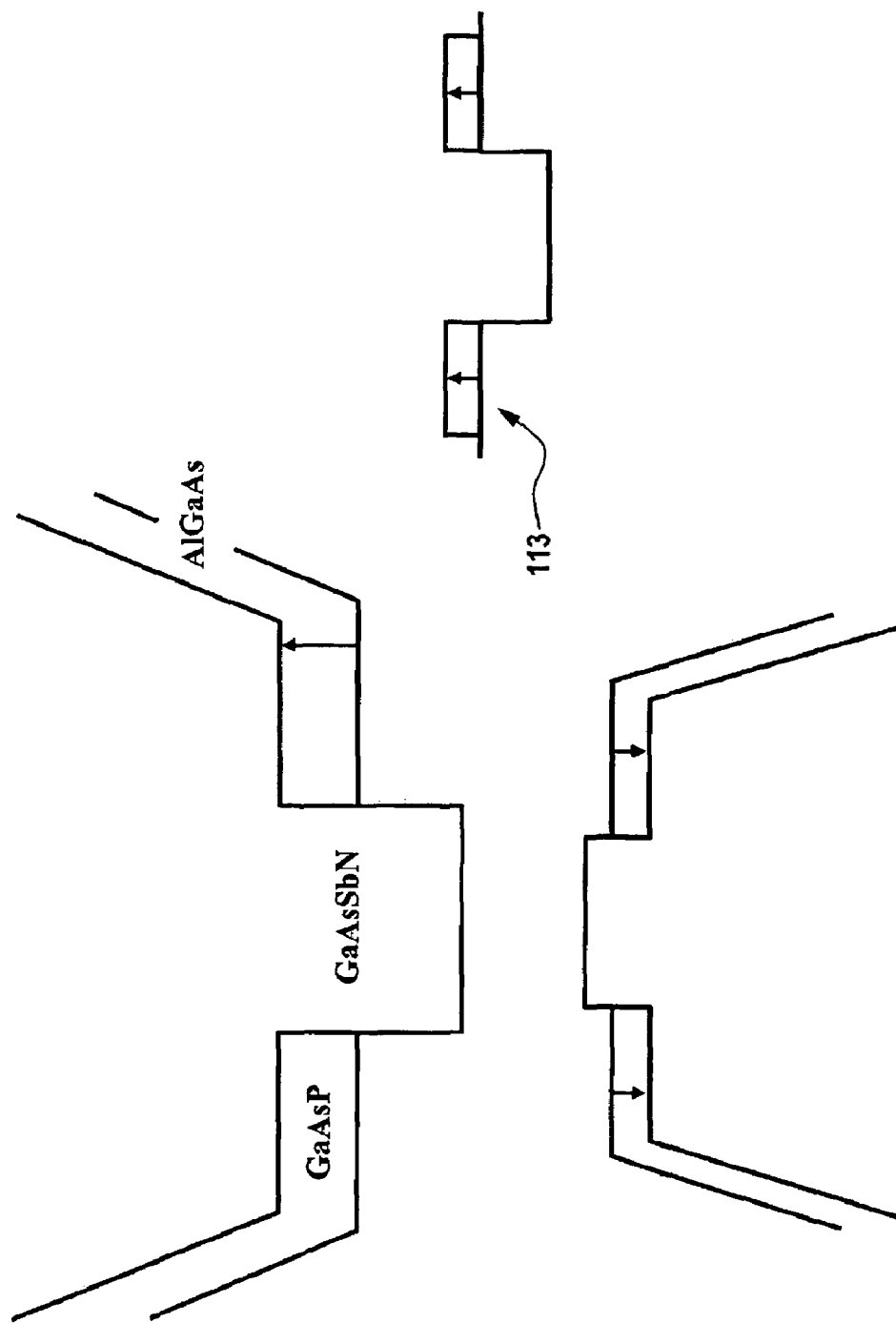
FIG. 11 is a graphical illustration of "energy v. position" and "strain" for a VCSEL having AlGaAs confinement layers, GaAsP barrier layers and GaAsSbN quantum wells.

Referring to FIG. 11, additional strain compensation is shown 113 by adding phosphorous (P) to the barrier layers. The device in FIG. 11 is shown to have AlGaAs confinement layers, and a GaAsSbN quantum well. Indium may also be used in the quantum well.

For data communication applications, it is desired to reach 1310 nm quantum wells that are used in VCSELs and edge emitting lasers. Referring again to FIG. 1, a typical InGaAs strained quantum well on GaAs is illustrated. By further using nitrogen for strain compensation in the barriers (as shown in FIGS. 3, 9), enough indium may be added to the quantum wells without relaxation to reach 1310 nm, and because little or no nitrogen is used in the quantum well itself, hole confinement and material quality are maintained. Using AlGaAs confining layers with sufficient Al to avoid extra wells being formed may be advantageous; however, the pairing of aluminum and nitrogen may produce deep traps within the device, which increases non-radiative recombinations. Therefore, Al and N should not be allowed to pair or overlap during device processing.

As mentioned above, FIG. 8 shows a GaAsNSb quantum well with GaAs barriers. In this case, both Sb and nitrogen lower the band gap. The Sb causes the quantum well to tend towards poor electron confinement with good hole confinement, and the nitrogen tends to go in the opposite direction towards poor hole confinement and good electron confinement. By adjusting the ratio of these at least 0.07 eV well depth in the conduction band, and 0.05 eV depth in the valence band may be achieved while achieving both 1310 nm and 1550 nm light emission.

If large quantities of Sb and small quantities of N are used in the quantum wells such that there is excessive compressive strain in the quantum wells, nitrogen or phosphorous may be added to the barriers layers to compensate for the excessive compressive strain, because it tends to deepen the electron well whereas Sb in the quantum well tends to shallow the electron well. It is also useful to increase the gap of the confining layers with Al or even P to avoid extra wells.

Indium may be used in the quantum well to adjust the wavelength, well depths and strain in the quantum wells. As the band gap decreases, the wells become more compressive. But adding indium has only a secondary effect on the relative band offsets (valence band or conduction band) as shown in FIGS. 5 and 6. The example illustrated in FIG. 6 will work for both 1310 nm and 1550 nm active regions.

As shown in FIG. 7, AlGaAs barrier layers may be used for InGaAsN quantum wells to increase the hole well depth. Because nitrogen may increase the electron effective mass, the quantum wells containing nitrogen may be made thinner, for example, less than 50 A. In VCSELs, this means there are more quantum wells.

All aspects of the present approach may apply to single as well as multiple quantum wells in both edge emitters and VCSELs and other semiconductor lasers. In all of the above, at least a 0.07 eV well depth is maintainable in the conduction band, and a 0.05 eV depth is maintainable in the valence band.

Epitaxy flattening techniques, which reduce the bunching of steps, may be used in combination with the above. Intra-quantum well mechanical stabilizers may also be used with the above.

Figure 12:
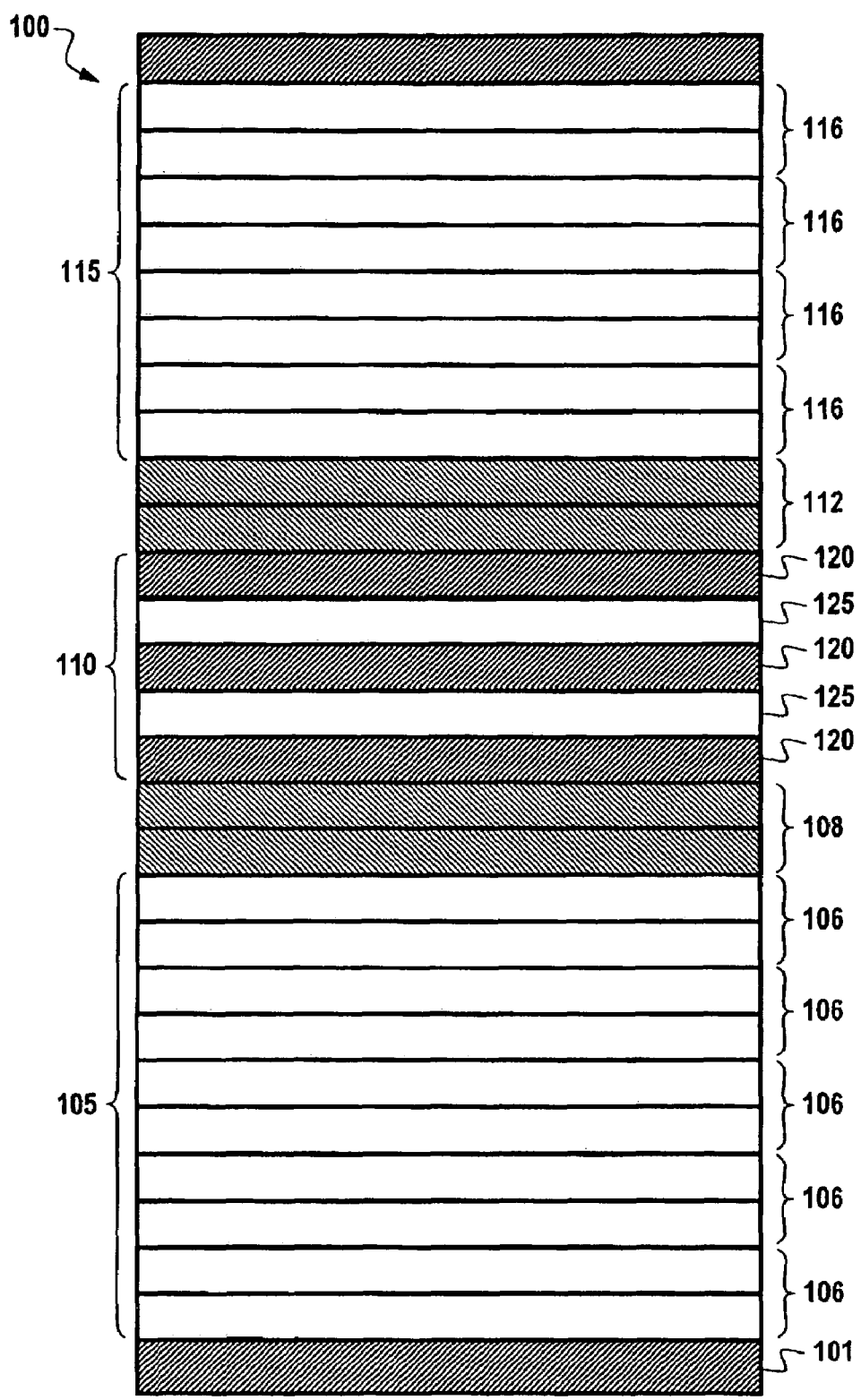
FIG. 12 is an exemplary sectional view of a VCSEL.

Referring to FIG. 12, illustrated is a sectional view of a vertical cavity surface emitting laser 100 (VCSEL). A VCSEL 100 may be grown by techniques such as metal organic molecular beam epitaxy, or metal-organic chemical vapor deposition. Reference is made to U.S. Pat. No. 5,903,588, assigned to the assignee of the present invention and herein incorporated by reference for its teaching, which describes methods of VCSEL fabrication used in the art. The VCSEL may be grown on a GaAs substrate 101 due to the robust nature and low cost of the material, however it should be recognized that semiconductor materials, Ge, for example, could also be used as the substrate. The VCSEL 100 may then be formed by disposing layers on the substrate.

Epitaxial layers may include: a first mirror stack 105 disposed on the substrate 101, a first cladding region 108 disposed on the first mirror stack 105, an active region 110 disposed on the first cladding region 108, a second cladding region 112 disposed on the active region 110, and a second mirror stack 115 disposed on the second cladding region 112. The active region 110 may further include one or more quantum wells 120 being separated from each other by barrier layers 125, depending on the application for which the VCSEL 100 is designed. One may change the number of quantum wells 120 in the VCSEL active region 110.

The first mirror stack 105 may be grown by epitaxially depositing mirror pair layers 106 on the substrate 101. In order to crystal lattice match mirror stack 105 to the substrate 101, a suitable semiconductor material system for the mirrored pairs 106 should be deposited. In this specific example, which should not be taken as a limitation of the scope of the present invention, the substrate 101 is GaAs, therefore a GaAs/AlGaAs material system may be employed. To achieve a high percentage of reflectivity, the number of mirror pair layers 106 in the stack 105 may typically range from 20 to 40, depending on the difference between the refractive indices of the layers. Different refractive indexes are also achievable by altering the aluminum content in the mirror stack 105.

A first cladding region 108 may be made of one or more layers epitaxially disposed on the first mirror stack 105. The first cladding region 108 in the currently described example may be made of a GaAsN material system.

It has been shown that nitrogen added to the quantum well 120 may have the effect of increasing the strain between the layers, which reduces the band gap energy of the excited state. Band gap energy reduction generally decreases the amount of energy required to excite the material, and increases the wavelength of the emitted photon. This may be desirable to achieve longer wavelength VCSELs 100. The more nitrogen that is added to the quantum well 120, the greater this reduction in band gap energy can be, and thus longer wavelength VCSELs 100 may be produced.

As discussed above, by using nitrogen in the GaAsN barrier layers and secondarily in the quantum wells themselves, the strain in the structure may be reduced, which can increase the allowable thickness of the quantum wells, and the energy gap may be reduced, both capable of increasing the allowable wavelength.

The use of nitrogen in the quantum wells may make the valence band discontinuity non-confining or type II. By using AlGaAs or AlGaAsN as the confining material, however, and GaAsN, AlGaAs, or AlGaAsN or GaAsP barrier layers, the non-confining problem may also be reduced. In addition, if Sb replaces a portion of the As in the quantum well, the type II transition caused by nitrogen may further be avoided allowing even more nitrogen. Because even more nitrogen is allowable, more indium is also allowable. Because nitrogen, indium, and antinomy all reduce the band gap energy, the achievable wavelengths extend to wavelengths longer than either 1310 nm used for data communications or 1550 nm used for telecommunications.

By adding nitrogen to the InGaAs quantum wells, the overall strain in the well may become significantly less allowing more indium before reaching the critical thickness, thus making longer wavelength VCSELs possible. Using nitrogen for strain compensation in the barriers, the allowable strain in the quantum well region may increase, meaning even more indium can be used in the quantum wells. More indium is generally allowable without violating the critical thickness, making for an even lower band gap and longer wavelengths. In addition, using nitrogen in the barrier layers between the quantum wells may also reduce the energy of these barriers in the conduction band making the energy of the quantum state lower, further increasing the allowable wavelength. Using nitrogen in the barrier layers may also be advantageous in avoiding type II behavior in the valence band because as nitrogen is incorporated in the quantum wells, the conduction band discontinuity increases, and the valence band discontinuity decreases. In addition, use of AlGaAs or AlGaAsN for the confining structure may further avoid unintentional wells in the valence band at the barrier layer confining layer boundary. Finally, the use of Sb in the quantum well may reduce the band gap energy further, while avoiding the type II behavior (allowing even more nitrogen). All of these aspects contribute to the ability to make very long wavelength active regions.

Introducing nitrogen into the active region 110 is not generally without drawbacks. GaN and InN may have large differences in their lattice constants as well as optimal growth conditions. Due to this lattice mismatch, the quality of the material may be greatly compromised when layers comprising the active region 110 are grown beyond a certain critical thickness. Layers thicker than this critical thickness may have misfit dislocations, relaxing the strain between the layers, and decreasing the material quality. This may substantially compromise the quality of the VCSEL 100.

By including nitrogen in the barrier layers 125, the band gap energy decrease may be observed as it is when nitrogen is added only to the active region 110. However, the amount of nitrogen, which is utilized in the active region 110 to achieve a given band gap energy reduction, and therefore a longer wavelength, may be reduced. The lattice mismatch can therefore not generally be as severe as when nitrogen is added to the active region 110 alone, thus making the material system easier to fabricate. Higher quality VCSELs may be achieved by introducing nitrogen into the barrier layers 125 than when nitrogen is only added to the active region 110.

Active region 110 may next be epitaxially deposited on the first cladding region 108. The active region 110 may include one or more quantum wells 120. The device may use quantum wells 120 of less than 50 angstroms. When nitrogen is introduced into the active region 110 or the cladding region 108 or 112, the effective electron mass in the regions may increase dramatically. With this increased density of the states, the amount of indium or nitrogen needed to produce a given amount of gain in the active region 110 generally decreases. Therefore, the volume of the quantum well 120 may also be decreased, giving less volume for parasitics to occur in.

A second cladding region 112 may be made of one or more layers epitaxially disposed on the active region 110. The second cladding region 112 may be made of a GaAsN material system.

A second mirror stack 115 may next be grown by epitaxially depositing mirror pairs layers 116 on the second cladding region 115. In order to crystal lattice match mirror stack 115 to the substrate 101, a suitable semiconductor material system for the mirrored pairs 116 should be deposited. The substrate 101 is formed of GaAs; therefore a GaAs/AlGaAs material system may be employed. To achieve a high percentage of reflectivity, the number of mirror pair layers 116 in the stack 115 may typically range from 20 to 40, depending on the difference between the refractive indices of the layers. Different refractive indexes are achievable by altering the Aluminum content in the mirror stack 115.

Figure 13:
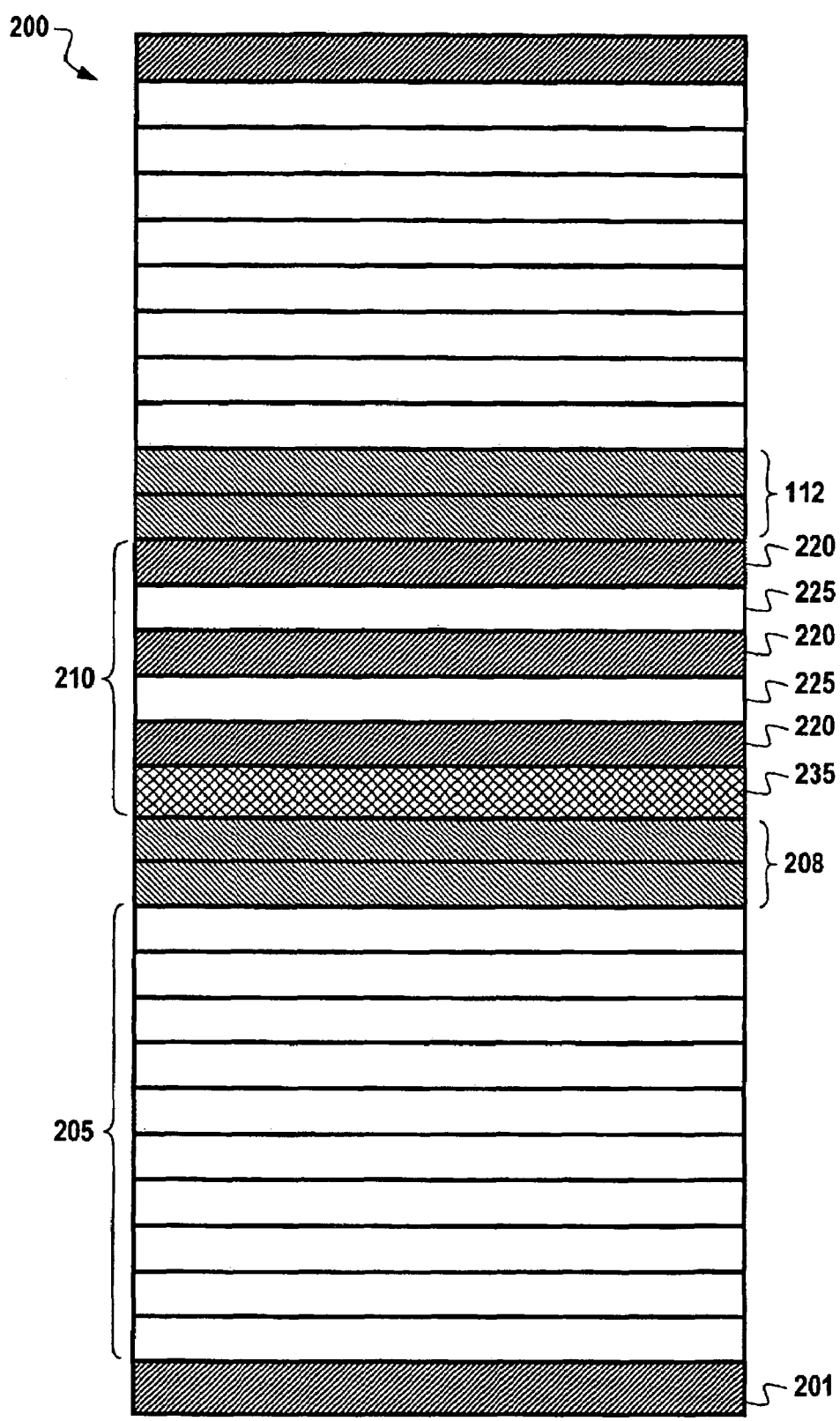
FIG. 13 is another exemplary sectional view of a VCSEL.

Referring now to FIG. 13, another example 200 of the VCSEL is shown. A flattening layer 235 may be sandwiched between the lower confining layer 208 and the quantum wells 220. When the various layers are grown on the substrate, bunching of molecular steps form on the surface of the newly formed layers. The steps on the layer's surface increase the likelihood that layers adjacent to the substrate 201 may dislocate from the substrate 201. A heavily compressively strained InGaAs flattening layer 235 grown before the active region 210 at a distance sufficient to minimize the straining effects on the quantum well layers 220 generally has the effect of flattening the surface to which the active region 210 is disposed. Between quantum layers or wells 220 are barrier layers 225. The distance between the flattening layer 235 and the quantum wells 220 may be several hundred angstroms. Growing this flattening layer 235 between the lower confining layer 201 and the first mirror stack 205 flattens out these molecular steps. The surface may be further flattened when the epi layers are grown on "100 or 111 on" orientation substrates. If the substrate is in "off" orientation, the number of molecular steps may increase and the likelihood of bunching of steps increase, thereby increasing the likelihood for dislocation. By flattening the surface on which the stacks are deposited, the strain between layers may be further increased through the addition of greater amounts of In or Sb in the active region. This increase in In or Sb generally decreases the band gap energy, thereby making it easier to grow VCSELs 201 that emit longer wavelengths.

Figure 14:
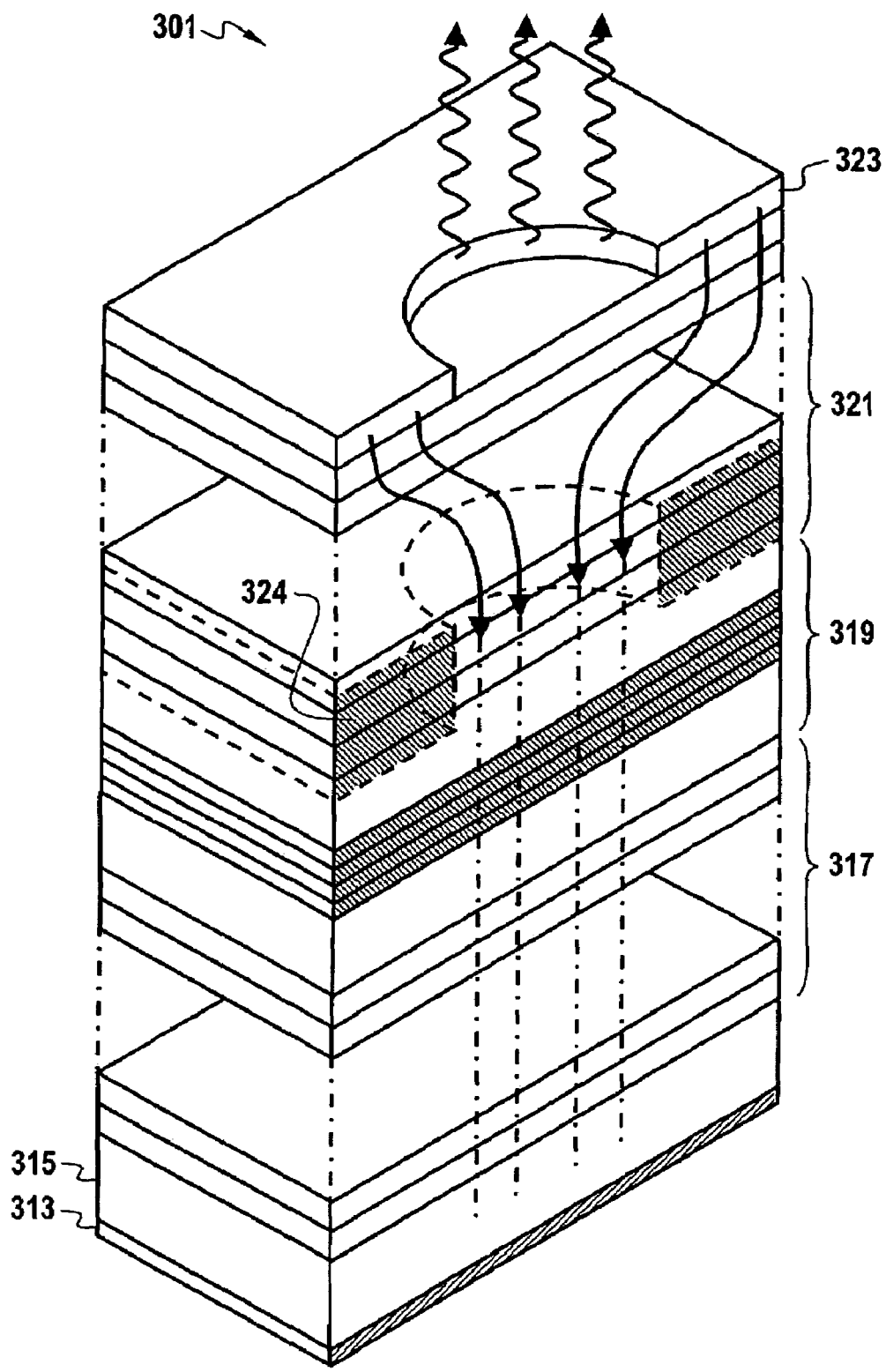
FIG. 14 is a perspective representation of a VCSEL.

As seen in FIG. 14, a VCSEL 301 has, as viewed from the bottom up, a metal contact layer 313 adjacent and a first conductivity type, in this case N type, substrate 315 upon which is deposited an N type mirror stack 317. The active region 319 is adjacent the N type mirror stack and is comprised of GaAs barrier layers and InGaAs quantum well layer as further explained below. On top of the active region 319 is deposited a second conductivity type, in this case P type, mirror stack 321 upon which is deposited a P metal contact layer 323. A current blocking region 324, made with oxidation of certain high content layers or ion implantation in the stack, may be disposed in the P type mirror stack 321.

As discussed above, there are certain problems with maintaining mechanical stress in long wavelength VCSEL layers necessary for at least 1.3 micron emission; when attempting to use GaAs substrates with InGaAs quantum well layers, and AlGaAs mirrors, i.e., common materials deposited through the use of common processing/fabrication equipment, such as MOCVD or MBE.

Figure 15:
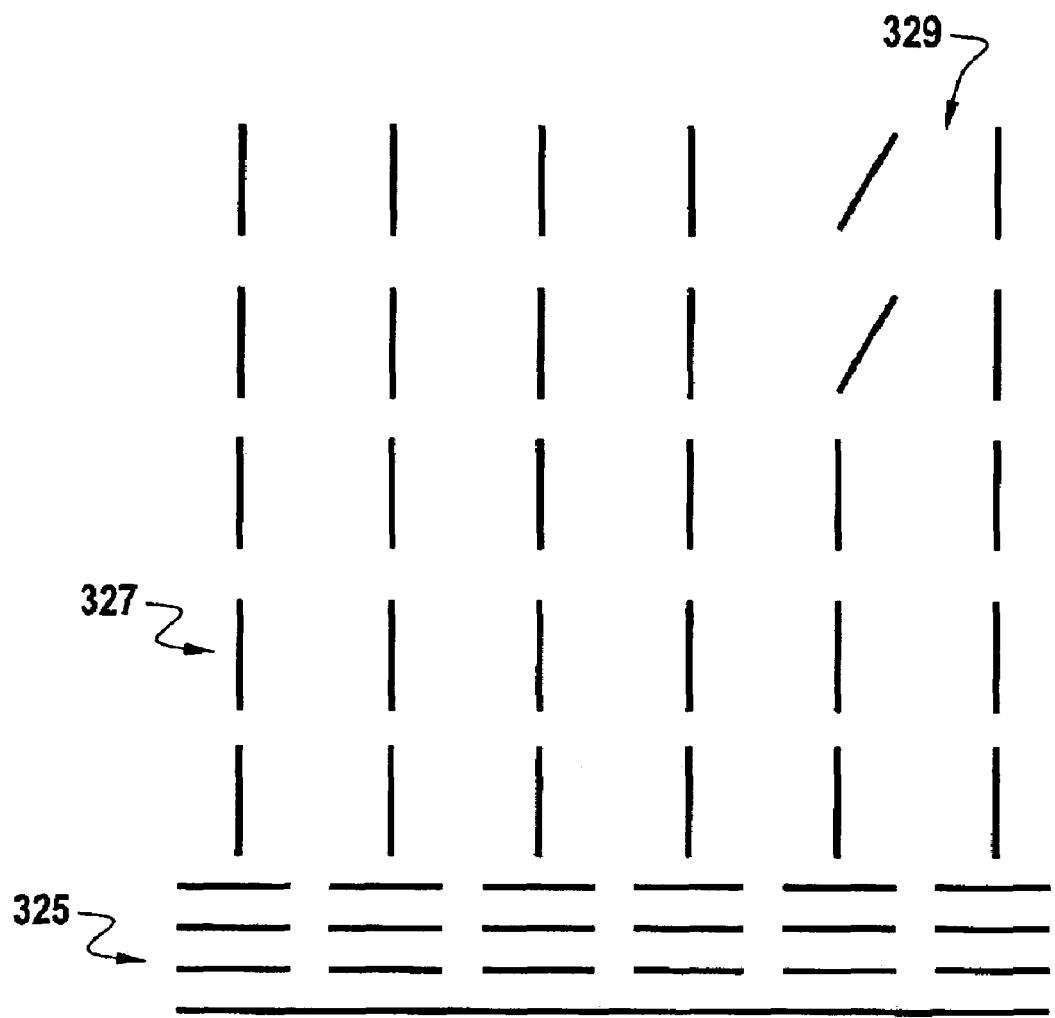
FIG. 15 is a schematic illustration of InGaAs lattice relaxation on a GaAs substrate.

As seen in FIG. 15, a schematic representation of a GaAs layer 325 upon which is deposited an InGaAs layer 327, because these two materials (GaAs and In GaAs) have different lattice constants, when one attempts to deposit too thick-of a layer of InGaAs upon the GaAs layer beneath it, or substrate, at a certain point the mechanical strain of the InGaAs will relax, as shown at 329, causing a dislocation, slip line, or damage point which will negate or interfere with proper lasing activity. Unfortunately, a certain thickness must be maintained in order to obtain the proper energy levels to produce the longer wavelength lasing, e.g., 1.3 micron. Thus, the InGaAs layers should be made thinner.

Figure 16:
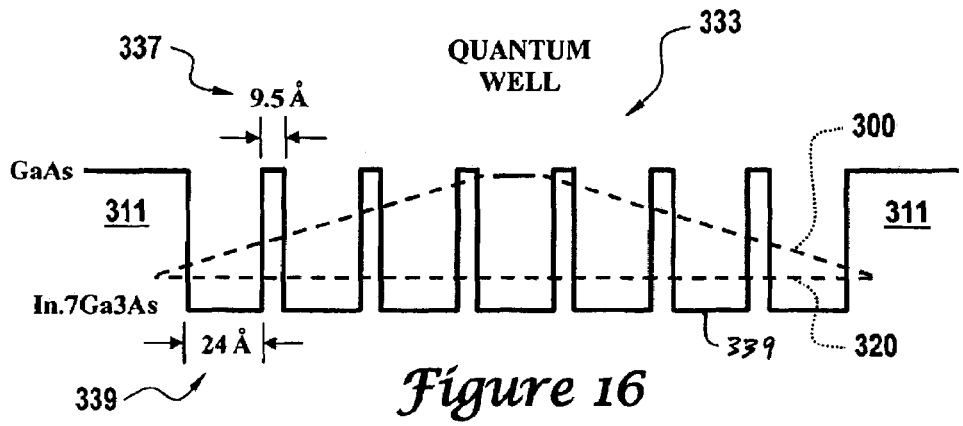
FIG. 16 is a schematic view of the energy bands versus depth of an active portion of a 1.3 micron VCSEL.

FIG. 16 illustrates a plot of energy versus position. As shown in FIG. 16, a 225 Å quantum well 333 is composed of InGaAs and surrounded on either side by barrier layers 311 composed of GaAs. Within the quantum well 333, there may be located six substantially equidistant, 9.5 Å thick, gallium arsenide spacer layers 337 surrounded by seven InGaAs layers 339 of approximately 24 angstrom thickness. A wave function line 300 and minimum allowable energy line 320 for the active region are included in the plot. There may be other arrangements of GaAs spacer layers, such as two or four layers within the quantum wells, and it is probable that the InGaAs and GaAs layer widths will have to be multiples of the lattice constant. Thus the thickness of the quantum well may change slightly to achieve optimal lasing performance.

It should be noted that the mechanically stabilized quantum wave functions extend into the GaAs barrier layers 311. The dimensions are selectable such that the lattice strain of the mechanically reinforced InGaAs layers 339 causes band splitting that modifies the InGaAs band gap. The GaAs mechanical stabilizer layer thickness, the InGaAs layer thickness, the InGaAs composition and the total well thickness or width, will determine the position of the quantum levels 19 relative to the band edge. However, it is believed that the dimensions shown are close approximations to desirable for an indium 0.7 gallium 0.3 arsenide composition of the InGaAs layer.

Figure 17:
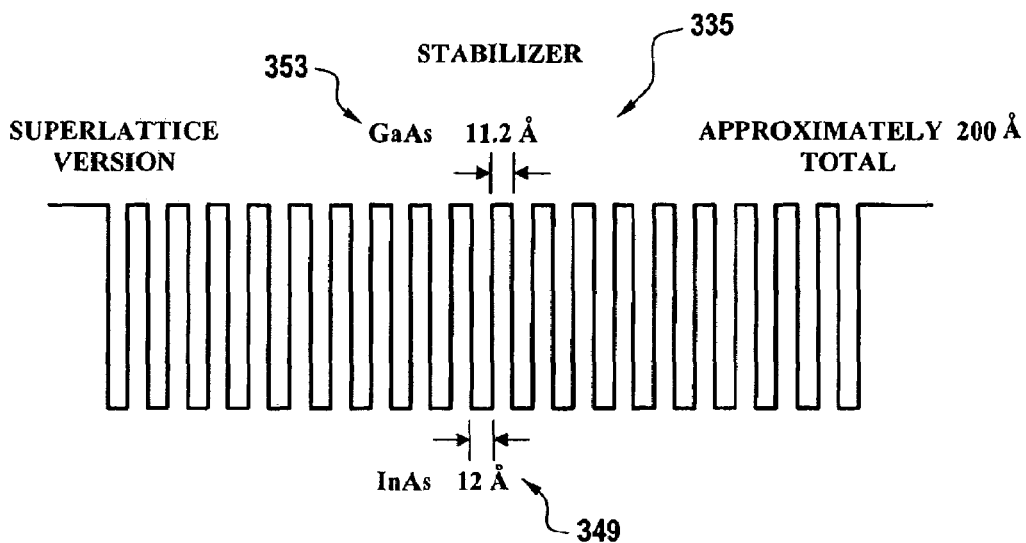
FIG. 17 is a schematic view of an alternative quantum well structure.

As shown in FIG. 17, alternative forms of a quantum well may be constructed. The quantum well 335 may be about two hundred angstroms wide with a superlattice of equidistant stabilization layers 353 of 11.2 angstrom GaAs substrate material surrounded by InAs semiconductor alloy layers 349 of each about 12 angstroms.

The mechanical stabilization layered quantum wells may be construed using etching and deposition techniques with standard MOCVD equipment or MBE equipment.

Figure 18:
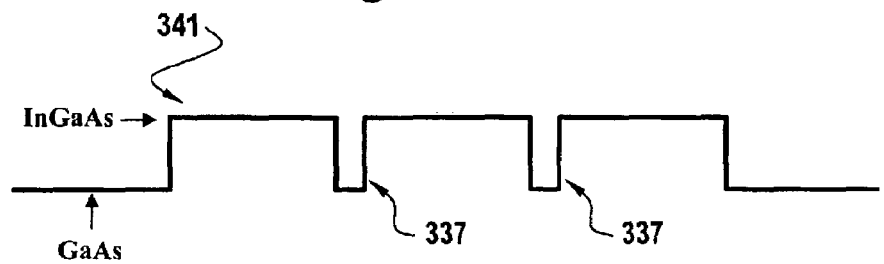
FIG. 18 illustrates a schematic representation of the mechanical energy within the mechanically stabilized InGaAs quantum well using the GaAs stabilization layers.

In an illustrative example, the quantum wells of the are surrounded by GaAs barrier layers upon which it is suitable to deposit high efficiency AlGaAs mirrors whose lattice constant matches that of the GaAs barrier layers. A mechanical energy graph representation line 341 is shown in FIG. 18 to illustrate that the strain is kept on the InGaAs layer at a level above that of the GaAs mechanical stabilizers 337 which is in an unstrained state due to lattice constant matching.

During the growth process the strained epitaxial layer follows the lattice constant of the substrate until it passes the critical thickness. At this thickness, instead of maintaining the strain it is relaxed with dislocations. By keeping the thickness under the critical thickness the layers do not relax and form dislocations. The GaAs mechanical stabilizers are not strained because they follow the lattice constant of the substrate. Growing an InGaAs layer on the GaAs mechanical stabilizer is similar to growing one on an associated substrate. The total thickness of the quantum well may then be arbitrarily large exceeding what one would calculate for the critical thickness.

Figure 19:
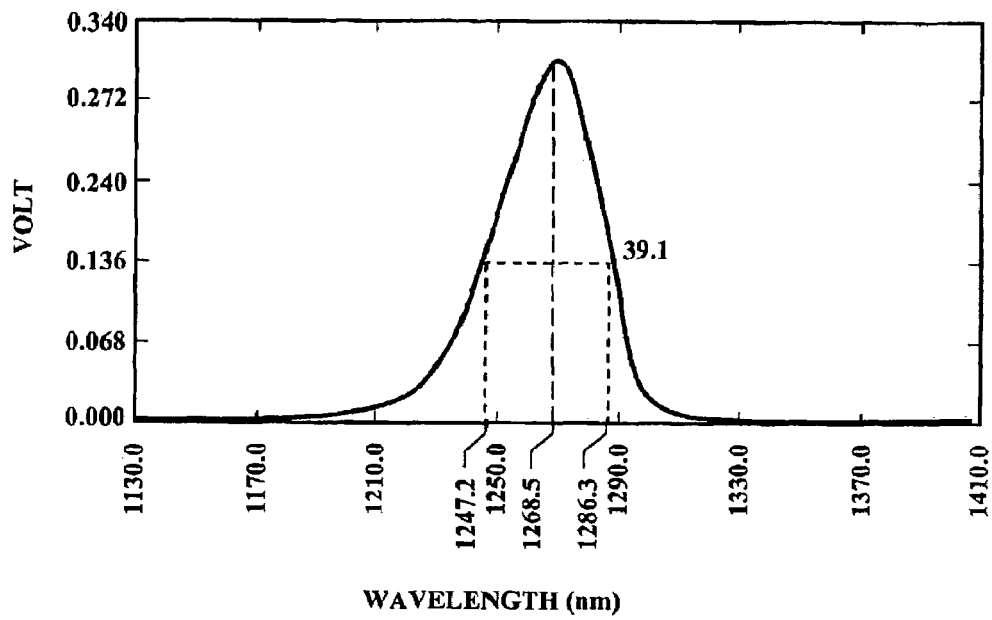
FIG. 19 illustrates a graphical illustration of the output waveform for a quantum well containing little nitrogen.
Figure 20:
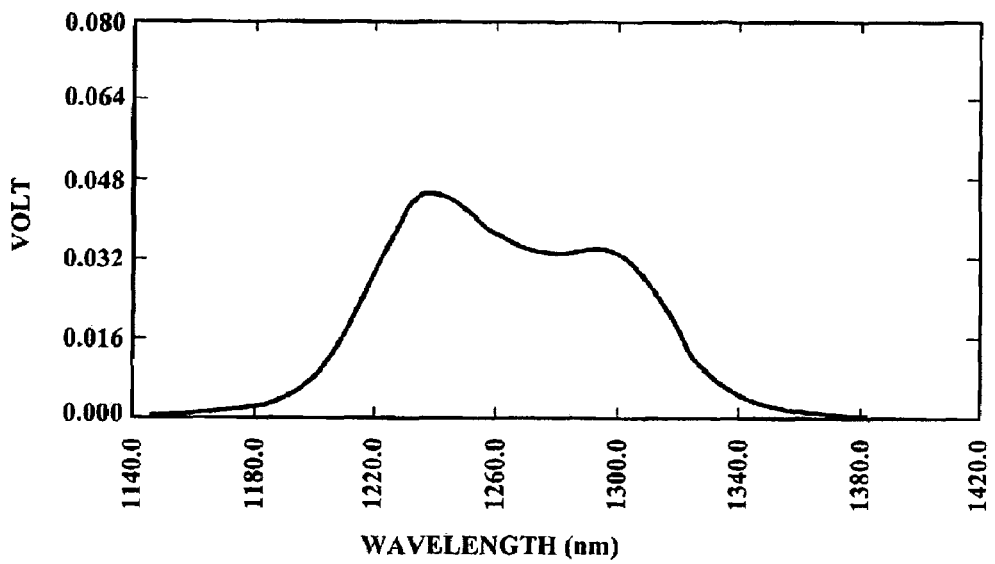
FIG. 20 illustrates a graphical illustration of the output waveform for a quantum well containing nitrogen and experiencing 3-D growth.

Quantum wells containing nitrogen tend to grow in a 3-dimensional fashion. FIG. 19 graphically illustrates the photoluminescence spectrum for a quantum well having nitrogen, but which has not grown in a 3-dimensional fashion. As can be seen from the graph, the quantum well provides an acceptable spectrum with a single narrow peak. Referring to FIG. 20, however, a subsequent sample with the same nominal structure as that shown in FIG. 19 is now shown to be experiencing some 3-D growth, as evidenced by the broad multi-peaked spectrum. Broad double peaks shown in the graph imply quantum dot development or segregation. Quantum wells that contain any amount of nitrogen may experience 3-D growth, thereby causing broadening of the spectrum as well as enabling the formation of quantum dots. By flattening the adjoining surface (e.g., typically the barrier layers) just before the growth of nitrogen containing quantum wells, no seed is provided or made available for 3-D growth within the quantum well layers of a device. Sometimes barrier layers associated with a quantum well will contain nitrogen as well, therefore any non-nitrogen layer should be flattened prior to growth of the nitrogen containing layer—whether the nitrogen-containing layer is a barrier layer or quantum well.

Figure 21:
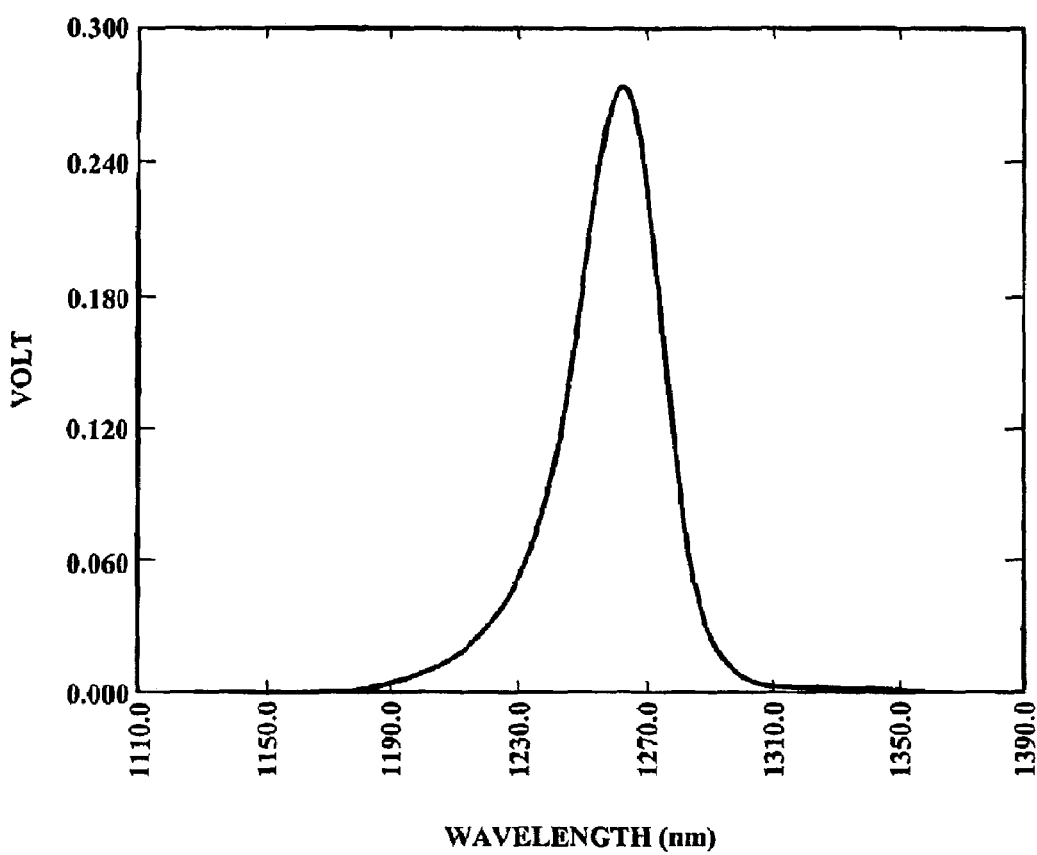
FIG. 21 is a graphical illustration of a desirable photoluminescence spectrum where a device includes nitrogen in its active region.

Migration enhanced epitaxy (MEE) may be provided as a solution for flattening surfaces, and thereby eliminating quantum dot production or other 3-dimensional growth effects. Referring to FIG. 21, a graphical illustration of a more desirable photoluminescence spectrum is shown. Spectral measurements using photoluminescence may be used to reveal the results of a MEE processed device.

MEE may be used to flatten device layers before steps are taken to grow nitrogen containing quantum wells, or associated barrier layer, resulting in desirable long wavelength spectra. In a device that uses nitrogen and any combination of In, Ga, As, Sb and/or P in the quantum wells and/or any combination of In, Ga, As, N, Sb and/or P in the barrier layers, using a flattening layer before the growth of any nitrogen containing layers may be very beneficial. Using MEE, for example, before, and/or after and/or between a nitrogen-containing quantum well may flatten a surface such that there is no seed available for 3-D growth.

The use of MEE for achieving flattening may be performed by alternately depositing single atomic layers of group III constituents and group V constituents. In particular Ga and As work well on a GaAs substrate.

MEE and the use of growth interruptions to flatten surfaces are common epitaxy techniques regularly used in MBE (molecular beam epitaxy), and sometimes in MOCVD (metal-organic chemical vapor disposition) or MOVPE (metal-organic vapor phase epitaxy) processes. MEE is an epitaxy processes. MEE is described here and used for the purpose of controlling the production of semiconductor laser quantum wells containing nitrogen. The use of gate valves is for the purpose of effectively implementing MEE by blocking nitrogen during layer processing using MBE, MOCVD and MOVPE systems.

Quantum wells containing InGaAsN with optional Sb do not exist in equilibrium. Phase segregation may take place as a result where equilibrium is not maintained. To avoid phase segregation within quantum wells, low growth temperatures have been used during processing. Unfortunately low growth temperatures may result in point defects, which can cause poor optical quality in the device. Furthermore, higher growth temperatures may be effectively maintained in InGaAsN quantum wells, and can thus result in high quality optical material if a high flux of As is also used. High As flux may eliminate Group III dangling bonds and also prevent the physical motion of constituents responsible for enabling phase segregation. During the growth of nitrogen containing layers it has been found beneficial to use As fluxes of at least 1.1 e-5 torr beam equivalent pressure. A 2.06e-5 torr beam equivalent pressure may be used. In addition, the use of predominantly $As_4$ vs. $As_2$ has been found to further inhibit 3-dimensional growth.

A monolayer of Ga with no As to stabilize it migrates rapidly and flattens the surface. Reflected high energy electron diffraction (RHEED) measurement may be used to determine the flatness of a surface. A high RHEED oscillation amplitude generally indicates that the surface is flat. Optimum device results may be observed where a maximum RHEED oscillation signal is achieved with a substrate temperature of about 4000° C. during the MEE process.

High flux may be achieved when beam pressure of As is maintained above 1.1e-5 Torr, or about or above 2.06e-5 Torr. This may be a much higher beam equivalent pressure setting than is normally used for such quantum wells. Pressure achieved under these conditions may prevent phase segregation and enable quantum well growth at elevated temperatures at about 400° C. In addition, it may be determined that $As_4$ can be a more advantageous arsenic source than the more commonly used form $As_2$, while enabling the maintenance of acceptable flux guidelines. $As_4$ instead of $As_2$ should be used to achieve high As pressure. Changing the species of arsenic may be as simple as changing the cracker temperature, where about a 900° C. cracker temperature may give predominantly $As_2$, while less than 650° C. may predominantly result in $As_4$.

RHEED measurements made at a substrate temperature of about 400° C. may be used to help develop the process by maximizing the RHEED oscillation amplitude. This resulted in 2 seconds of Ga at 0.5 ml/sec, and 4 seconds of As to recover the surface. Ten (10) molecular layers of GaAs may be used at the beginning of each barrier layer without the introduction of nitrogen, which is possible when a gate valve is used, which can completely eliminate the introduction of nitrogen from the nitrogen source.

Carrier relaxation into typical quantum wells may take a significant length of time (typically about 10 ps, which may be significant for some applications), which can cause high speed devices to be slower than is generally desirable. In addition, carrier leakage past quantum well active regions may be a familiar problem with regard to the resulting efficiency of most quantum well light emitters.

Figure 22:
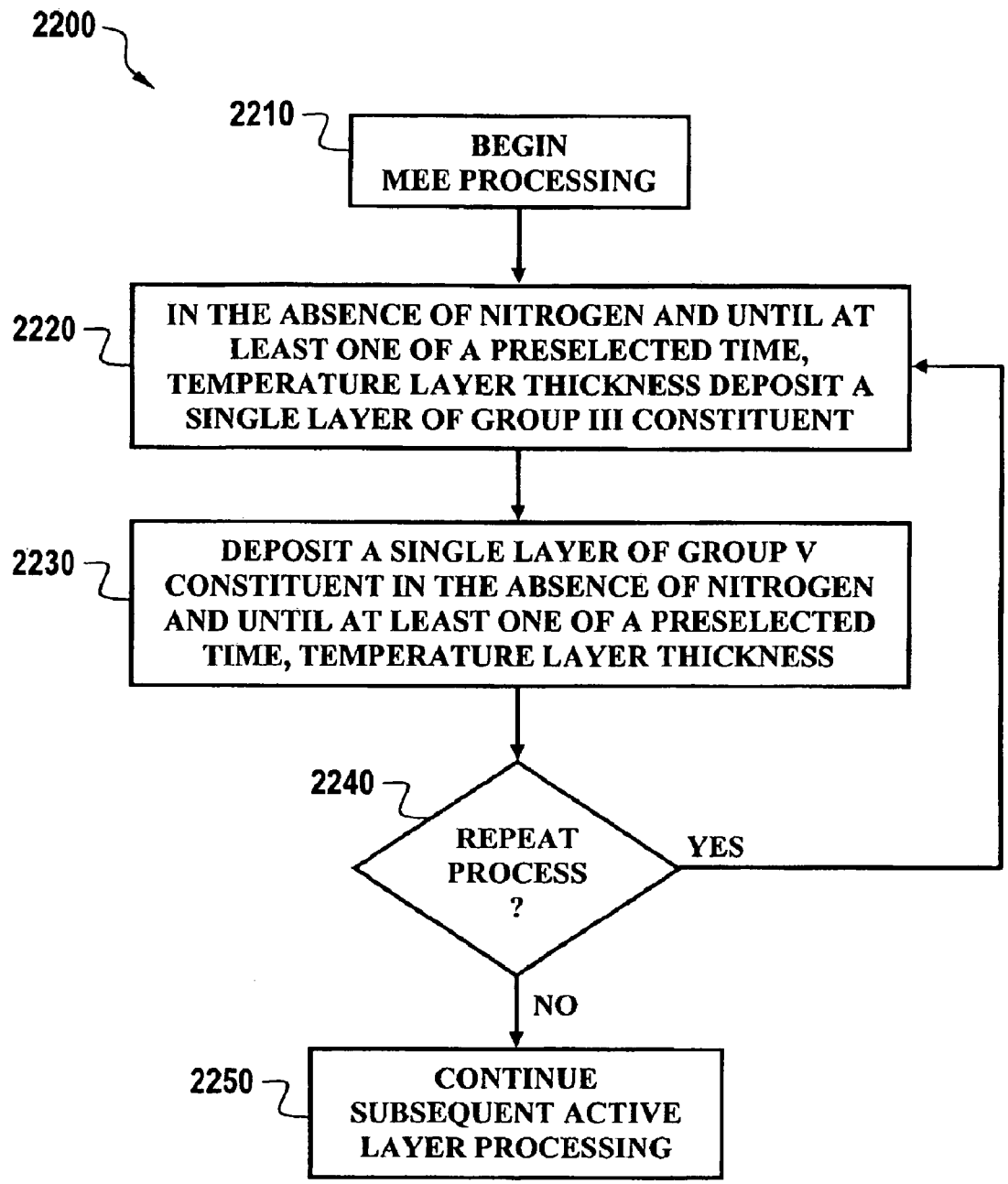
FIG. 22 illustrates a flow diagram of steps that may be taken to fabricate nitrogen containing active regions and achieving layer flattening.

Referring to FIG. 22, a flow diagram is shown 2200 outlining steps that may be taken during device fabrication to achieve layer flattening throughout an active region using MEE processing techniques. Layer flattening within a semiconductor laser active region may occur by alternating the growth of As and Ga, which are referred to herein as an example of material that may be used, but should not be taken to be a limitation of the present invention. MEE processing begins as shown at step 2210. As shown in step 2220, a group III material such as Ga is used during processing of a first layer. During this step of the process, a single layer of a group III constituent may be deposited in the absence of nitrogen and until at least one of a preselected time, temperature, and layer thickness is met. Next, as shown in step 2230, a group V material such as As may be used during processing of a second layer. During this step of the process a single layer of group V constituent may be deposited in the absence of nitrogen and until at least one of a preselected time, temperature, and layer thickness is met. As shown in Step 2240, steps 2220 and 2230 may be repeated until at least one of a preselected time, temperature, or number of alternating layers is achieved. Finally, as shown in step 2250, the process may then be transitioned to subsequent active region/layer processing as shown when the process of steps 2210-2240 is completed.

Non-nitrogen steps of the MEE process may be carried out by alternately opening and closing Ga and As shutters so that they are not both open at the same time, and so that the time the Ga shutter is open deposits 1 atomic layer. In an illustrative example, there may be an opening a 0.5 monolayer per second gallium source for 2 seconds alternating with the As source for 4 seconds. During the time the Ga source is open without As, the Ga atoms may migrate long distances to find steps. This may result in flattening of the surface.

While the Ga shutter is closed and the As shutter is open, the surface becomes arsenic stabilized, and after a waiting period the surface will flatten even further. The growth temperatures, As vapor pressures and sticking coefficients may be such that a substantial excess of As is required.

With nitrogen containing quantum wells that are normally used in MBE, however, it is important to be able to effectively shut off any nitrogen source while attempting to grow a MEE structure. A gate valve was incorporated on the source line leading into an MBE system in order to accomplish complete nitrogen blockage. It was found that shutters are only minimally useful to interrupt the nitrogen.

Figure 23:
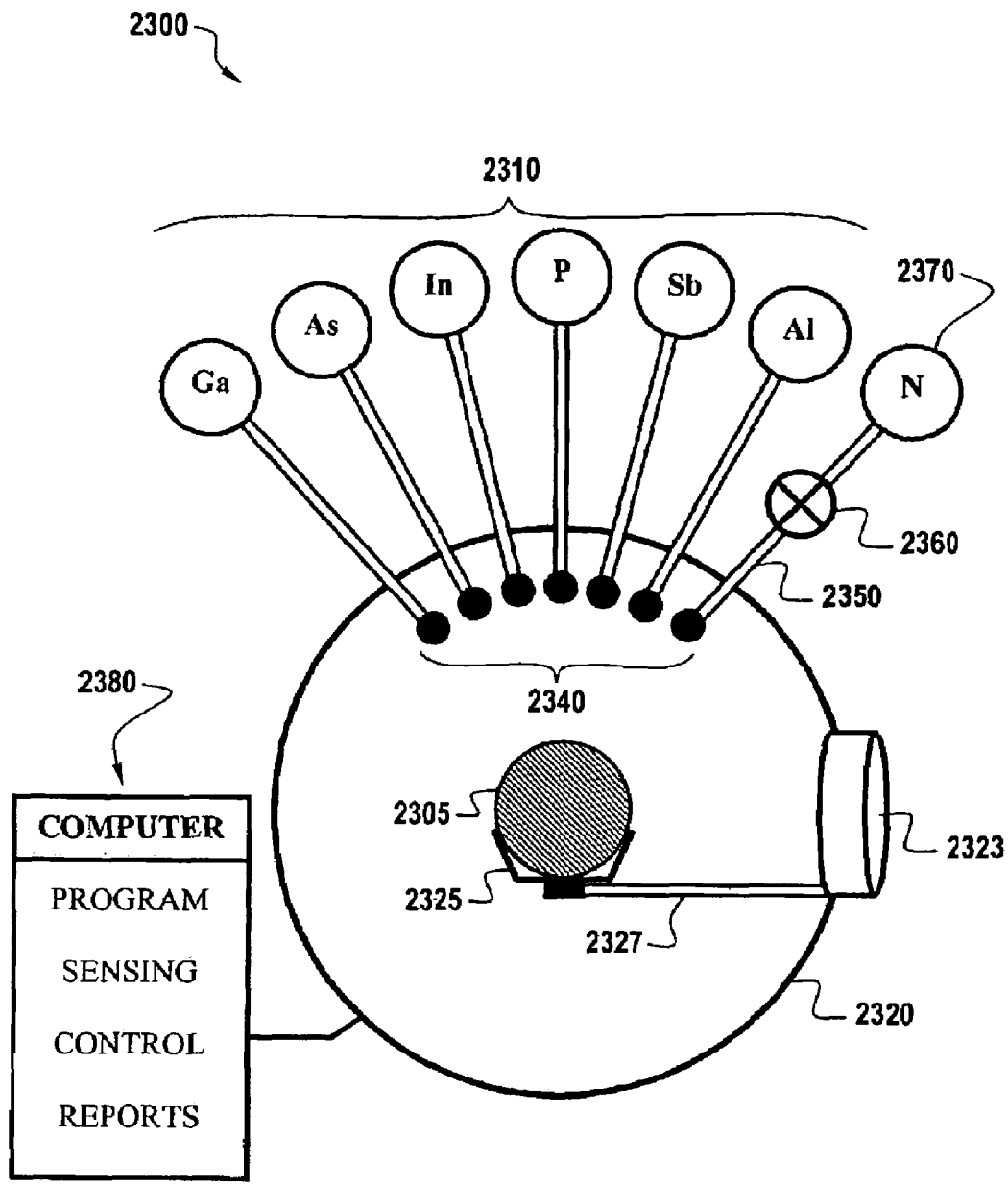
FIG. 23 illustrates a block diagram of a system that may be used to perform fabrication.

Referring to FIG. 23, an MBE system 2300 is illustrated having a semiconductor wafer processing chamber 2320. A typical processing chamber may include a port 2323 where through a semiconductor wafer 2305 can be placed onto a wafer holder 2325. The wafer holder, with wafer, may then be placed into an optimal processing position within the chamber 2320 via a track 2327. Several sources 2310 (e.g., Ga, As, Sb, In, P, N, etc.) may lead into the chamber 2320. Each source 2310 is generally controlled in the chamber with shutters 2340. Unfortunately, use of a shutter has not been effective in blocking nitrogen 2370 for MEE processes. Therefore, a gate valve 2360 may be spliced into the nitrogen source line 2350. The gate valve 2360 may be used to completely cut-off the flow of nitrogen 2370 into the chamber 2320 during non-nitrogen MEE processing steps.

Complete nitrogen cut-off may be achieved with manual (e.g., a human operator), electromechanical and/or microprocessor control of a microprocessor, or operator (not shown). A microprocessor-based system 2380 will commonly be used with the processing hardware (e.g., chamber, shutters, gate valves, and so forth) for executing programmed processing instructions (e.g., software programs), collect measured data from measurement transducers (not shown), provide and maintain processing control, report making and formation, and data/software storage.

Figure 24:
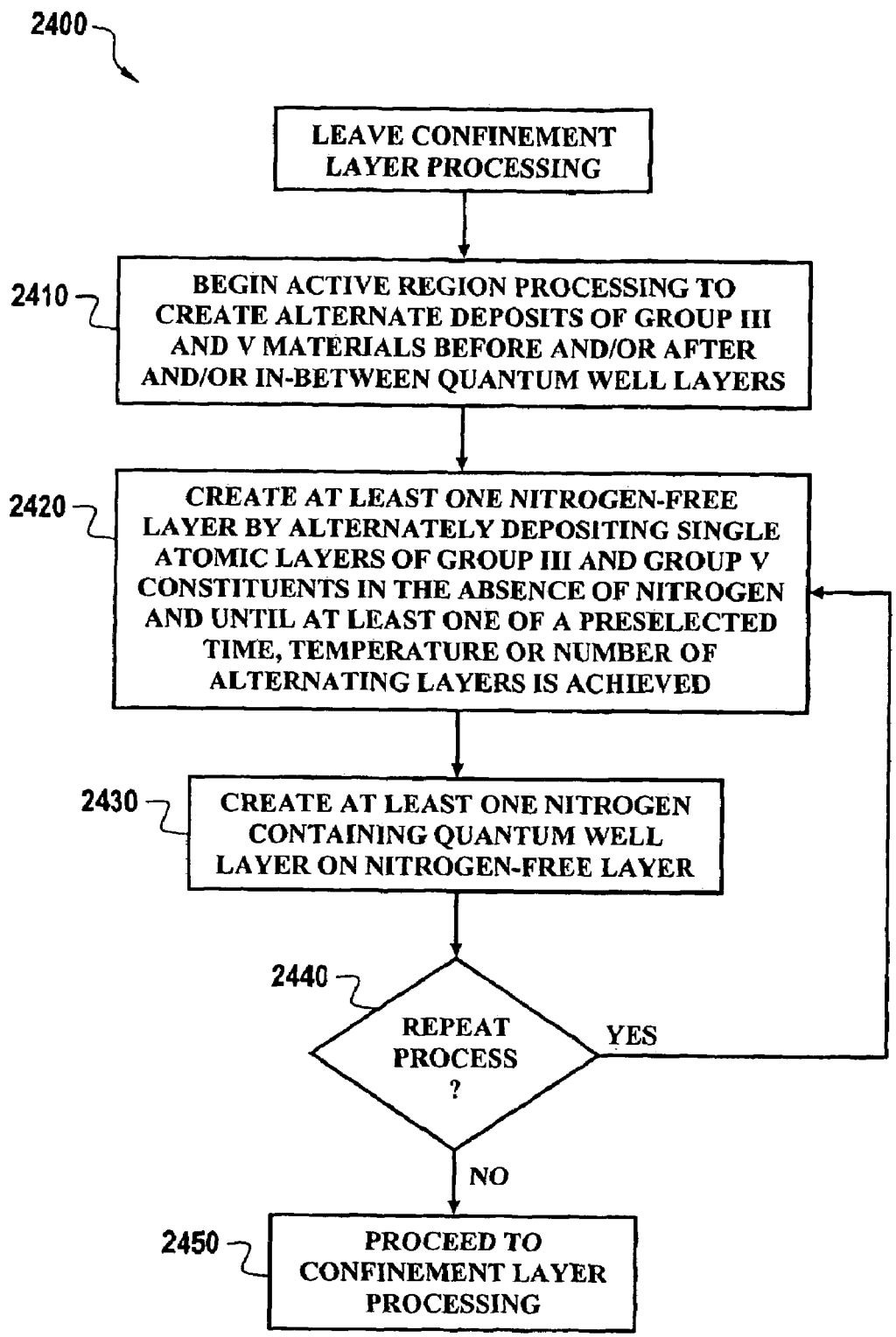
FIG. 24 is an illustration of a flow diagram of steps that may be taken during semiconductor laser wafer fabrication to make an active region while maintaining flattening of layers within active regions.

Referring to FIG. 24, a flow diagram 2400 illustrates steps that may be taken during semiconductor laser wafer fabrication to make an active region while maintaining flattening of layers within the active region, thus producing higher performance quantum wells than have been heretofore provided. Layer flattening may occur by alternating the growth of group III and V materials. The process may begin as shown at block 2410 after a formation of a confinement layer that typically precedes the active region. As shown in step 2420, at least one nitrogen-free layer by alternately depositing single atomic layers of group III and group V constituents and until at least one of a preselected time, temperature and number of alternating layers is achieved. Processing for step 2420 may be carried out using the process steps shown in FIG. 22. Next, as shown in step 2430, at least one nitrogen-containing layer may be formed on the nitrogen-free layer resulting from step 2420. The nitrogen containing layer produced in step 2430 may typically result in a quantum well or barrier layer that can include GaAs and one or more of antimony, indium and phosphorous. Then as shown in Step 2440, steps 2420 and 2430 may be repeated until a preselected time or a desired number of alternating layers are achieved. Once the process of making an active region is completed, which is generally once a device with the desired number of quantum wells is rendered from the process, the process may transition to subsequent device processing steps as shown in step 2450.

Figure 25:
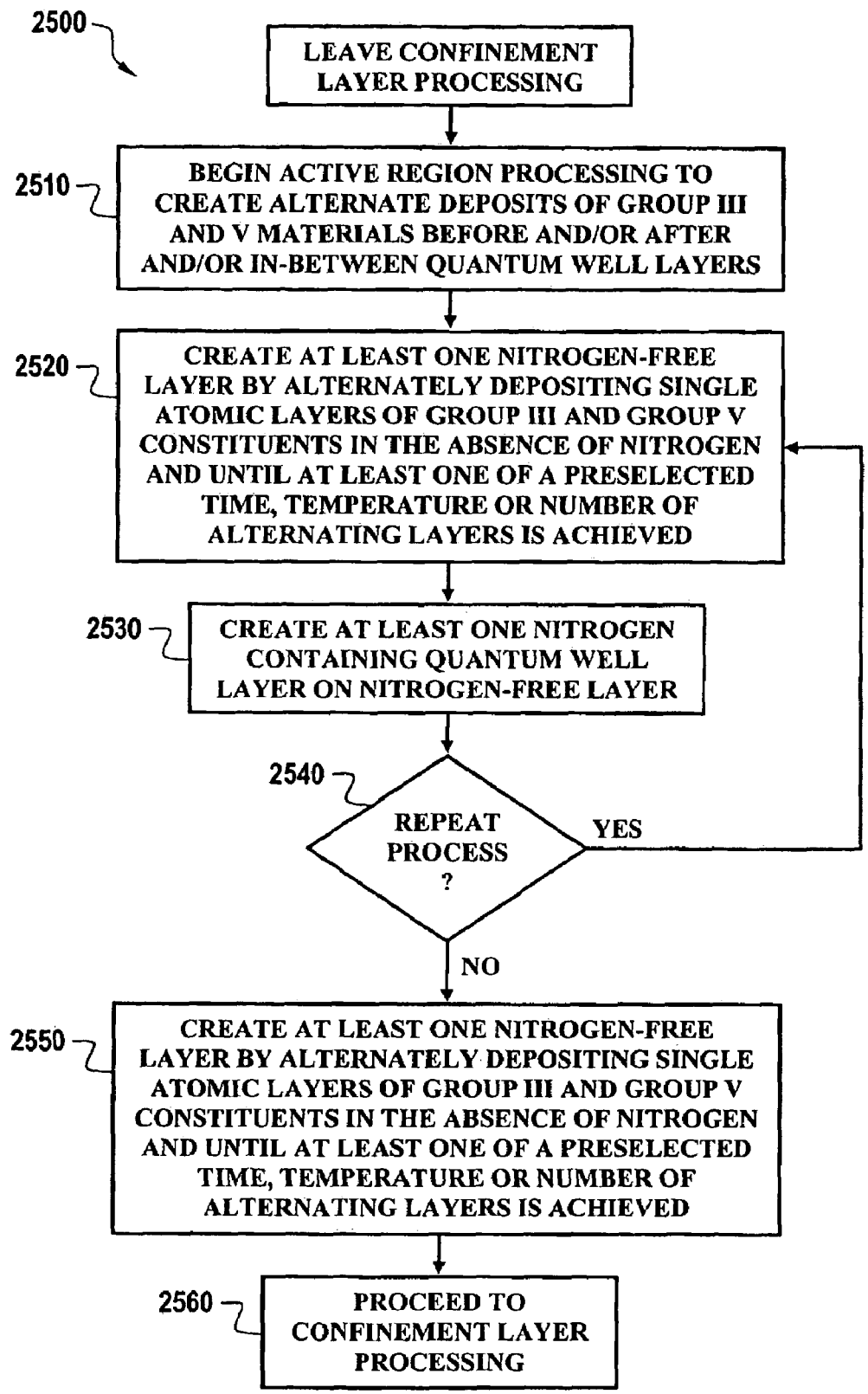
FIG. 25 is an illustration of another flow diagram of steps that may be taken during semiconductor laser wafer fabrication to make an active region while maintaining flattening of layers within the active region.

Referring to FIG. 25, a process 2500 similar to that shown in FIG. 24 is shown. The steps shown in FIG. 24 are changed as shown in FIG. 25 so that once steps 2510, 2520, 2530 and 2540 are completed, a nitrogen-free layer is made in Step 2550. The layer made in Step 2550 may be similar to that made in Step 2420. Once the process of making an active region is completed, which is generally once a device with the desired number of quantum wells is rendered from the process, the process may transition to subsequent device processing steps as shown in step 2560. It should be noted that diffusion will occur in most epi processes such that some nitrogen will be included in the initially nitrogen free layer. Perhaps, one aspect of flattening is that the layer is substantially nitrogen free when it is grown. It should also be pointed out that other flattening techniques may be used, but with any of these techniques, a nitrogen free layer should be used for flattening.

In addition to achieving layer flattening, it has also been discovered that the shape(s) of the quantum wells may further enhance the devices ability to capture electrons and holes, thereby improving the overall efficiency of the semiconductor laser device. Improved barrier layer and quantum well designs have been developed that may improve quantum well carrier confinement. Furthermore, the improved designs may enable carrier injection at lower energies, which can result in reduced relaxation time.

Figure 26:
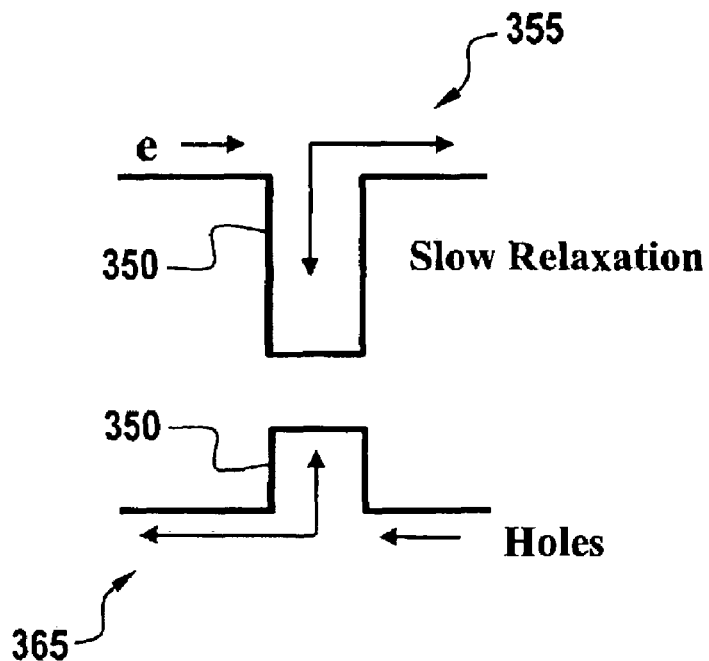
FIG. 26 is a diagram illustrating common electron and hole leakage problems experienced within active regions in most high speed optoelectronic light emitters.

As shown in FIG. 26, common problems experienced within active regions in most high speed optoelectronic light emitters are with electron leakage 355 and hole leakage 365. With electron leakage 355, some electrons "e" entering the active layer tend to migrate past the quantum well 350 and recombine outside the quantum wells so that the recombination energy is useless to promote lasing. As with electron leakage 365, some "holes" moving in the device, opposite the active region, may tend to migrate past the quantum well to recombine outside the quantum well 360, which may be referred to as hole leakage 365.

Figure 27:
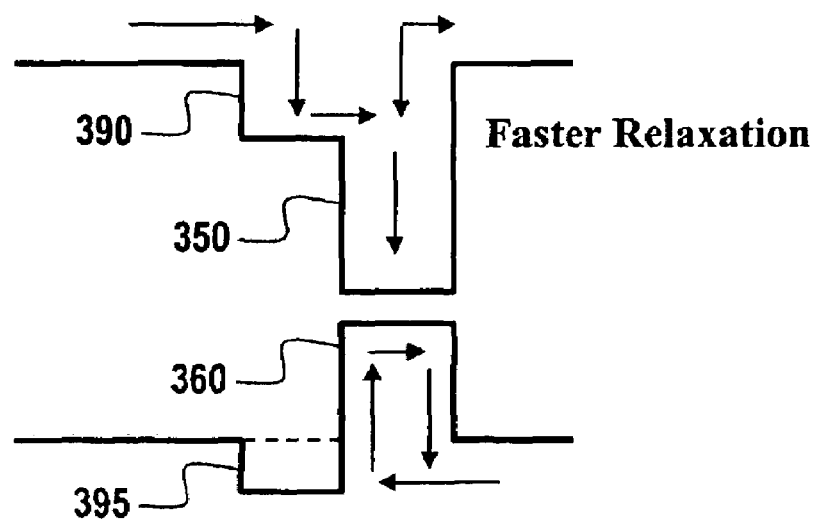
FIG. 27 is a diagram illustrating how a reduction in part of the barrier layer edge within the conduction band on the input side of the quantum well may increase the probability that electrons can be captured and/or retained within the quantum well.

During normal operation, thermal energy generally spreads the population of electrons above the conduction band where collisions with phonons must occur for the electron energy to be reduced such that it may fall into a quantum well. Referring to FIG. 27, a reduction in part of the barrier layer edge 390 within the conduction band on the input side of the quantum well may improve the probability that electrons can be captured and/or retained within the quantum well 350. In addition, a reduced energy may now be expected from phonon collision, thereby reducing phonon collision time, reducing the time it takes the carrier to relax into the well and making the device faster. A similar benefit may be found with regard to holes under the valence band edge wherein a portion of the barrier layer 395 that is associated with the reduced barrier layer edge 390 is extended resulting in an enhanced barrier for capturing holes. The example herein with respect to FIG. 27 modifies the barrier layers within the active region of a laser device, resulting in what may be referred to as a two-layer barrier system.

Figure 28:
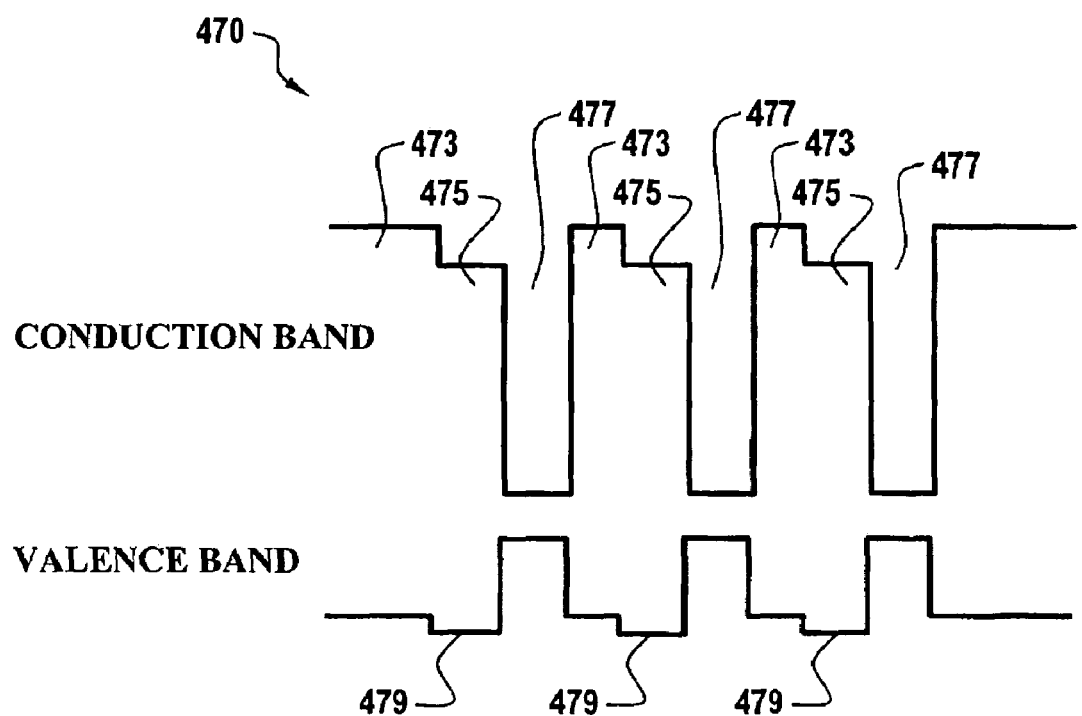
FIG. 28 is a diagram illustrating a three-well device that may be processed to provide the benefits shown in FIG. 27.

FIG. 28 illustrates an example of a three-well device 470 that may be processed to provide the benefits described in FIG. 27. In an example two-layer barrier system, a GaAsN layer 475 may be grown next to a GaAs layer 473, and together the combined layers may perform enhanced barrier layer functions in the place of single barrier layers that are normally deployed on either and/or both side(s) of quantum wells 477. GaAs provides a wider gap barrier layer portion 473, of the barrier layer system while GaAsN, which possesses a reverse offset in the valence band when exposed to increasing amounts of nitrogen, may be used for the narrower energy band gap portion 475 of the barrier layer. The use of GaAsN in narrow gap portion 475 may also cause a reverse offset in the valence band offset enhancing the hole blocking ability of barrier sections 479. Finally, InGaAsN, for example, may be used as material for developing the quantum wells 477. A system developed with the above-described materials may provide enhanced electron and/or hole capture in both the conduction and valence bands, respectively. It should be appreciated that other combinations of materials may be used for developing a device providing the phenomenon and benefits as described.

Figure 29:
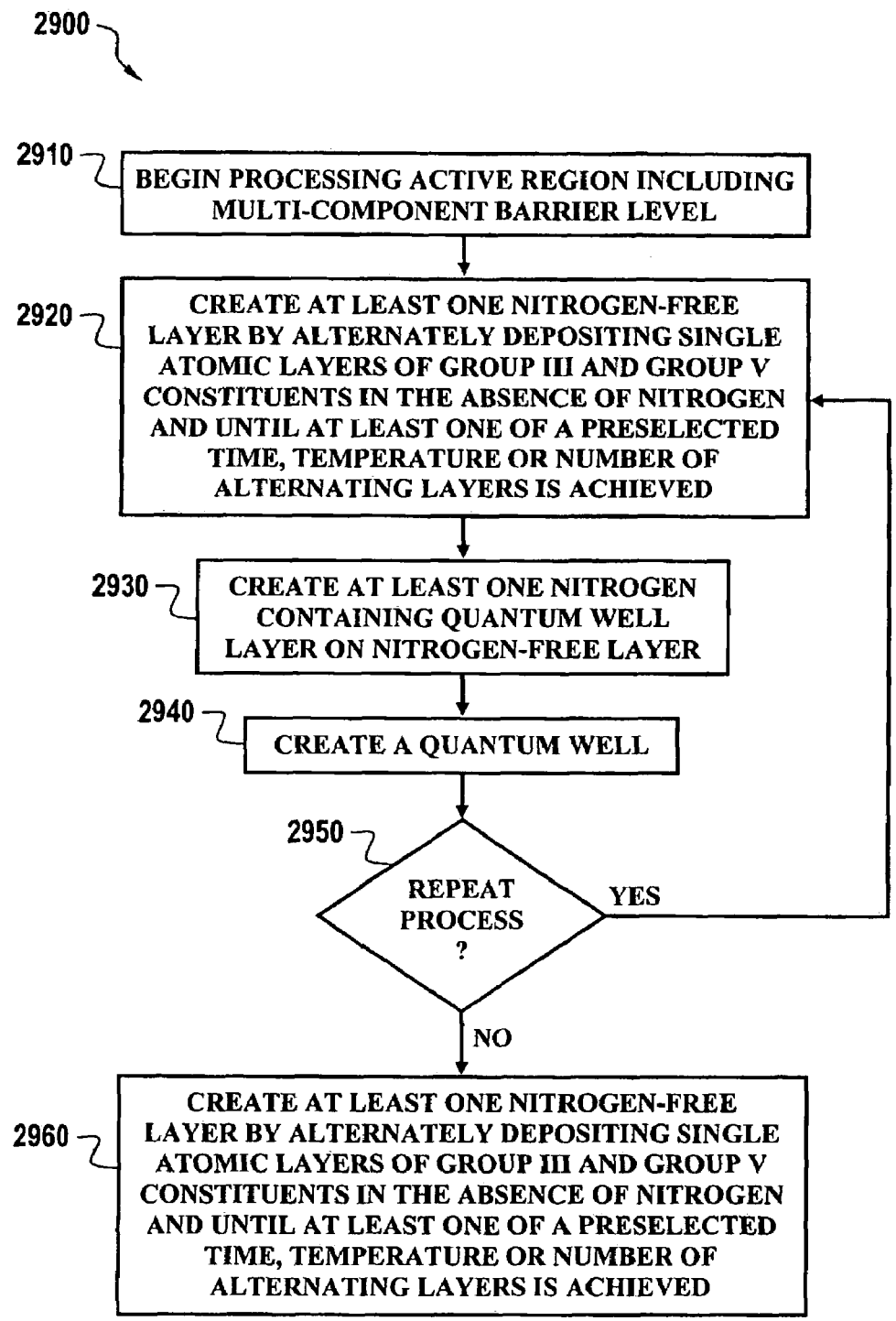
FIG. 29 illustrates a flow diagram showing process steps that may be taken to produce a two-layer barrier system as shown in FIG. 28.

Referring to FIG. 29, a flow diagram 2900 illustrates steps that may be taken to produce a two-layer barrier system as shown in FIG. 28. The process of producing an active region having a multi-component barrier layer may begin as shown in step 2910. As shown in step 2920, at least one nitrogen-free layer may be made by alternately depositing single atomic layers of group III and group V constituents in the absence of nitrogen and until at least one of a pre-selected time, temperature and/or number of alternating layers is achieved. Then, as shown in step 2930, at least one nitrogen-containing quantum well layer may be formed on the nitrogen-free layer. The same materials and process described and shown in step 2920 may be combined with nitrogen to make the layer in step 2930. As shown in step 2940, a quantum well may be made. The quantum well may also contain nitrogen. As shown in step 2950, a decision may be made to repeat steps 2920, 2930 and 2940 where more quantum wells are desired for the active region. Once a desired number of wells has been made, the process may end as shown in step 2960 by making at least one nitrogen-free layer by alternately depositing single atomic layers of group III and group V constituents in the absence of nitrogen and until at least one of a pre-selected time, temperature or number of alternating layers is achieved.

Figure 30:
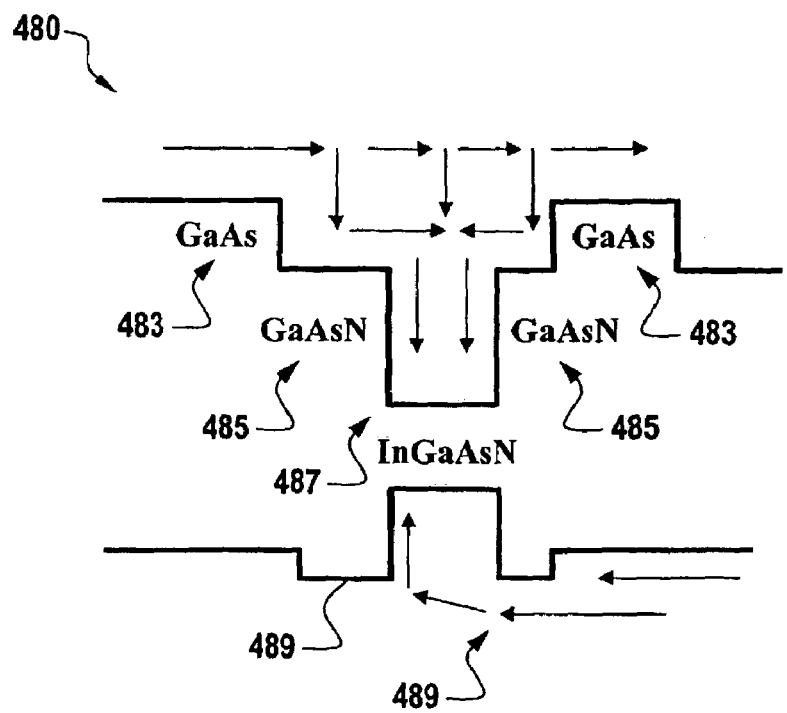
FIG. 30 illustrates a multi-layer barrier system where a semi-conducting laser device may include a three-layer barrier system that uses GaAsN layers deployed or disposed directly on both sides of the quantum wells, and further including a GaAs layer deployed between GaAsN layers.

Referring to FIG. 30, another approach for providing a multi-layer barrier system is illustrated. As shown in FIG. 30, a semi-conducting laser device 480 may include a three-layer barrier system that uses GaAsN layers 485 deployed or disposed directly on both sides of the quantum wells 487, and further including a GaAs layer 483 deployed between GaAsN layers 485. Also shown in FIG. 30 is a definition of a quantum well as a result of the barrier layer configuration. An adjustment to barrier sections 489 associated with the nitrogen containing barrier layer sections is shown. There is still adequate hole confinement with a three-layer system design.

Figure 31:
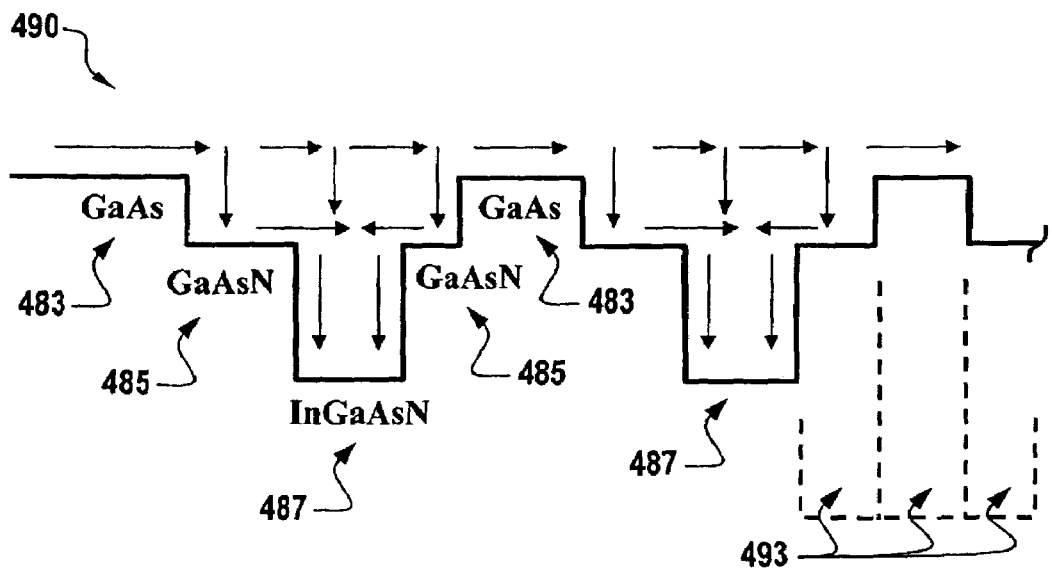
FIG. 31 illustrates a multi-layer barrier system with an active region having more than one quantum well.

Referring to FIG. 31, a multi-layer barrier system 490 having more than one quantum well 487 is illustrated. The multi quantum well device is configured similar to the device shown in FIG. 30. Also shown in FIG. 31 and represented by dashed lines are phantom lines 493 of the layers associated with the two-layer and three-layer components that may make up a multi-layer barrier system.

Figure 32:
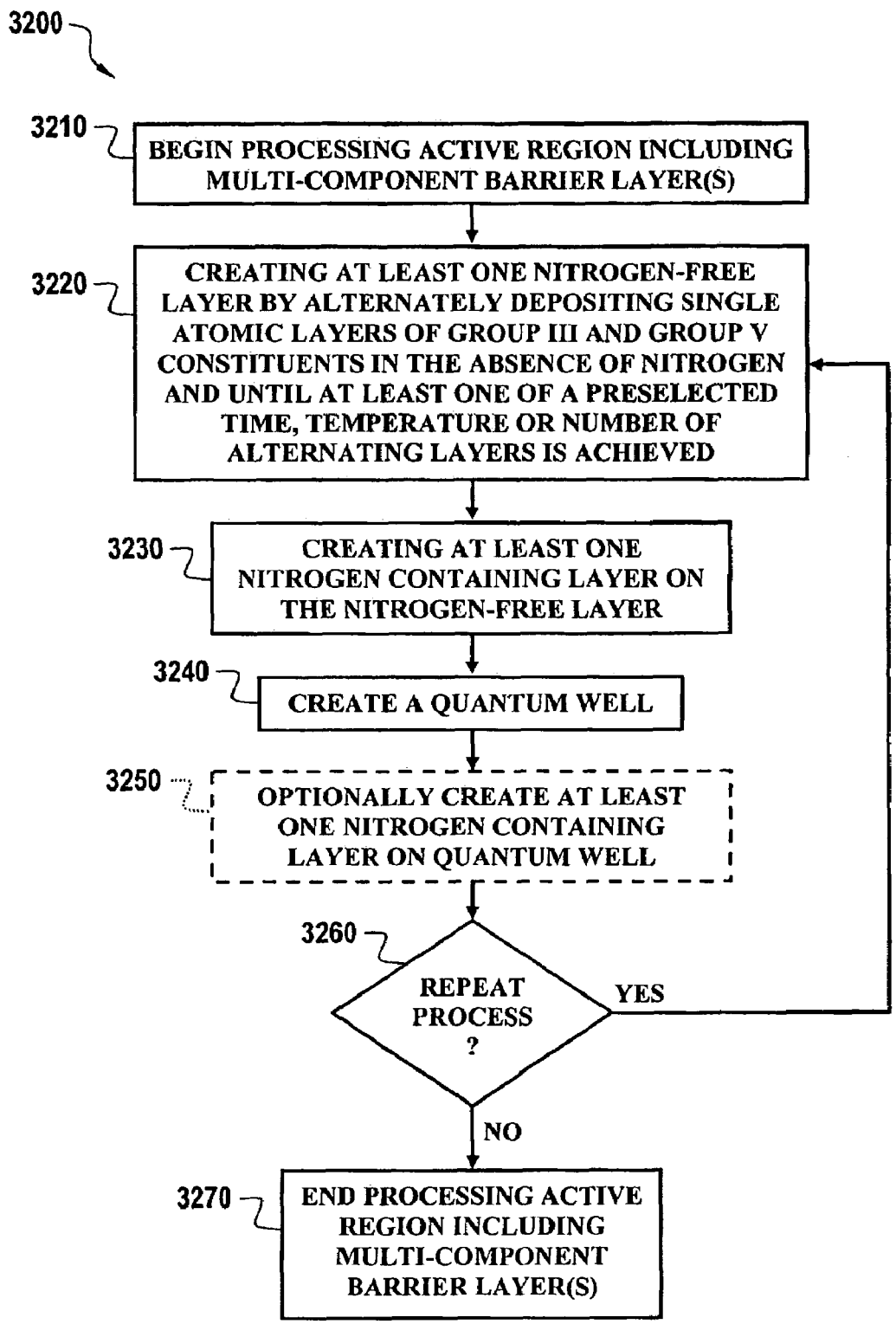
FIG. 32 illustrates a flow diagram of process steps associated with making multi-component barrier layers.

Referring to FIG. 32, a flow diagram 3200 illustrates the process steps associated with making multi-component barrier layers. The process may begin as shown in step 3210. At step 3220, at least one nitrogen-free layer may be made by alternately depositing single atomic layers of group III and group V constituents in the absence of nitrogen and until at least one of a pre-selected time, temperature or number of alternating layers is achieved. Then as shown in step 3230, at least one nitrogen-containing layer may be made on the nitrogen-free layer. The same materials and process described and shown in step 3220 may be combined with nitrogen to make the layer in step 3230. Then as shown in step 3240, a quantum well may be made. The quantum well may also contain nitrogen. As shown in step 3250, at least one nitrogen-containing layer may optionally be made on quantum well layer provided in step 3240. This will provide the effect shown with layer 485 in FIG. 30. As shown in step 3260, a decision may be made to repeat steps 3220, 3230, 3240 and 3250 where more quantum wells may be desired for the particular active region being processed. Once a desired number of wells have been made, the process may end as shown in step 3270.

In addition to the reduction in carrier leakage and the improved speed benefits that may be experienced with the new two- and three-layer barrier system design, it may be appreciated that GaAsN use in barrier layers may also provide strain compensation. Also, even if such a design was only implemented within the conduction band, which is notorious for leakage and speed deficiencies, the operation of the device should be enhanced from realizing most of the discussed benefits. It should also be appreciated that MEE may be used during development of a device including a two-layer barrier system. Furthermore, although the barrier layer design described herein may enhance electron capture for semiconductor lasers with wavelengths longer than 1200 nm, it should be appreciated that such a design may also be useful for semiconductor lasers less than the 1200 nm range (e.g., such as 850 nm VCSELs) or other light emitting devices such as LED's.

Figure 33:
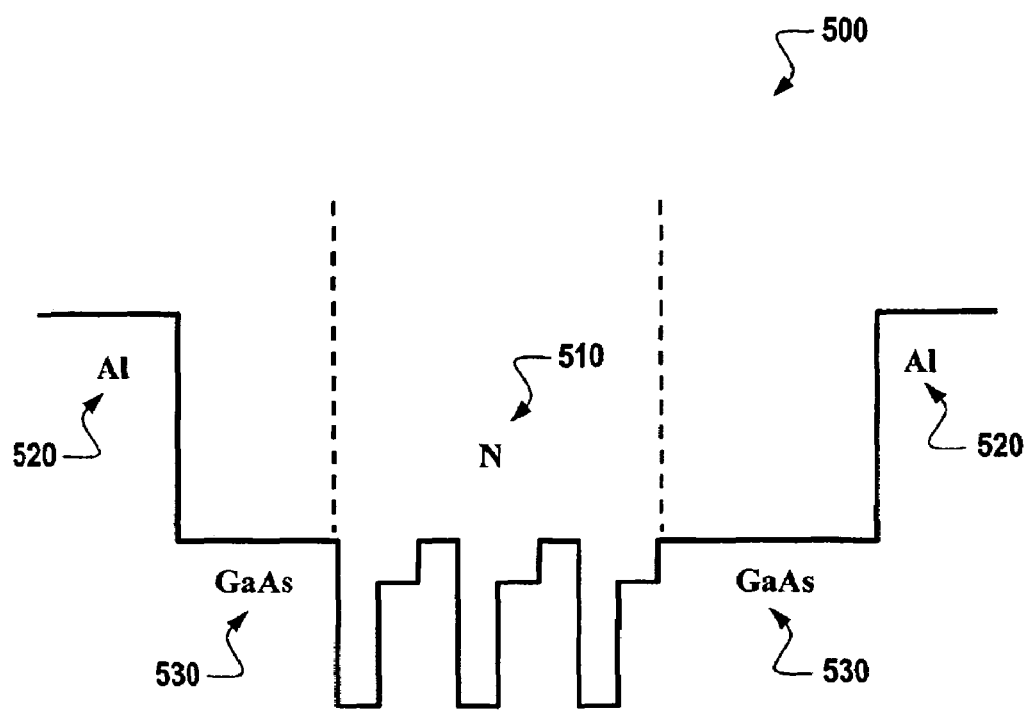
FIG. 33 illustrates another example of the use of AlGaAs confining layers in devices where active regions contain nitrogen.

Referring to FIG. 33, a device 500 may enable the use of AlGaAs confining layers 520 in devices where active regions 510 contain nitrogen. Active regions 510 in light emitting devices containing nitrogen such as InGaAsNSb or InGaAsN might not necessarily be made successfully using AlGaAs confining layers 520. The problem with such devices is that Al-nitrogen pairing may produce deep traps, a phenomenon, which enhances non-radiative recombination. As described above with regard to MEE and FIG. 23, by using a positive shutoff (gate valve) on nitrogen sources leading into processing equipment, and by placing the beginning of the confining layers outside the nitrogen-containing region and separating the two areas with an outer, or extended, barrier layer 530 formed of GaAs, a device using Al and nitrogen may be developed and used. Because the optimal temperature for growing AlGaAs is much higher than for the quantum wells containing nitrogen or Sb, a growth interruption to allow time for the temperature change is optimally performed during the growth of the extended barrier layer.

As with MEE, a gate valve or some other positive shutoff may be used for the nitrogen to completely prevent its introduction in the chamber with Al during device processing procedures using MBE or other processing techniques such as MOCVD.

Introduction of an "extended barrier layer" 530 just outside of the active region that does not contain Al or nitrogen should be grown to compensate for the diffusion of nitrogen during subsequent growth or processing. The nitrogen should not be allowed to diffuse into the Al containing layers. SIMs (secondary ion mass spectroscopy) provides a convenient method to determine how far the nitrogen diffuses.

Figure 34:
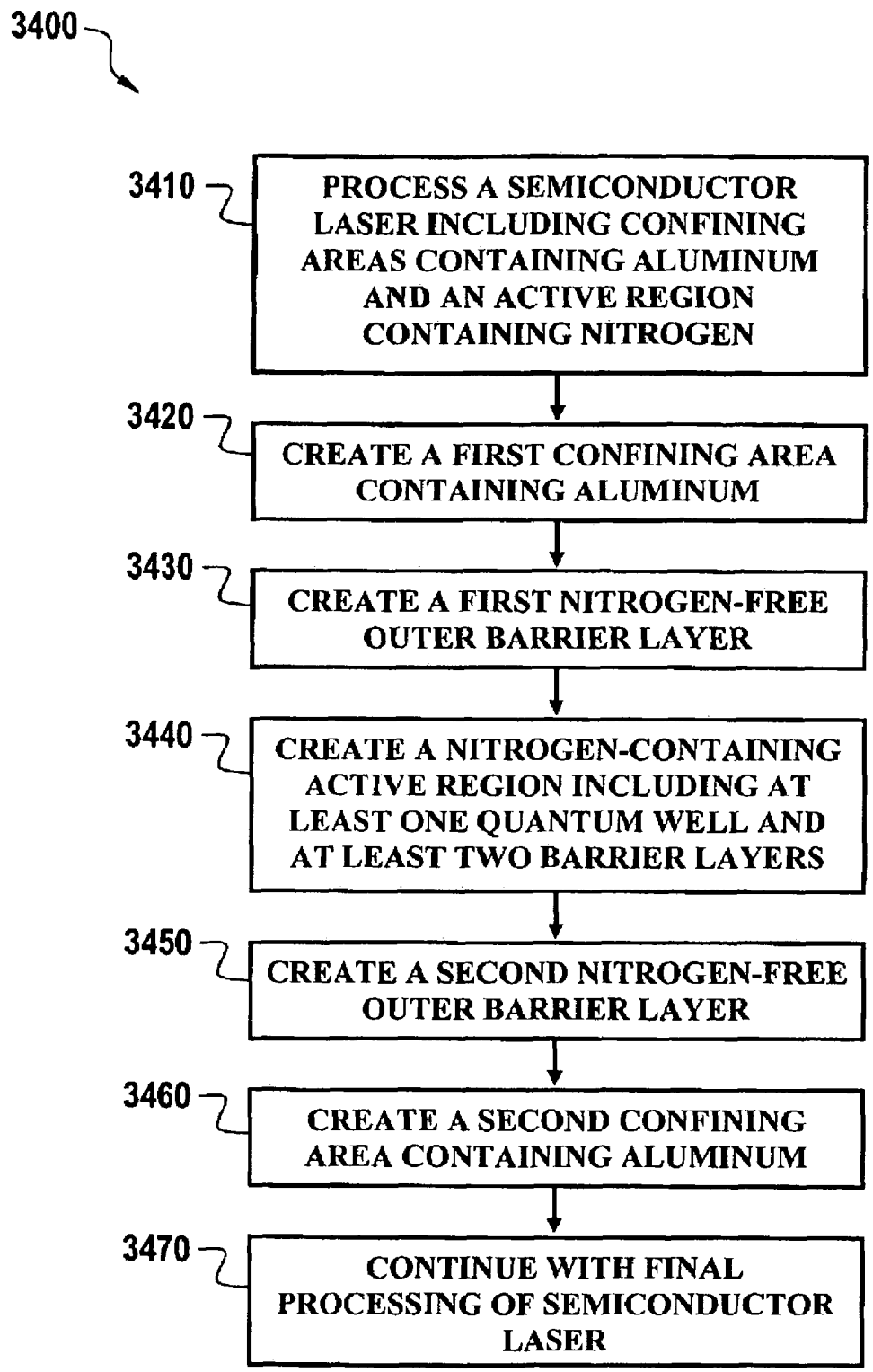
FIG. 34 illustrates process steps for making a device in accordance with the layers illustrated in FIG. 33.

Referring to FIG. 34, a flow diagram of process 3400 illustrating process steps for making a device having extended barrier layers between Al containing layers is shown. The process of developing a semiconductor laser that includes confining areas containing aluminum disposed outside active regions containing nitrogen starts at block 3410. In step 3420, a first confinement area containing Al is formed prior to forming an active region. Next, at step 3430 a first nitrogen-free outer barrier layer is formed. The nitrogen-free outer barrier layer may be considered as associated with either the confinement area or active region, or unassociated, while maintaining the benefit of its Al—N barrier function. As shown in step 3440, a nitrogen-containing active region including at least one quantum well and at least two barrier layers associated with the at least one quantum well may be formed. After the making of the active region in step 3440, a second nitrogen-free outer barrier layer may be formed as shown in step 3450. Next, at step 3460 the second confining area containing Al may be formed outside the active region, but after the nitrogen free outer barrier formed in step 3450. Device fabrication and completion steps may then be continued in step 3470.

Figure 35:
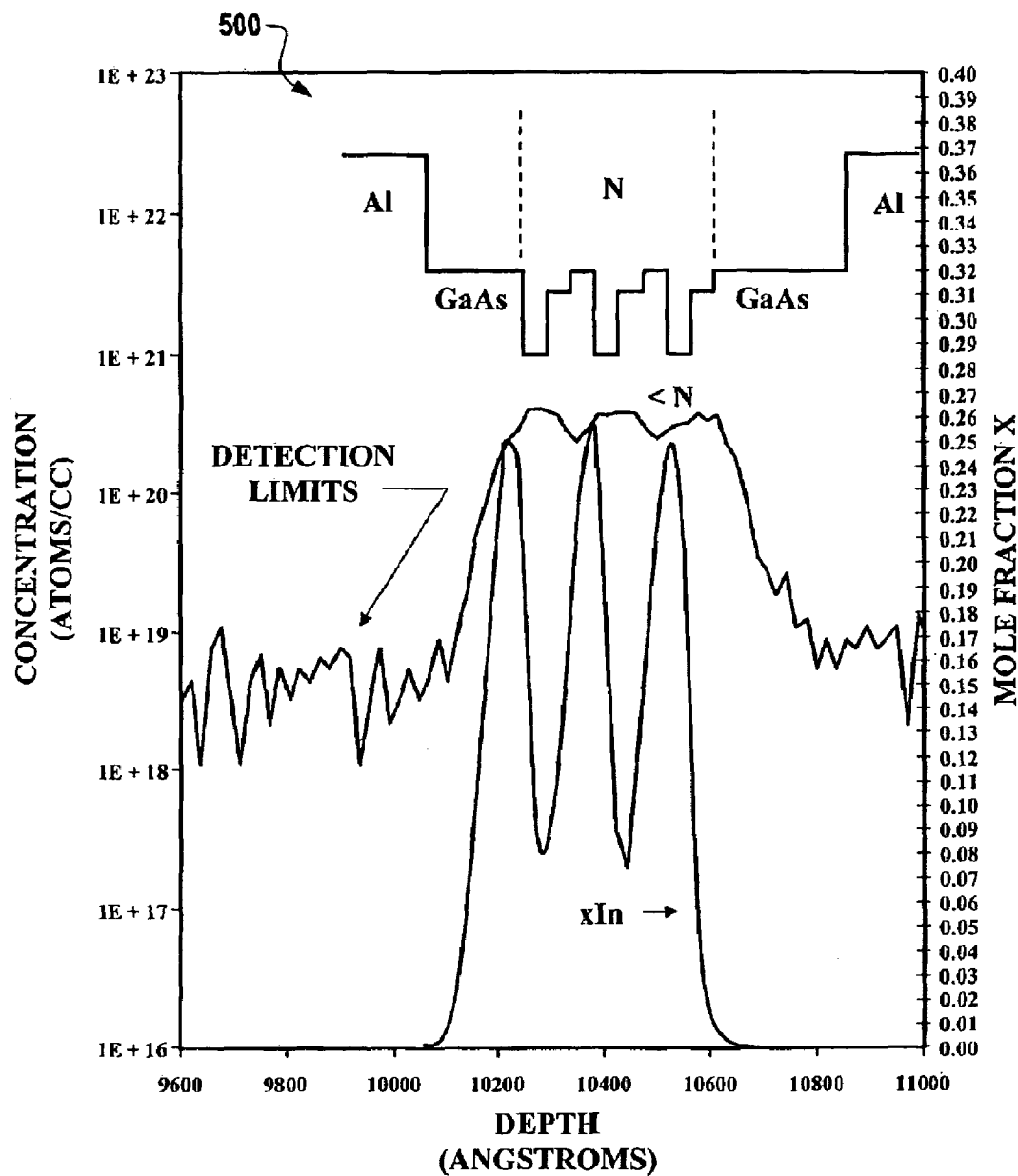
FIG. 35 is a graphical illustration of waveform associated with use of a device as illustrated in FIG. 33.

Referring to FIG. 35, an extended barrier enhanced device 500 is shown with the nitrogen profile, the drawing of the conduction band edge, and the indium. The graph is a close representation of the behavior of a device such as the device illustrated in FIG. 33, shown transposed on the graph. The AlGaAs material does not overlap the nitrogen profile, except where it is at the background level of the SIMs instrument. In actual devices, a separation between the materials intentionally containing nitrogen and Al of from 128 to 200 A has been used.

A 1.3 micron wavelength VCSEL may be manufactured utilizing quantum wells of InGaAsN, or other semiconductor compounds, with gallium arsenide, or GaAsN mechanical stabilization layers in order to keep the semiconductor layers thin enough to maintain mechanical strain while utilizing common AlGaAs mirror structures.

In the present invention, MEE may be used in low temperature grown layers adjacent to an InGaAsN(Sb) based active region. Some background on MEE may be found in the literature on related topics. Example references may include "Ultrahigh Vacuum Atomic Layer Epitaxy of Ternary II-VI Semiconductor Compounds," by M. A. Herman and J. T. Sadowski, in *Cryst. Res. Technol.*, 34 (1999) 2, 153-162, and *Molecular Beam Epitaxy—Fundamentals and Current Status*, by M. A. Herman and H. Sitter, 2nd ed., Springer, Berlin (1996).

Ultrahigh vacuum atomic layer epitaxy (UHV ALE) or atomic layer scale growth in ultrahigh vacuum may be increasingly important in the realization of multilayer and low-dimensional semiconductor structures, e.g., quantum wells. The basic idea behind atomic-layer controlled epitaxy (ALCE) may be to ensure a surface-controlled growth instead of the source-controlled growth used, e.g., in conventional MBE.

In ALCE, it may be a question of material growth instead of material transfer. The first realization of ALCE apparently was accomplished by atomic layer epitaxy (ALE) of CdTe. The ALE process may be carried out step-wise by separate surface reactions, each forming one atomic layer only. ALE may be based on chemical reactions at the heated surface of a solid substrate, to which the constituent elements of a compound to be grown, are transported sequentially as pulses of neutral molecules or atoms. A characteristic delay time, so-called "dead time", may be introduced in ALE growth between sequential pulses of the reactant species. During this time, the deposition process may be interrupted to enable the free re-evaporation of these atoms of the deposited species, which are in excess to the chemisorbed monolayer and, therefore, only weakly bound to the substrate surface. The ALE mode of thin film crystallization may be realized in chemical vapor deposition (CVD), in high vacuum gas source MBE, and in conventional UHV MBE processes. The latter case may be called UHV ALE. The UHV ALE growth process may occur on the heated substrate surface which faces originally the ultrahigh vacuum environment. As seen by an approaching particle, (atom or molecule), the substrate surface suitably prepared for the film growth is not necessarily neutral and thus may cause some distance-dependent interaction described by a relevant interaction energy. This interaction may result in an accumulation at the solid surface of atoms or molecules of the impinging beams, which become absorbed there. The use of growth mechanisms in UHV ALE may lead to the conclusion that near the substrate surface at least two different areas may be distinguished.

The first area may be of chemisorption, which is located nearest to the substrate surface, and the second may be the area of physisorption. In both of these areas, lateral migration and other surface kinetic effects may occur. Accordingly, the epitaxial growth may proceed in UHV ALE via two steps, referred to a precursor state and a crystallization state. The first state may involve fast surface migration, reevaporation and chemisorption, while the second state may involve low surface migration and a partial reevaporation of the first, chemisorbed monolayer. A slight modification of UHV ALE, in which no dead time in the deposition has been introduced, may be used for low-temperature growth of GaAs and GaAs—AlAs quantum well structures. This modification may be regarded as migration enhanced epitaxy (MEE).

In MEE growth, an interruption of the arsenic supply to the growing surface during the Ga or Al supply period may be essential to the surface migration enhancement of the surface atoms. Therefore, Ga or Al atoms and arsenic may be alternately supplied to the GaAs (001) surface to obtain metal-stabilized surfaces periodically. The typical switching behavior of $As_4$ and Ga beam intensity measured by an ionization gauge placed at the substrate holder position is shown in FIG. 36. Beam intensity change is shown for Ga and $As_4$ species caused by a shutter operation characteristic of MEE. The Ga response was measured under As-free conditions. Bearing in mind the response time of the ionization gauge amplifier, the observed response may indicate that the beam intensities change very quickly following the shutter operation. The growth process was monitored by observing reflection high energy electron diffraction (RHEED) specular beam intensity oscillations, where the 12 keV electron was used in the [100] azimuth.

It may be noted that in MEE, growth may proceed in a layer-by-layer manner. To substantiate this effect, a RHEED specular beam intensity may be recorded during the growth of GaAs at 580° C. FIGS. 37a and 37b compare the MEE results with those of normal MBE growth. The RHEED specular beam intensity oscillation during the growth of GaAs for normal MBE growth is shown in FIG. 37a and for the MEE growth in FIG. 37b. In both cases, beam flux intensities of Ga and $As_4$ were $J_{Ga}=6 \times 10e14$ $cm^{-2}s^{-1}$ and $J_{As}=4 \times 10e14$ $cm^{-2}s^{-1}$, respectively. In normal MBE growth, the RHEED oscillations may nearly completely disappear after about 20 periods because the surface flatness on the atomic scale deteriorates. In contrast, the oscillations may continue during the entire layer growth process when the MEE method is applied. This result tends to indicate that a better surface flatness is maintained during the MEE growth even after the growth of thousands of layers. This may likely be caused by the rapid migration of Ga in a very low arsenic pressure.

The amplitude of RHEED oscillation in MEE may be closely related to the amount of Ga supplied to the growing surface per unit cycle, i.e., the amplitude is maximum when the number of Ga atoms per cycle is equal to the number of surface sites. This finding appears consistent with a 1 ML coverage criterion found in a UHV ALE of CdTe.

FIGS. 38a, 38b and 38c show the RHEED intensity recovery at 580° C. after reopening a As cell shutter as a function of the amount of Ga. These figures show the recovery characteristic of the RHEED specular beam intensity as a function of the number of surface Ga atoms. FIG. 38a shows the shutter operation sequence. FIG. 38b shows the corresponding RHEED intensity change, and FIG. 38c shows the recovery as a function of the number Ga atoms. The experimental shutter sequence is given in FIG. 38a. After the surface is annealed in an As beam, the As cell shutter may be closed and the Ga cell shutter opened simultaneously. The deposition of Ga atoms may be continued for the time period $t_0$. After $t_0$, the Ga cell shutter may be closed and the surface annealed for about 20 s. Next, the As cell shutter may be reopened and the RHEED intensity recovery observed (FIG. 38b).

The results shown in FIGS. 38a, 38b and 38c may be explained in the following. When the number of Ga atoms supplied to the surface is much less than the number of surface sites, these atoms may be quite mobile on the surface and not cohere with each other at this temperature (580° C.). When the As molecules are supplied again, these Ga atoms may react with the arsenic to form Ga—As molecules. These molecules may migrate on the surface to form islands. However, this process may proceed rather slowly, resulting in a slow recovery in RHEED intensity. If the number of Ga atoms is almost equal to the surface site number, and if they are distributed in one atomic sheet on the surface, very quick RHEED intensity recovery may be expected following As cell shutter reopening. The characteristic shown in FIG. 38c is independent of the annealing time, i.e., even when the $As_4$ molecules are supplied immediately after closing the Ga cell shutter, in that no discernible change was observed in the RHEED intensity recovery time. This fact may indicate a rapid migration of Ga atoms.

Experimental results may suggest that the low-temperature growth of GaAs by MEE is possible if the number of Ga atoms supplied per unit cycle is chosen to be equal or close to the number of sites on the growing surface (one may compare this with a 1 ML coverage found for CdTe UHV ALE).

The quality of a GaAs layer grown at 200° C. and of an AlAs—GaAs double quantum well structure grown at 300° C. with MEE may be demonstrated by photoluminescence. Only $As_4$ molecules should be used for the arsenic source, such that arsenic is incorporated into the crystal through catalytic decomposition even at these low temperatures.

The MEE growth technique has been applied for the reduction of surface oval defects in GaAs grown in a two step process. If a thin GaAs buffer layer is deposited by supplying alternately Ga atoms and $As_4$ molecules to a GaAs substrate, prior to further growth by MBE, the density of the oval defects in the final layer may be reduced reproducibly by a factor of 7, from about 490 to 70 $cm^{-2}$, when compared with that obtained using MBE alone under closely similar conditions. The improved surface morphology produced by the pulsed beam method may be thought to be related to initial film growth which proceeds in MEE most likely in a two-dimensional layer-by-layer fashion.

Also, MEE may cause beneficial effects in MBE growth of GaAs on Si substrates. GaAs films may be grown on Si(100) substrates using a two-step growth process of a 300° C. GaAs buffer layer (by MEE) followed by a 600° C. device layer (by conventional MBE). The films may be examined by Rutherford backscattering and X-ray diffraction methods. A significant reduction in the defect density near the GaAs/Si interface and in the bulk of these films may be observed when the buffer layer is deposited by supplying alternately Ga atoms and $As_4$ molecules to the substrate, rather than applying conventional MBE.

There have been problems with trap density in GaAs layers close to the active region of a long wavelength VCSEL. In 1310 nm active regions on GaAs based on dilute nitrides such as any combination of InGaAsNSb quantum wells and GaAsNP barrier layers, typically there are GaAs layers adjacent to the active region. These layers may be grown at temperatures so low that they have a high trap density which causes the active regions to lose efficiency. Traps may migrate into the active region during growth and during use causing a major change in its efficiency as time proceeds.

This invention may involve the use of migration enhanced epitaxy (MEE) in the low temperature grown GaAs regions or layers close to the InGaAsN(Sb) based active region. This use may reduce the trap density adjacent to the active region. The MEE application is used between quantum wells to flatten the surface. MEE may be used to grow the extended low temperature GaAs around the quantum well.

Surrounding the active region of a laser such as a VCSEL with InGaAsN(Sb) quantum wells typically is some GaAs which is grown at low temperatures. It has been found that if all or most of the low temperature grown GaAs is grown with MEE, the luminescence efficiency improves markedly.

Figure 39:
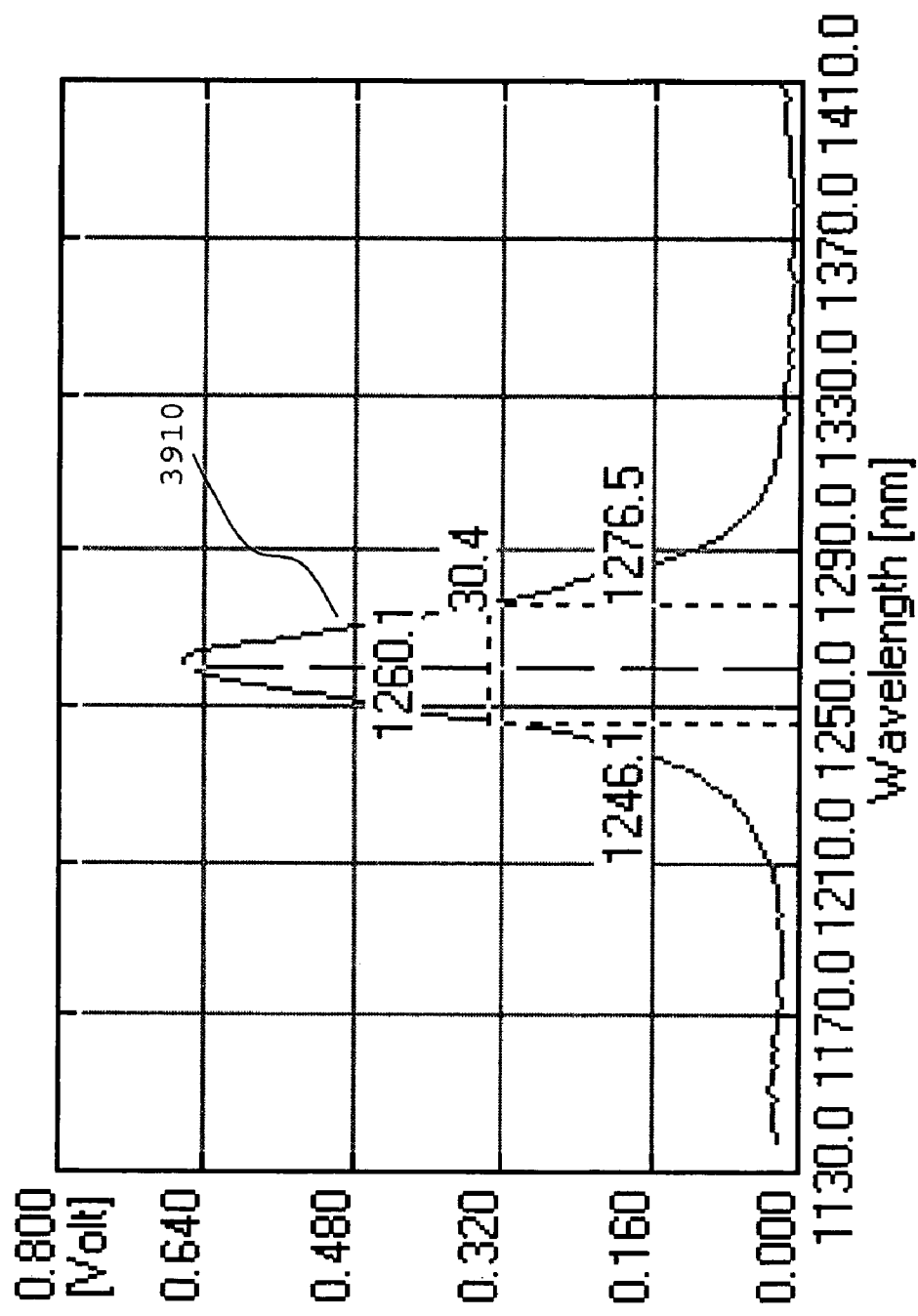
FIG. 39 is a graph showing a profile of a laser output having a flatter interface and a reduced trap concentration in the active region.

MEE may be performed in a manner described above. In addition, repeated growth interruptions keeping the As on may also be beneficial. Using either growth method accomplishes a flatter interface, and a reduced trap concentration. Such results may be demonstrated as shown in the spectrum profile 3910 of FIG. 39. This profile represents a very bright photoluminescence (PL) and at this wavelength a single very narrow peak. In an actual device, the GaAs (or AlGaAs) material between the n and p regions may be optimally grown using this technique with potentially some usefulness in the n and p material if they are grown at low temperature.

Generally, both As2 and As4 or combinations thereof may be used in MEE. The optimal flux can be determined through experiment, for example by maximizing the RHEED oscillation amplitude during MEE. Often the optimal flux for the MEE layers is less than that of nitrogen containing layers because during the growth of MEE layers migration is enhanced with a lower As flux, while during the growth of nitrogen containing material 3-dimensional growth is reduced using a higher As flux because migration required for 3 D growth is suppressed. Likewise, As2 may be used predominantly instead of As4.

Figure 40:
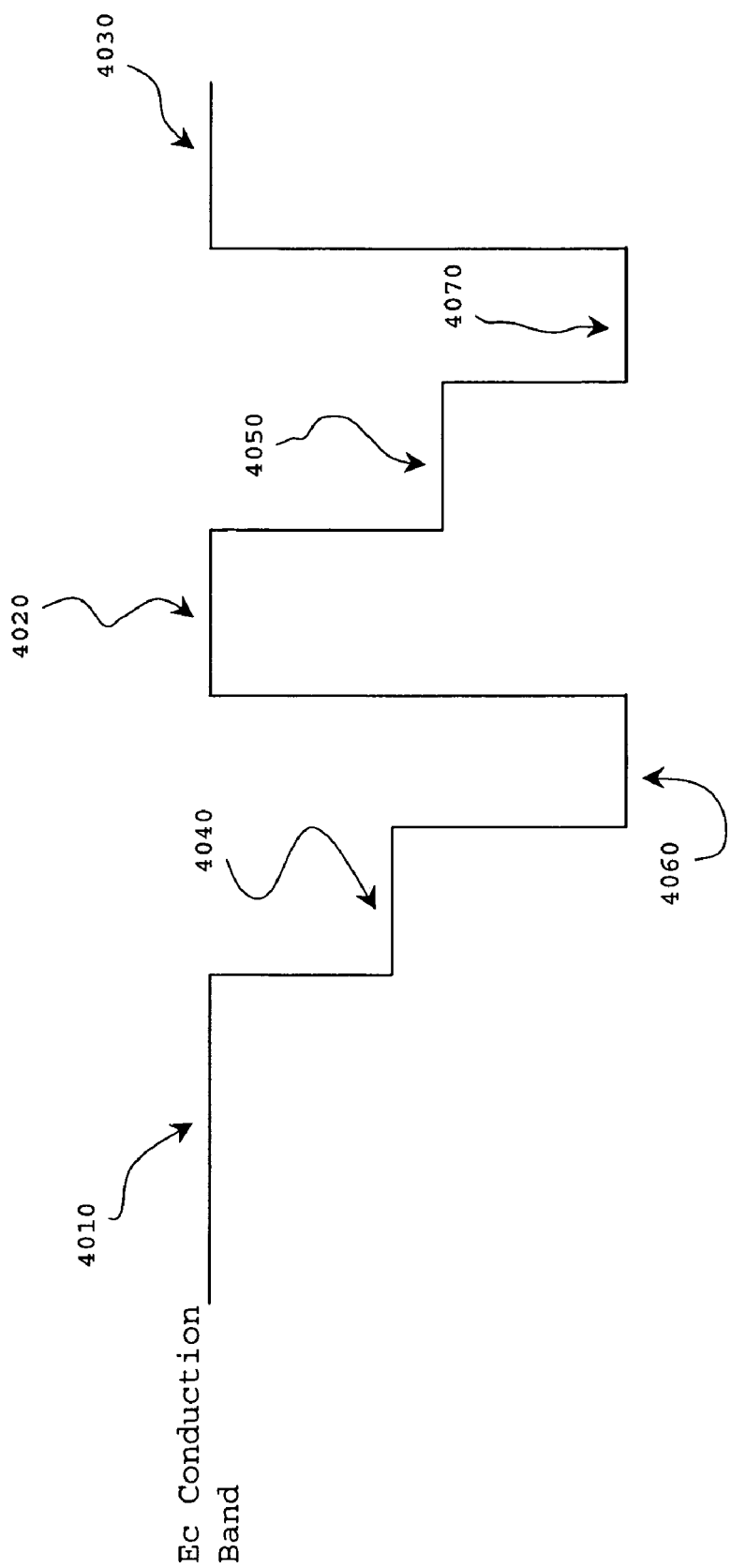
FIG. 40 is a diagram relating to an active region with a multilayer barrier system having a profile in terms of the Ec conduction band.

FIG. 40 shows the use of MEE in a nitrogen containing active region with the option of a multilayer barrier system having a profile as revealed by the Ec, the conduction band. Barriers 4010, 4020 and 4030 may be GaAs grown partially or fully with the use of MEE. The second nitrogen-containing barrier layers 4040 and 4050 may be grown with GaAsN, or optional GaAsNSb or GaAsNSbP, or most generally InGaAsNSbP with or without the use of MEE but more optimally without because of the presence of nitrogen. The layers 4040 and 4050 may also be absent or present adjacent to both sides of quantum wells 4060 and 4070. Quantum wells 4060 and 4070 generally may be made from combinations of InGaAsNSb.

Figure 41:
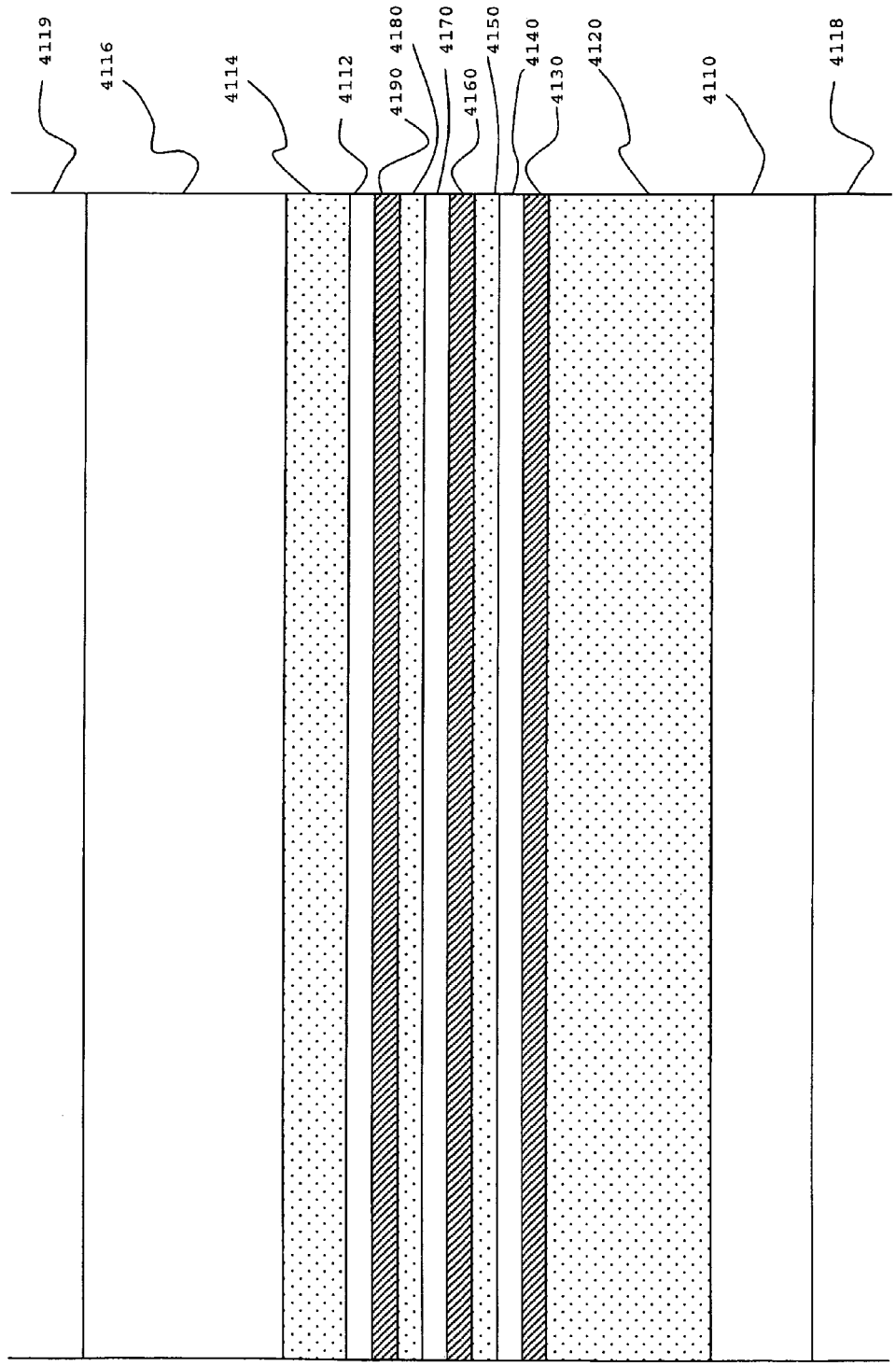
FIG. 41 is a cross section of layers in an active region including migration enhanced epitaxy formed layers.

In FIG. 41, the process of MEE may begin with an atomic layer-by-layer deposit 4120 of Ga and As on a layer 4110 of GaAs. This MEE deposit may occur during a temperature ramp-down from about 480° C. to about 420° C. These temperatures may range between 600° C. and 300° C. The thickness of the MEE layer 4120 may be about 190 angstroms. However, the thickness of layer 4120 may be at least 20 angstroms. Layer 4110 may be a portion of a spacer layer or a mirror stack of a VCSEL so that its maximum thickness is controlled by other electrical and optical design parameters of the VCSEL. On layer 4120 may be a deposit of about 70 angstroms of InGaAsNSb for a quantum well 4130. However, layer 4130 may have a thickness between 15 and 200 angstroms. This range of thicknesses may also apply to quantum wells 4160 and 4190. Formed on quantum well 4130 may be about 30 angstroms of GaAs for a barrier layer 4140. However, layer 4140 may have a thickness between 10 and 200 angstroms or may be absent. This range of thicknesses may also apply to barrier layers 4170 and 4112. On layer 4140 may be a layer 4150 of an MEE deposited Ga atoms and As of about 70 angstroms thick. However, layer 4150 may have a thickness between 10 and 200 angstroms. This range of thicknesses may apply to MEE layer 4180. Formed on layer 4150 may be about 70 angstroms of InGaAsNSb to form a quantum well 4160. On quantum well 4160 may be formed a 30 angstrom layer 4170 of GaAs. An MEE deposit 4180 of Ga atoms and As of about 70 angstroms may be put on layer 4170. A quantum well 4190 having a thickness of about 70 angstroms of InGaAsNSb may be formed on the MEE layer 4180. Formed on quantum well 4190 may be about a 30 angstrom thick layer 4112 of GaAs. An MEE deposit 4114 of about 100 angstroms of Ga and As may be formed on layer 4112 during a temperature ramp-up at the end of the active region and already-formed portion of the VCSEL from 420° C. to 480° C. These temperatures may range between 300° C. and 600° C. Because upward temperature ramps can be very rapid, layer 4114 is optional. Formed on MEE layer 4114 may be a spacer layer 4116 or mirror stack 4119 of the VCSEL. If there is a spacer layer 4116, than mirror 4119 may be formed on it. Layer 4120 may be formed on spacer layer 4110 or a mirror stack 4118. If there is a spacer layer 4110, then it may be formed on mirror stack 4118.

Although the invention has been described with respect to at least one illustrative embodiment, many variations and modifications will become apparent to those skilled in the art upon reading the present specification. It is therefore the intention that the appended claims be interpreted as broadly as possible in view of the prior art to include all such variations and modifications.

What is claimed is:

1. A light emitting semiconductor device, comprising:
    a substrate;
    a first confining layer above the substrate;
    an active area above the confining layer, the active area comprising,
        a flattening layer comprising a plurality of alternating single atomic layers, wherein a first alternating single atomic layer is of a first semiconductor constituent and a second alternating single atomic layer is of a second and different semiconductor constituent; and
        a quantum well formed on the flattening layer, the quantum well layer comprising at least one semiconductor constituent that is different than the first and second semiconductor constituents of the flattening layer, wherein the at least one semiconductor constituent introduces strain into the lattice of the quantum well layer and the flattening layer inhibits relaxation; and
    a second confining layer above the active area.

2. A light emitting semiconductor device as in claim 1, wherein the first and second semiconductor constituents of the flattening layer comprise a group III constituent and a group V constituent, respectively.

3. A light emitting semiconductor device as in claim 2, wherein the quantum well layer comprises at least three constituents selected from the group consisting of In, Ga, As, N, Sb, Al and P.

4. A light emitting semiconductor device, comprising:
    a substrate;
    a first confining layer above the substrate;
    an active area above the confining layer, the active area comprising,
        flattening layer having a substantially flat surface and comprising a plurality of alternating single atomic layers, wherein a first alternating single atomic layer is of a first semiconductor constituent and a second alternating single atomic layer is of a second and different semiconductor constituent; and
        a quantum well layer formed on the flattening layer;
    a second confining layer above the active area; and
    wherein at least one of the first confining layer, second confining layer, or the quantum well layer does not comprise a flattening layer.

5. A light emitting semiconductor device as in claim 4, wherein the first and second semiconductor constituents of the flattening layer comprise a group III constituent and a group V constituent, respectively.

6. A light emitting semiconductor device as in claim 5, wherein the group III constituent comprises Ga and the group V constituent comprises As.

7. A light emitting semiconductor device as in claim 4, wherein the quantum well layer comprises at least three constituents selected from the group consisting of In, Ga, As, N, Sb, Al and P.

8. A light emitting semiconductor device as in claim 2, wherein the group III constituent comprises Ga and the group V constituent comprises As.

9. A light emitting semiconductor device as in claim 1, wherein the flattening layer has a thickness of between 20 and 1000 angstroms and the quantum well has a thickness of between 10 and 200 angstroms.

10. A light emitting semiconductor device as in claim 1, wherein the active region emits light at a wavelength in a range from 1260 nm to 1650 nm.

11. A light emitting semiconductor device as in claim 1, wherein the quantum well comprises In.

12. A light emitting semiconductor device as in claim 1, wherein the quantum well is indium-free.

13. A light emitting semiconductor device as in claim 12, wherein the quantum well comprises GaAsSbN.

14. A light emitting semiconductor device as in claim 4, wherein the flattening layer has a thickness of between 20 and 1000 angstroms and the quantum well has a thickness of between 10 and 200 angstroms.

15. A light emitting semiconductor device as in claim 4, wherein the active region emits light at a wavelength in a range from 1260 nm to 1650 nm.

16. A light emitting semiconductor device as in claim 4, wherein the quantum well comprises In.

17. A light emitting semiconductor device as in claim 4, wherein the quantum well is indium-free.

18. A light emitting semiconductor device as in claim 17, wherein the quantum well comprises GaAsSbN.

* * * * *

UNITED STATES PATENT AND TRADEMARK OFFICE
CERTIFICATE OF CORRECTION

| | | |
|---|---|---|
| PATENT NO. | : 7,286,585 B2 | Page 1 of 1 |
| APPLICATION NO. | : 11/079148 | |
| DATED | : October 23, 2007 | |
| INVENTOR(S) | : Johnson | |

It is certified that error appears in the above-identified patent and that said Letters Patent is hereby corrected as shown below:

Col. 4
Line 10 change "lasers devices" to --laser devices--

Col. 11
Line 64 change "increase" to --increases--

Col. 12
Line 9 change "and InGaAs" to --and an InGaAs--

Col. 13
Line 4 remove "of the"

Col. 15
Line 4 change "is shown 2200" to --2200 is shown--

Col. 24
Line 53 change "flattening" to --a flattening--

Signed and Sealed this

Twenty-eighth Day of September, 2010

David J. Kappos
*Director of the United States Patent and Trademark Office*